US006711723B2

(12) United States Patent
Tsai et al.

(10) Patent No.: US 6,711,723 B2
(45) Date of Patent: Mar. 23, 2004

(54) HYBRID SEMI-PHYSICAL AND DATA FITTING HEMT MODELING APPROACH FOR LARGE SIGNAL AND NON-LINEAR MICROWAVE/MILLIMETER WAVE CIRCUIT CAD

(75) Inventors: Roger S. Tsai, Torrance, CA (US); Yaochung Chen, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/840,561

(22) Filed: Apr. 23, 2001

(65) Prior Publication Data

US 2002/0083406 A1 Jun. 27, 2002

Related U.S. Application Data

(60) Provisional application No. 60/200,622, filed on Apr. 28, 2000.

(51) Int. Cl.⁷ .................. G06F 17/50; G06F 17/11; G06F 17/15; G06F 17/17; G06F 19/00
(52) U.S. Cl. .................. 716/4; 703/2; 703/16; 324/769; 702/59; 702/109; 702/118; 702/120
(58) Field of Search .................. 716/4; 703/2, 16; 324/769; 702/59, 109, 118, 120

(56) References Cited

U.S. PATENT DOCUMENTS

| 5,047,971 A | * | 9/1991 | Horwitz .................. 703/14 |
| 5,051,373 A | | 9/1991 | Yamada et al. |
| 5,418,974 A | * | 5/1995 | Craft et al. .................. 716/2 |
| 5,446,676 A | * | 8/1995 | Huang et al. .................. 703/19 |
| 5,452,225 A | * | 9/1995 | Hammer .................. 703/19 |
| 5,467,291 A | * | 11/1995 | Fan et al. .................. 703/14 |
| 5,535,146 A | * | 7/1996 | Huang et al. .................. 703/15 |
| 5,553,008 A | * | 9/1996 | Huang et al. .................. 703/14 |
| 5,568,395 A | * | 10/1996 | Huang .................. 716/4 |
| 5,648,920 A | * | 7/1997 | Duvvury et al. .................. 716/20 |

(List continued on next page.)

OTHER PUBLICATIONS

Daniels et al., "A universal large/small signal 3–terminal FET model using a nonquasistatic charge–based approach", IEEE Transactions on Electron Devices, vol. 40, No. 10, Oct. 1993, pp. 1723–1729.*

Brown et al., "SPICE model of the resonant–tunnelling diode", Electronics Letters, vol. 32, No. 10, May 9, 1996, pp. 938–940.*

(List continued on next page.)

Primary Examiner—Matthew Smith
Assistant Examiner—Phallaka Kik
(74) Attorney, Agent, or Firm—Katten Muchin Zavis Rosenman; John S. Paniaguas

(57) ABSTRACT

A hybrid model formed from a semi-physical device model along with an accurate data-fitting model in order to implement a relatively accurate physical device model as a large signal microwave circuit computer-aided design (CAD) tool. The semi-physical device model enables accurate representation of known physical device characteristics and measured bias-dependent characteristics. This model is used to accurately simulate the effect of process variation and environmental changes on bias-dependent characteristics. The data-fitting model is used to model these characteristics with relatively good fidelity. The expressions of the model are constructed to be charge conservative. As such, the model is computationally robust within the harmonic balance algorithms employed by known large signal microwave circuit CAD tools.

16 Claims, 57 Drawing Sheets

U.S. PATENT DOCUMENTS

| | | | | |
|---|---|---|---|---|
| 5,706,206 A | * | 1/1998 | Hammer et al. | 716/4 |
| 5,790,415 A | * | 8/1998 | Pullela et al. | 716/6 |
| 5,799,172 A | * | 8/1998 | Gullapalli et al. | 703/14 |
| 5,821,766 A | * | 10/1998 | Kim et al. | 324/769 |
| 5,838,947 A | * | 11/1998 | Sarin | 703/14 |
| 5,850,355 A | * | 12/1998 | Molnar | 703/15 |
| 5,942,909 A | * | 8/1999 | Zhu et al. | 324/767 |
| 6,266,629 B1 | * | 7/2001 | Mallavarpu et al. | 703/13 |
| 6,295,630 B1 | * | 9/2001 | Tamegaya | 716/4 |
| 6,381,564 B1 | * | 4/2002 | Davis et al. | 703/22 |
| 6,408,425 B1 | * | 6/2002 | Mizutani | 716/5 |
| 6,425,111 B1 | * | 7/2002 | del Mar Hershenson | 716/4 |
| 6,456,947 B1 | * | 9/2002 | Adamiak et al. | 702/59 |
| 6,472,233 B1 | * | 10/2002 | Ahmed et al. | 438/14 |
| 6,571,182 B2 | * | 5/2003 | Adamiak et al. | 702/64 |
| 2002/0042698 A1 | * | 4/2002 | Meuris et al. | 703/2 |

OTHER PUBLICATIONS

Allam et al., "Large signal model for analysis and design of HEMT gate mixer", IEEE Microwave and Guided Wave Letters, vol. 4, No. 12, Dec. 1994, pp. 405–407.*

Angelov et al. ("An empirical–table based FET model", 1999 IEEE MTT–S International Microwave Symposium Digest, vol. 2, Jun. 13, 1999, pp. 525–528).*

Shirakawa et al. ("A New Empirical Large–Signal HEMT Model", IEEE Transactions on Microwave Theory and Techniques, vol. 44, No. 4, Apr. 1996, pp. 622–624).*

Tsai et al. ("Forecasting method for HEMT MMIC large-signal RF yield", 22nd Annual GaAs IC Symposium, Nov. 5, 2000, pp. 125–128).*

Hirose et al. ("A Possible Scaling Limit for Enhancement-Mode GaAs MESFET's in DCFL Circuits", IEEE Transactions on Electron Devices, vol. 39, No. 12, Dec. 1992, pp. 2681–2685).*

Kola et al., "An Analytical Expression for Fermi Level Versus Sheet Carrier Concentration for HEMT Modeling", IEEE Electron Device Letters, vol. 9, No. 3, Mar. 1988, pp. 136–138.*

Chen et al., "A New Empiral I–V Model for HEMT Devices", IEEE Microwave and Guided Letters, vol. 8, No. 10, Oct. 1998, pp. 342–344.*

Rizzoli et al., "General Noise Analysis of Nonlinear Microwave Circuits by the Piecewise Harmonic–Balance Technique", IEEE Transactions on Microwave Theory and Techniques, vol. 42, No. 5, May 1994, pp. 807–819.*

Ahn et al., "Inverse Modeling and Its Application in the Design of High Electron Mobility Transistors", IEEE Transactions on Electron Devices, vol. 42, No. 4, Apr. 1995, pp. 598–604.*

Okamoto, "Static Properties of the Superconducting FET: Numerical Analysis", IEEE Transactions on Electron Devices, vol. 39, No. 7, Jul. 1992.*

"Nonlinear Charge Control in AlGaAs/GaAs Modulation-Doped FETs", by Hughes, et al., *IEEE Trans. Electron Devices*, vol. ED–34, No. 8, Aug. 1987, pp. 1617–1625.

"Noise Characteristics of Gallium Arsenide Field–Effect Transistors" by H. Statz, et al. *IEEE–Trans. Electronic Devices*, vol. ED–21, No. 9, Sep. 1974, pp. 549–562.

"Gate Noise in Field Effect Transistors at Moderately High Frequencies" by A. Van Dev Ziel, *Pro. IEEE*, vol. 51, Mar. 1963, 7 pages.

"Physics of Semiconductor Devices," by Michael Shur, Prentice Hall, Englewood Cliffs, New Jersey 1990, pp. 76, 625, 626 and 629.

"User–Defined Elements", Series VI User Manuals, released 6.0 Hewlett Packard, HP Part No. E4605–90033, Jul. 1995, pp. 3–1–3–11.

"A New Empirical Model for HEMT Devices", by Y.C. Chen, *IEEE Microwave Guided Wave Letters*, vol. 8, No. 10, Oct. 1998, pp. 342–344.

"A Simplified Large–Signal HBT Model for RF Circuit Design", by Lu, *IEEE MMT–S Digest*, Jun. 1998, pp. 1607–1610.

* cited by examiner

Frequency 0.05 to 40.05 GHz
Measured vs Modeled S-parameters
Simulated Equivalent Circuit Element Values
via Semi-Physical HEMT Model Measured vs Modeled S12
Simulated Equivalent Circuit Element Values via
Semi-Physical HEMT Model Measured vs Modeled S12
Simulated Equivalent Circuit Element Values via
Semi-Physical HEMT Model Pin vs Pout @ 22.5 GHz
Simulated using Non-linear-Statistical
Device Model Frequency 0.05 to 40.05 GHz

Model Construction
1) Off-Mesa, or Boundary Parasitic Model
2) Inter-electrode Parasitic Model
3) On-Mesa Parasitic Model
4) Intrinsic Model

Implementation of the fifth level of embedding

Frequency 0.05 to 40.05 GHz

□ measure  ○ measure  ▽ measure  △ Simulated  ◇ Simulated  ✶ Simulated
SMAT1    SMAT1    SMAT1    SMAT1      SMAT1      SMAT1
S[1,1]   S[1,2]   S[2,2]   S[1,1]     S[1,2]     S[2,2]

Frequency 0.05 to 40.05 GHz

□ measure      ○ Simulated     ▽ measure      △ Simulated
SMAT1         SMAT1           SMAT1          SMAT1
S[2,1]        S[2,1]          S[2,1]         S[2,1]
dB            db              Ang            Ang
                              deg            deg

Measured vs Simulated Bias-Dependent Gain @ 23.5 GHz

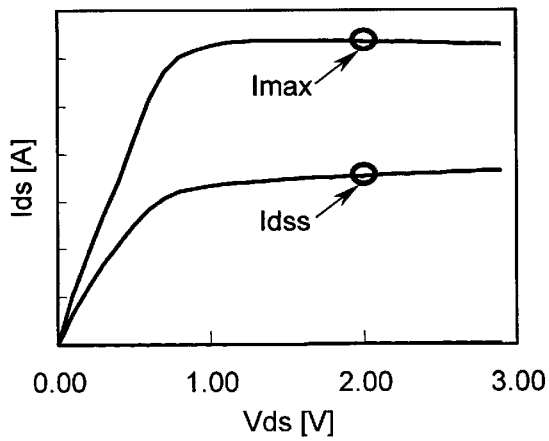
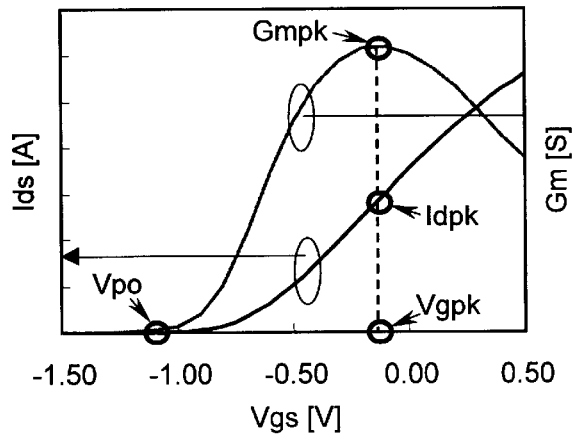
Figure 71A                Figure 71B
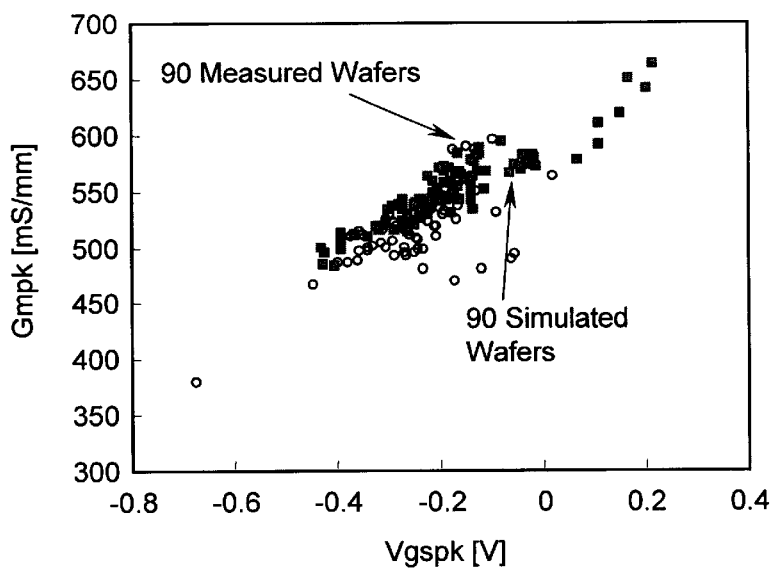
Figure 72

HYBRID SEMI-PHYSICAL AND DATA FITTING HEMT MODELING APPROACH FOR LARGE SIGNAL AND NON-LINEAR MICROWAVE/MILLIMETER WAVE CIRCUIT CAD

CROSS-REFERENCE TO RELATED APPLICATIONS

This application is a continuation in part of and claims priority of U.S. patent application Ser. No. 60/200,622, filed on Apr. 28, 2000.

This application is related to the following commonly-owned co-pending patent application, Ser. No. 09/680,339, filed on Oct. 5, 200: METHOD FOR UNIQUE DETERMINATION OF FET EQUIVALENT CIRCUIT MODEL PARAMETERS, by Roger Tsai. This application is also related to the following commonly-owned co-pending patent applications all filed on Apr. 28, 2000, S-PARAMETER MICROSCOPY FOR SEMICONDUCTOR DEVICES, by Roger Tsai, Ser. No. 60/200,307, EMBEDDING PARASITIC MODEL FOR PI-FET LAYOUTS, by Roger Tsai, Ser. No. 60/200,810, SEMI-PHYSICAL MODELING OF HEMT DC-TO-HIGH FREQUENCY ELECTROTHERMAL CHARACTERISTICS, by Roger Tsai, Ser. No. 60/200,648, SEMI-PHYSICAL MODELING OF HEMT HIGH FREQUENCY NOISE EQUIVALENT CIRCUIT MODELS, by Roger Tsai, Ser. No. 60/200,290; SEMI-PHYSICAL MODELING OF HEMT HIGH FREQUENCY SMALL-SIGNAL EQUIVALENT CIRCUIT MODELS, by Roger Tsai, Ser. No.60/200,666, PROCESS PERTURBATION TO MEASURE MODEL METHOD FOR SEMICONDUCTOR DEVICE TECHNOLOGY MODELING, by Roger Tsai, Ser. No. 60/200,302.

BACKGROUND OF THE INVENTION

1. Field of the Invention

The present invention relates to a method for modeling semiconductor devices and more particularly to a method for modeling semiconductor devices, such as field effect transistors (FET) and high electron mobility transistors (HEMT) which utilizes a semi-physical device model along with a data fitting model to form a relatively accurate physical device model for the use in large-signal microwave circuit computer aided design (CAD) tools.

2. Description of the Prior Art

HEMT technology provides unparalleled, high-performance characteristics at high frequencies (microwave to millimeter wave). As such, HEMTs are used in various RF applications. In order to accurately forecast the performance of such devices it is necessary accurately model the effect of the components physical structure on its high frequency, nonlinear and large signal characteristics. Thus, it is necessary to know how physical changes to the device will effect device performance in order to determine what process changes may be acceptable to improve RF yield product and which may be unacceptable which decrease RF product yield.

Large signal microwave circuit computer aided design (CAD) is used to predict the performance of a modeled circuit at high microwave input power levels. The bulk of large signal microwave circuit CAD is based upon a harmonic balance method, which is a frequency domain analysis. This method demands that elements within the circuit satisfy self-consistent conditions, such as charge conservation for all steps within the method's algorithm.

Currently, there are two predominant methods for modeling large signal characteristics of HEMT devices: table-based device modeling; and data-fitting non-linear device modeling.

Table-based device modeling utilizes measured, bias-dependent small signal characteristics for a device along with software-based algorithms to represent a full large signal model for the device. Because the measured data usually spans almost the entire range of the possible device biases, a large table of data must be created. As such, this method is known as a table based or database model. Such table-based models are disclosed in: "A Simplified Broad-Band Large Signal Non-Quasi-Static Table-Based FET Model," by M. Fernandez-Barciela, et al., *IEEE Trans., Microwave Theory Tech*, Vol. 48, No. 3, March 2000. The algorithms that make up this method are designed to produce modeling expressions that satisfy the charge conservative constraint required in a harmonic balance simulation. Thus, table-based method are known to perform well in large signal microwave circuit CAD.

Although the table-based method has proven to be accurate and versatile for large signal microwave circuit CAD, it has several disadvantages. For one, the method requires the use of special, software-based algorithms that are only available through some commercial software packages. Some of these packages include the microwave design system (MDS), advanced-design system (ADS) and ICCAP by Agilent Technologies. Secondly, this method is not based on the device physics and thus does not describe the device's performance in terms of any of its physical characteristics. Thus, the method is not able to predict device performance based upon physical data. Microwave circuit designers and device technologists have developed empirical data-fitting analytical expressions that can both fit measured DC and small signal characteristics of semiconductor devices and fit measured DC and small signal characteristics of semiconductor devices which satisfy the charge conservation law. Thus, the so-called non-linear data-fitting device models perform robustly in harmonic balance based large signal simulations and are thus ideal for use for large signal microwave circuit CAD. However, because these models are completely empirical, they are not able to relate real, physical characteristics with the predicted device performance. Examples of data-fitting non-linear models for HEMT devices are disclosed in: "A New Empirical Non-Linear Model for HEMT and MESFET Devices," by I. Angelov, *IEEE Trans. Microwave Tech.*, Vol. 40, No. 12, December 1992. Thus, there is a need to provide a large signal microwave circuit CAD model that is able to relate physical device characteristics to its predicted performance.

SUMMARY OF THE INVENTION

Briefly, the present invention relates to a hybrid modeling method that forms models from a semi-physical device model along with an accurate data-fitting model in order to implement a relatively accurate physical device model as a model that is usable in large signal microwave circuit computer-aided design (CAD) tool. The semi-physical device model enables accurate representation of known physical device characteristics and measured bias-dependent characteristics. This model is used to accurately simulate the effect of process variation and environmental changes on bias-dependent characteristics. The data-fitting model is used to model these characteristics with relatively good fidelity. The expressions of the data-fitting model are constructed to be charge conservative. As such, the resultant model is physically representative of the device is computationally robust within the harmonic balance algorithms employed by known large signal microwave circuit CAD tools.

DESCRIPTION OF THE DRAWINGS

These and other advantages of the present invention will be readily understood with reference to the following specification and attached drawings wherein:

FIGS. 71A and 71B are graphical illustrations of the extracted parameters from measured device I–V's for process control monitor testing.

FIG. 72 is a graphical illustration of the measured vs semi-physically simulated process variation for Gmpk and Vgspk.

DETAILED DESCRIPTION

The present invention relates to a hybrid model based upon using a semi-physical model in conjunction with a data-fitting nonlinear model for use in large signal microwave circuit computer aided design (CAD). The goal of the combined or hybrid modeling approach is to combine the physical modeling capability of the semi-physical approach along with the ability to be used in harmonic balance-based circuit simulation. The basic approach is set forth below:

1. Derive a semi-physical device model that is able to replicate measured DC I–V and bias-dependence small signal characteristics very accurately.

2. Select a data-fitting nonlinear device model whose expressions satisfy the charge conservation law.

3. Use a semi-physical device model to generate the necessary I–V (current/voltage) in C–V (capacitance/voltage) data for the data-fitting nonlinear device model.

4. Derive model parameters for the data-fitting model such that it fits the semi-physically modeled characteristics.

5. Implement the data-fitting device model in a large signal microwave circuit CAD tool.

Steps 3–5 may be repeated for arbitrary physical changes to the semi-physical device. The semi-physical device model is able to reflect the effect of these changes in terms of the I–V and C–V performance. Consequently, through the use of data-fitting model, this change in performance can be simulated in a large signal regime.

As mentioned above, Step 1 of the procedure is to derive a semi-physical device model for the HEMT device. The semi-physical device model is discussed below in connection through FIGS. 1–14. The hybrid model is discussed in connection with FIGS. 15–18.

Semi-Physical Determination of Small-Signal Equivalent Circuits

Figure 1:
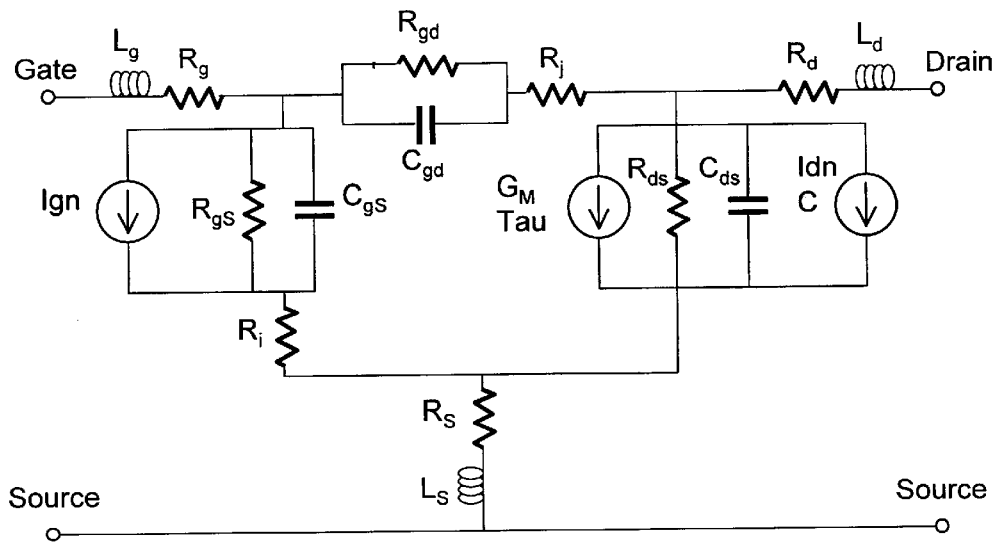
FIG. 1 is schematic diagram of an exemplary small signal equivalent circuit model for a HEMT device.
Figure 2:
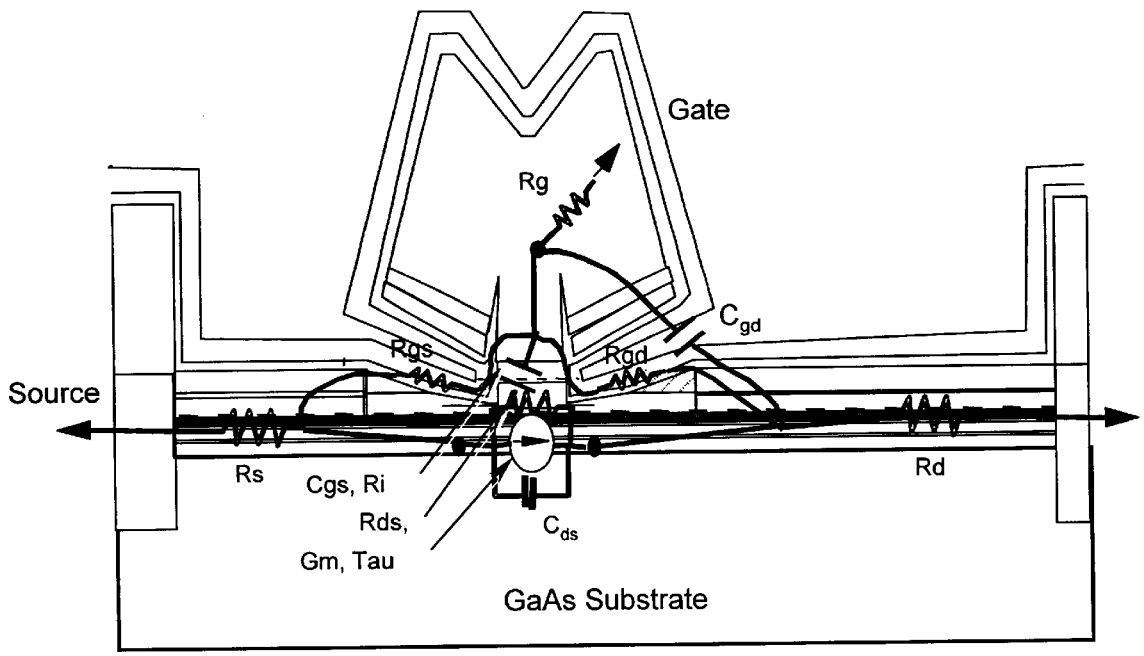
FIG. 2 is a sectional view of an exemplary HEMT illustrating the rough translation of the physical origins for each of the equivalent circuit elements illustrated in the small signal circuit model in FIG. 1.
Figure 3:
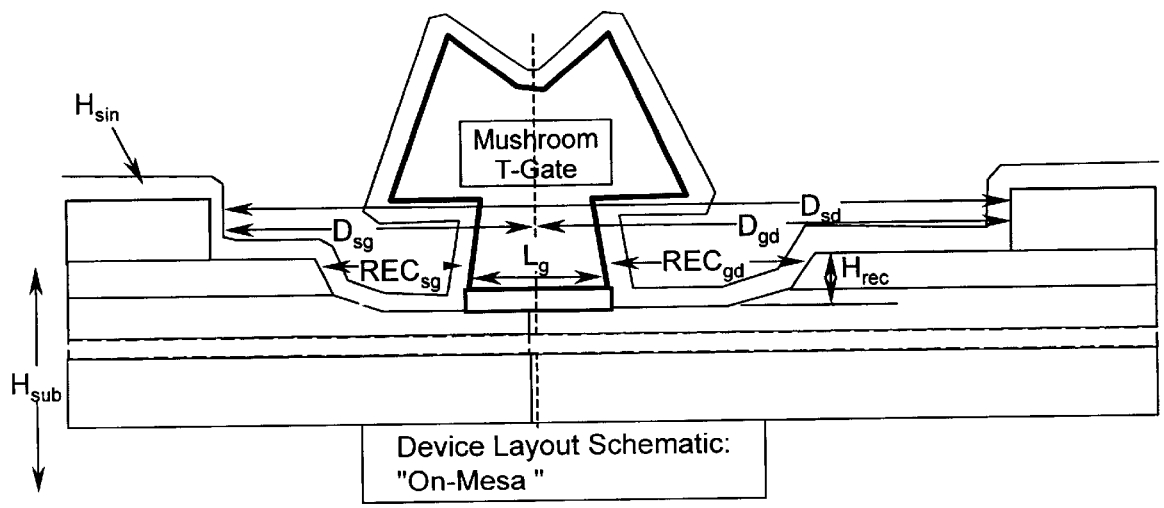
FIG. 3 is a cross-sectional view of a HEMT illustrating the regions in the HEMT which correspond to the various circuit elements in the small signal equivalent circuit model illustrated in FIG. 1.
Figure 4:
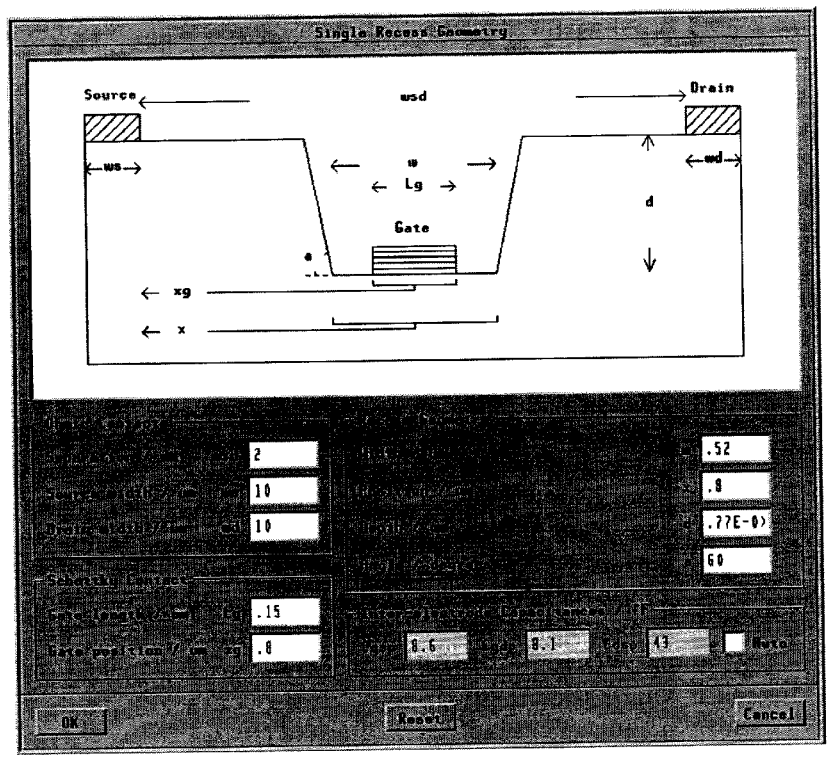
FIG. 4 is an example of a cross-sectional descriptive input of a physical HEMT device structure by a conventional physical device simulation tool.
Figure 5:
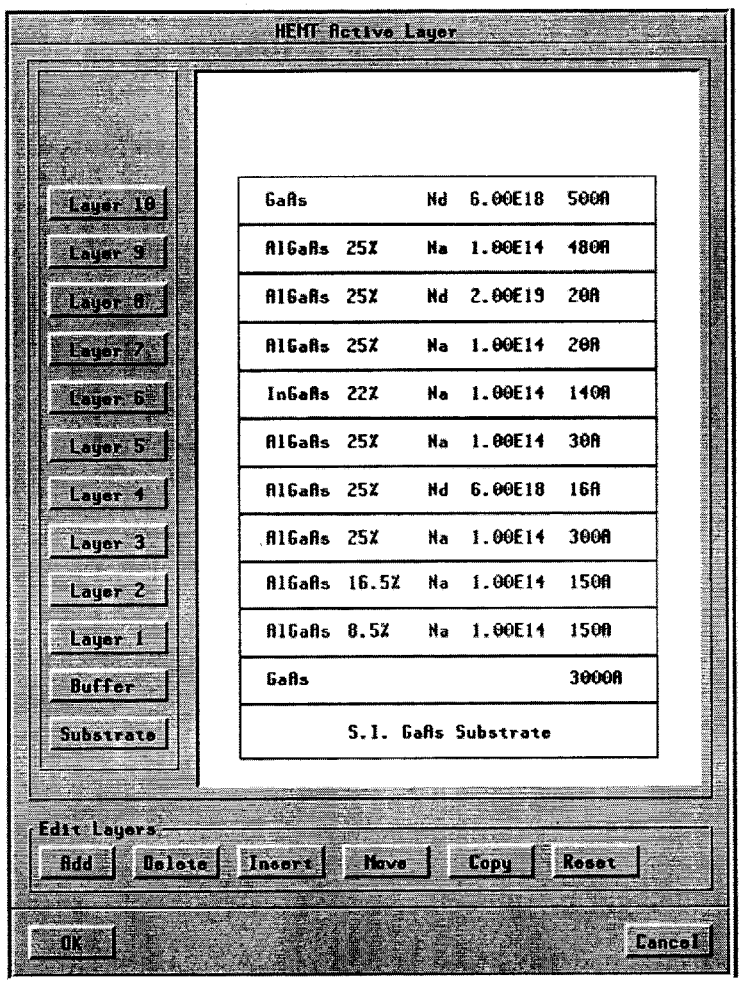
FIG. 5 is an example of an epi stack descriptive input of a physical HEMT device structure for a known physical device simulation tool.
Figure 6:
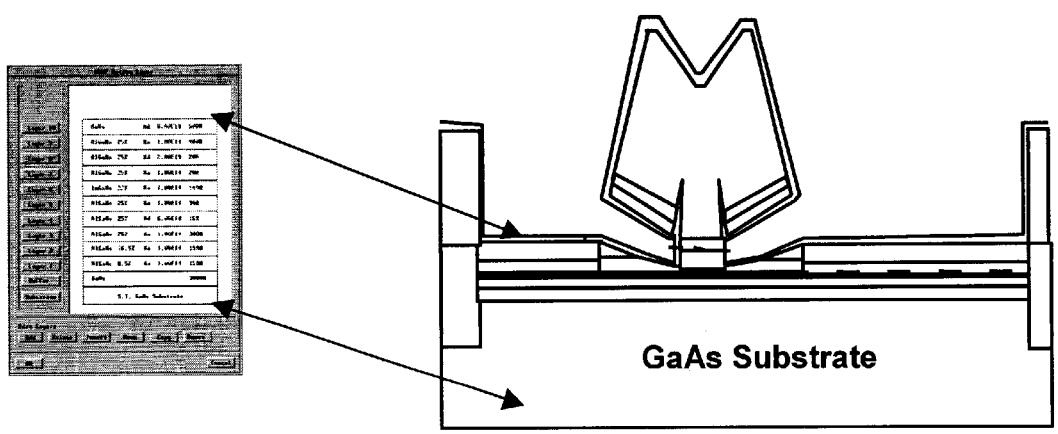
FIG. 6 is an example illustrating the location of the epi stack within the device structures cross-sectional view.

The semi-physical model provides model elements for the standard small signal equivalent circuit model or FET as illustrated in FIG. 1. However, unlike conventional methods, the model elements are derived from small signal excitation analysis of the intrinsic charge and electric fields within the device. As such, the simulated small signal model elements represent a relatively accurate physical equivalent circuit description of a physical FET.

The general methodology for the semi-physical modeling of intrinsic charge, electrical conductance and electric field is as set forth below: First, the relationships between the conduction band offsets, electric permitivity and material composition for the various materials in the epi stack are determined. These relationships can be performed analytically or by fitting simulated data from physical simulators. Subsequently, the basic electron transport characteristics in any of the applicable bulk materials in the epi stack are determined. Once the electron transport characteristics are determined, the undepleted linear channel mobility is determined either through material characterization or physical simulation. Subsequently, the Schottky barrier height value or expressions are determined. Once the Schottky barrier height value is determined, the semi-physical equations are constructed modeling the following characteristics:

Fundamental-charge control physics for sheet charge in the active channel as controlled by the gate terminal voltage.

Average centroid position of the sheet charge within the active channel width.

Position of charge partitioning boundaries as a function of gate, drain and source terminal voltages.

Bias dependence of linear channel mobility in the surface depleted regions.

Bias dependent of the velocity saturating electric field.

Saturated electron velocity.

Electrical conductance of the linear conductance region of the channel under the gate.

Electrical conductance within the source and drain access regions

Once the semi-physical equations are determined, the empirical terms of the semi-physical modeling equations are adjusted to fit the model I–V (current/voltage) characteristics against measured values. Subsequently, the empirical terms are iteratively adjusted to achieve a simultaneous fit of measured C–V (capacitance-voltage) and I–V characteristics. Lastly, the empirical modeling terms are fixed for future use.

Figure 7:
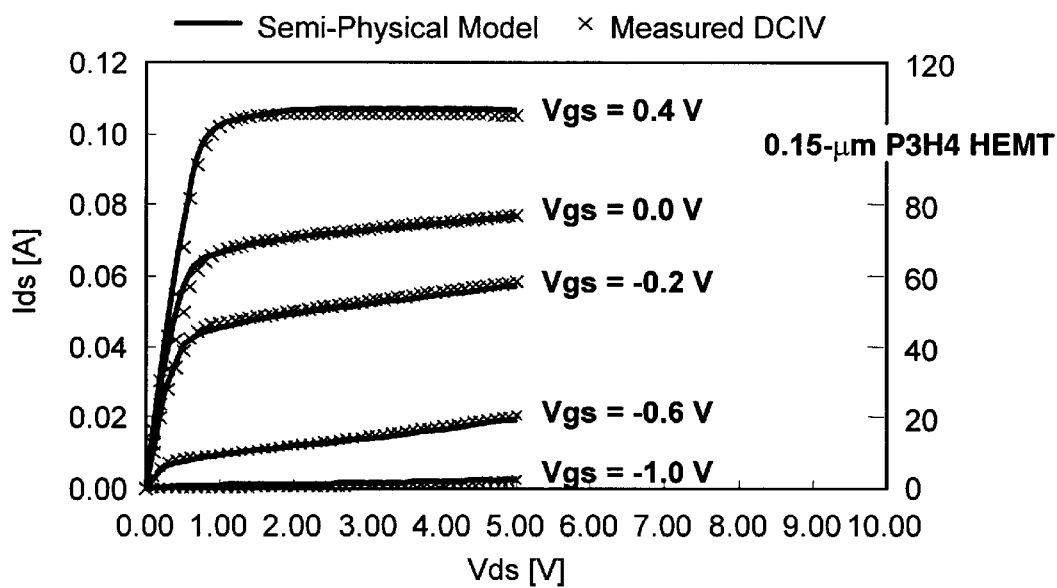
FIG. 7 is an example of a relatively accurate measured-to-model I–V characteristics using the semi-physical modeling method in accordance with the present invention.

By constructing a comprehensive set of semi-physical equations that cover all of the physical phenomenon as mentioned above, the physical operating mechanisms within a HEMT device can be relatively accurately determined. FIG. 7 illustrates a set of relatively accurate measured-to-modeled I–V characteristics for a HEMT using the semi-physical modeling discussed herein. In particular, FIG. 7 illustrates the drain-to-source current $I_{ds}$ as a function of the drain-to-source voltage $V_{ds}$ for various gate biases, for example, from 0.4 V to –1.0 V. As shown in FIG. 7, solid lines are used to represent the semi-physical model while the Xs are used to represent measured values. As shown in FIG. 7, a close relationship exists between the measured values and the modeled parameters.

Figure 8:
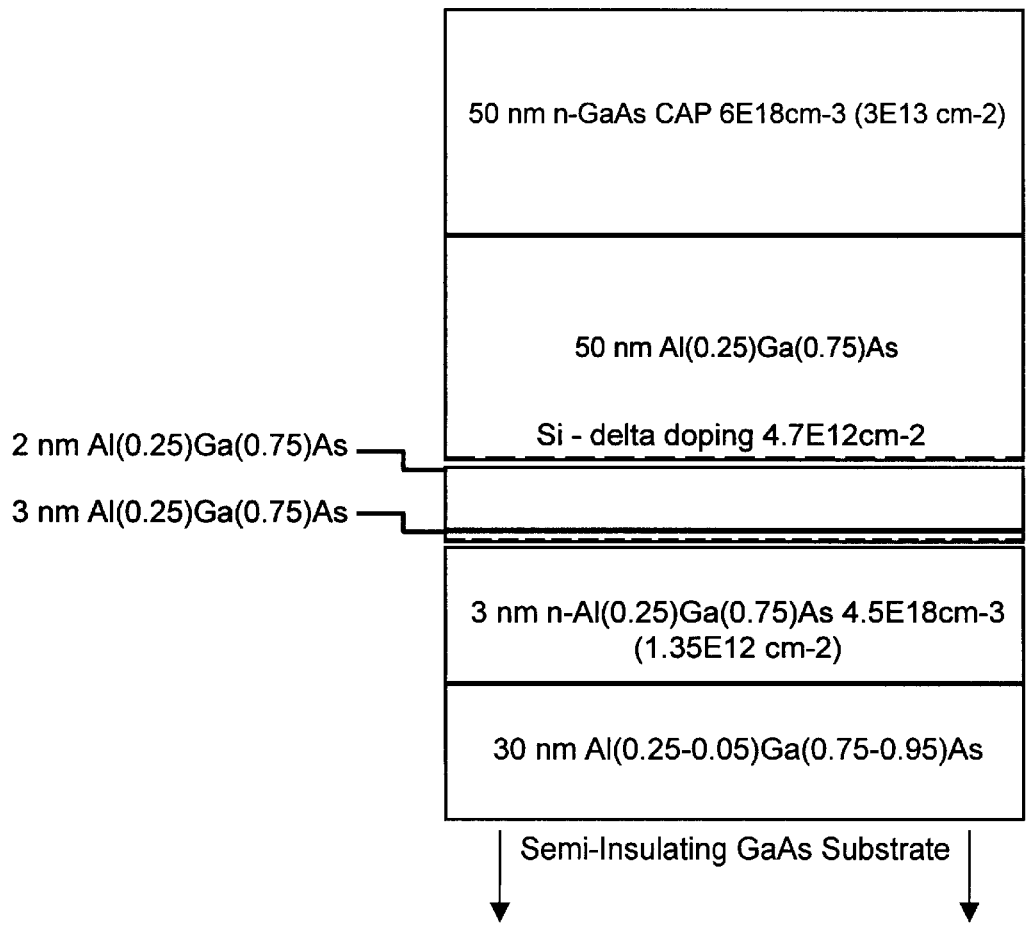
FIG. 8 is a elevational view illustrating an epi stack for an exemplary HEMT.
Figure 9:
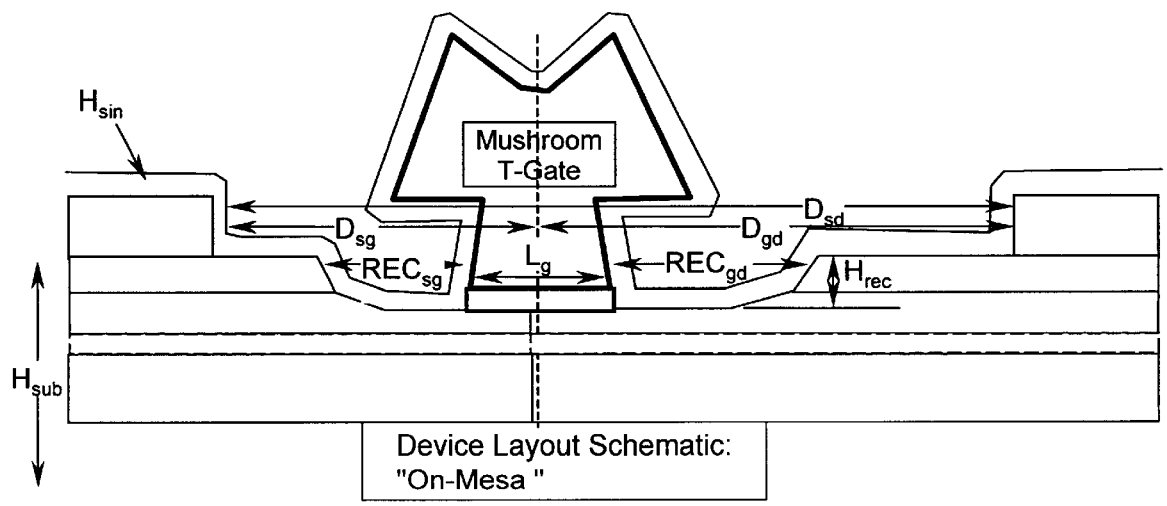
FIG. 9 is a cross-sectional view of a HEMT for the exemplary epi stack illustrated in FIG. 8.
Figure 10:
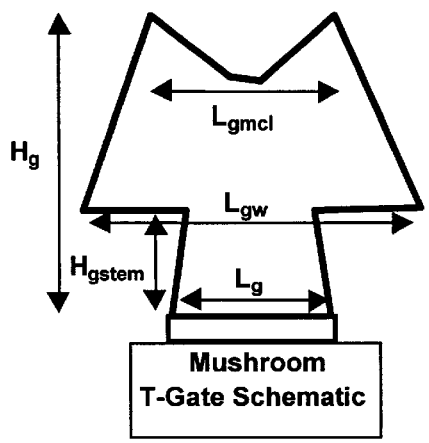
FIG. 10 is a blown up diagram of the cross-sectional parameters pertaining to the T-gate geometry for the exemplary epi stack illustrated in FIG. 8.

An example of semi-physical modeling for physical device operation in accordance with the present invention is provided below. The example utilizes an exemplary device as illustrated in FIGS. 8 and 9. Table 2 represents exemplary values for the physical cross-section dimension parameters of the device. FIG. 10 relates to a blown up T-gate characteristic which is correlated to the parameters identified in Table 1.

TABLE 1

Values for the Physical Parameters Input into Device Cross Section

| Layout Parameter | | Units | Value |
|---|---|---|---|
| Gate Length | Lg | [μm] | 0.150 |
| Wing Length | Lgw | [μm] | 0.520 |
| Gate Mushroom Crown Length | Lgmcl | [μm] | 0.200 |
| Total Gate Height | Hg | [μm] | 0.650 |
| Gate Stem Height | Hgstem | [μm] | 0.300 |
| Gate Sag Height | Hgsag | [μm] | 0.100 |
| Gate Cross-Sectional Area | GateArea | [μm$^2$] | 0.187 |
| Max Cross-Sectional Area | MaxArea | [μm$^2$] | 0.364 |
| Total Gate Periph | Wg | [μm] | 200.000 |
| # Fingers | N | [] | 4.000 |
| Source-Drain Spacing | Dsd | [μm] | 1.800 |
| Gate-Source Spacing | Dsg | [μm] | 0.700 |
| Gate-Drain Spacing | Dgd | [μm] | 1.100 |
| Gate-Source Recess | RECsg | [μm] | 0.160 |
| Gate-Drain Recess | RECgd | [μm] | 0.240 |
| Recess Etch Depth | Hrec | [A] | 780.000 |
| SiN Thickness | Hsin | [A] | 750.000 |
| Gatefeed-Mesa Spacing | Dgfm | [μm] | 2.000 |
| Gateend-Mesa Overlap | Dgem | [μm] | 2.000 |
| Finger-Finger Spacing Thru Drain | Dffd | [μm] | 16.500 |
| Finger-Finger Spacing Thru Source | Dffs | [μm] | 13.500 |
| Source Airbridge Inset? | AB? | [] | P |
| Source Airbridge Inset | Dsabin | [μm] | 28.000 |
| Source Airbridge Height | Hsab | [μm] | 3.500 |
| Source-Gate Airbridge Clearance | Hgsab | [μm] | 1.640 |
| Source Pad Width | Ws | [μm] | 12.000 |
| Drain Pad Width | Wd | [μm] | 14.000 |
| Substrate Thickness | Hsub | [μm] | 100.000 |

As mentioned above, the semi-physical modeling of the intrinsic charge and electric field within the HEMT device is initiated by determining the relationships between the conduction band offset, electric permitivity, and material composition for the various materials in the epi stack. Material composition related band offset and electrical permitivity relationships may be obtained from various references, such as "Physics of Semiconductor Devices," by Michael Shur, Prentice Hall, Englewood Cliffs, N.J. 1990. The basic electron transport characteristics, for example, for the linear mobility of electron carriers in the bulk GaAs cap layer may be determined to be 1350 cm$^2$/Vs, available from "Physics of Semiconductor Devices" supra. The linear mobility of electron carriers in the undepleted channels is assumed to be 5500 cm²/Vs. This value may be measured by Hall effect samples which have epi stacks grown identically to the stack in the example, except for some differences in the GaAs cap layer. The Schottky barrier height is assumed to be 1.051 volts, which is typical of platinum metal on a AlGaAs material.

The following equations represent the semi-physical analytical expressions to model the charge control and centroid position in the sample.

ideal charge control law and is modeled as a semi-physical representative of the actual density of state filling rate for energy states within the channel v. gate voltage. The gate-to-channel voltage used for the charge control, Vgt, is a function of the Schottky barrier height, conduction band offsets and doping in the epi stack as is known in the art. The following equations represent the semi-physical expression used to model the position of regional charge boundaries within the HEMT device. These expressions govern how to partition the model charge between the influence of different terminals.

| | | | |
|---|---|---|---|
| Empirical Charge Control Expression | $N_s$ | [cm⁻²] | $= N'_s / [1 + (N'_s/N_{max})\gamma)]^{1/\gamma}$ |
| Ideal Charge Control with Filling Law | $N'_s$ | [cm⁻²] | $= 2 N_o \ln [1 + \exp(V_{gt}/(\eta V_{th}))]$ |
| Ideal Charge Control | $N_o$ | [cm⁻²] | $= \epsilon_1 \eta V_{th}/[2 q (d_1 + \Delta d_1) 10000]=$ $(N_{maxO} + N_{maxL} V_{ds}^{nnmax})$ |
| Maximum Channel Charge | $N_{max}$ | [cm⁻²] | $H_{chan} / H_{chanREF})$ |
| Initial Gate-Channel Voltage | $V_{gt}$ | [V] | $= V_{gs} - \Phi_b - \Delta E_C - V_{TO} - \sigma V_{ds}$ |
| Threshold Voltage | $V_{TO}$ | [V] | $= \Phi_b - \Delta E_C - V_T$ |
| Doping Threshold Voltage | $V_T$ | [V] | $= q N_{sdelta} d\delta 10000 / \epsilon_1 =$ $\{(H_{space} + H_{bar} + H_{fdope} + H_{cap}) - H_{rec}\}/$ |
| Gate-to-Channel Spacing | $d_i$ | [m] | $(10^{10})$ |
| | | | note that the expression for di can be changed for different epi-stacks |
| | | | $= H_{chan} [ 1 - d_{iK} * V_{gte}/H_{chanREF} -$ |
| Movement of Sheet Carrier Centroid | $\Delta^d i$ | [m] | $d_{iL} * V_{ds}/H_{chanREF}]$ |
| Empirical Charge Control Shaping Parameter | $\gamma$ | [] | |
| Semi-Physical Subthreshold Populating Rate | $\eta$ | [] | |
| Dielectric Permitivity of the Barrier Layer | $\epsilon_i$ | [F/m] | |
| The thermal voltage | $V_{th}$ | [V] | $= K_B T_{amb} / q$ |
| Ambient Temperature | $T_{amb}$ | [K] | |
| Fixed Emprical Maximum Sheet Charge | $N_{maxO}$ | [cm⁻²] | |
| Vds Dependent Emprical Maximum Sheet Charge | $N_{maxL}$ | [cm⁻²] | |
| Vds Dependent Emprical Nmax shaping term | $n_{Nmax}$ | [] | |
| Channel Layer Thickness | $H_{chan}$ | [A] | |
| Reference Channel Layer Thickness | $H_{chanREF}$ | [A] | |
| | (Channel Thickness for the sample for which the model was first derived) | | |
| Schottky Barrier Height | $\Phi B$ | [V] | |
| Conduction Band Offset between Channel and Barrier | $\Delta E_C$ | [V] | |
| Front Delta Doping | $N_{Sdelta}$ | [cm⁻²] | |
| | note that this expression can be modified for non-delta doped epi-stacks | | |
| Gate-to-Front Delta Doping Spacing | $d\delta$ | [m] | $= \{(H_{bar} + H_{fdope} + H_{cap}) - H_{rec}\}/$ $(10^{10})$ |
| Barrier Thickness between front doping and channel | $H_{space}$ | [A] | |
| Barrier Layer Thickness before front doping layer | $H_{bar}$ | [A] | |
| Front Doping layer thickness | $H_{fdope}$ | [A] | |
| Cap layer thickness | $H_{cap}$ | [A] | |
| Empirical Drain-Induced Barrier-Lowering Term | $\sigma$ | [] | |
| Sheet Charge Position Gate Bias Factor | $d_{iK}$ | [A/V] | |
| Sheet Charge Position Drain Bias Factor | $d_{iL}$ | [A/V] | $= V_{th} [1 + V_{gt}/2V_{th} +$ $\sqrt{\delta^2 + (V_{gt}/2V_{th} - 1)^2}]$ |
| Effective Gate Voltage | $V_{gte}$ | [V] | |
| Empirical Transition Width Parameter | $\delta$ | [] | |

As used herein, Ns represents the model sheet carrier concentration within the active channel. Ns' represents the

| | | | |
|---|---|---|---|
| Effective Gate Length | $L_{geff}$ | [μm] | $= L_g + \Delta L_s + \Delta L_d$ |
| Gate-Source Control Region | $L_{gs}$ | [μm] | $= L_g/2 + \Delta L_s + X_{D1}$ |
| Source-Side Effective Gate Length Extension | $\Delta L_s$ | [μm] | $= \Delta L_{s0} + \Delta L_K * V_{gte}$ |
| Drain-Side Effective Gate Length Extension | $\Delta L_d$ | [μm] | $= \Delta L_{d0} + \Delta L_K * V_{gte} + \Delta L_L * V_{dse2}$ |
| Gate-Drain Control Region | $L_{gd}$ | [μm] | $= (L_g/2 + \Delta L_d) * \{\tanh [10(L_g/2 - X_{D1})] + 1 \} / 2 =$ $X_{DL} V_{ds} M_{Xdl}/$ $\{M_{XdK} V_{gte} * (1 + [X_{DL} V_{ds} M_{XdL}/$ |
| Bias Dependent Extension of the Saturated Transport Region | $X_{D1}$ | [μm] | $(M_{XdK} V_{gte}(L_g/2 + REC_{gd}))]^m\}^{1/m}$ |
| Empirical Drain-Saturated Transport Boundary Factor | $X_{DL}$ | [μm] | $= L_g V_{ds} / \{2 [ 1 + (V_{ds}/V_{saten})^m]^{(1/m)}\} =$ $X_{s0}\} M_{Xs}[ 1/1(1 + (V_{ds}/V_{satn})^m)^{(1/m)} -$ |

-continued

| | | | |
|---|---|---|---|
| Position of the Boundary between Regions 1 and 2 | $X_S$ | [μm] | $V_{ds} m(V_{ds}/V_{satm})^{m-1}/$ $\{V_{satm}m[1+(V_{ds}/V_{satm})^m]^{(1m+1)}\}$ $V_{ds} M_{XsL} + V_{gte}M_{XsK}\}$ |
| Note: Region 1 denotes the linear region, while Region 2 denotes the saturated region of the channel | | | |
| Empirical Effective Gate Length Extension Gate Bias Factor | $\Delta L_K$ | [μm/V] | |
| Empirical Effective Gate Length Extension Drain Bias Factor | $\Delta L_L$ | [μm/V] | |
| Effective Drain-Source Voltage Control-2 | $V_{dse2}$ | [V] | $= V_{ds} / [1 + (V_{ds}/V_{satn})^m]^{1/m}$ |
| Rough, Intrinsic Saturation Voltage | $V_{satn}$ | [V] | $= I_{sat}/g_{chi} = $ $g_{chi} V_{gte}/$ |
| Rough, Intrinsic Saturation Current Level | $I_{sat}$ | [A] | $[1 + g_{chi}R_s + \sqrt{(1 + 2g_{chi}R_s + (V_{gte}/V_L)^2)}]$ |
| Intrinsic Conductance of the Linear Region, Under the gate | $g_{chi}$ | [S] | $= (q\, N_s\, \mu_{ave}\, W_g) / L_g$ |
| Rough Intrinsic Saturation Voltage Level | $V_L$ | [V] | $= F_s * L_g$ |
| Empirical Knee Shaping Parameter | m | [] | |
| Empirical Region 2 extension Drain Bias Factor | $M_{XdL}$ | [] | |
| Empirical Region 2 extension Gate Bias Factor | $M_{XdK}$ | [] | |
| Fine Intrinsic Saturation Voltage | $V_{saten}$ | [V] | $= I_{satcom}/g_{chi} = $ $g_{chi} V_{gte} V_L * [-V_L(A + g_{chi}R_s) +$ $\sqrt{V_L^2(A + g_{chi}R_s)^2 + V_{gte}^2 - (g_{chi}R_s V_L)^2}] /$ |
| Fine Intrinsic Saturation Current Level | $I_{satcom}$ | [A] | $[V_{gte}^2(1 - g_{chi}R_s(V_L/V_{gte})^2)]$ |
| Saturation Region Length Ratio | A | [] | $= X_s / L_{geff}$ |
| Initial Starting position for Region 1 & 2 Boundary | $X_{s0}$ | [μm] | $= L_g / 2$ |
| Region 1 & 2 Boundary Bias Factor | $M_{Xs}$ | [] | |
| Region 1 & 2 Boundary Drain Bias Factor | $M_{XsL}$ | [] | |
| Region 1 & 2 Boundary Drain Bias Factor | $M_{XsK}$ | [] | |

The following equations represent the semi-physical expressions used to model the bias dependence of linear channel mobility in depleted regions.

| | | | |
|---|---|---|---|
| Depleted Channel Mobility | μave | [cm²/V * s] | $= \mu_{dchan} + \mu_{dK} \cdot V_{gte}$ |
| Fixed Depleted Channel Mobility | μdchan | [cm²/V * s] | |
| Depleted Channel Mobility Gate Bias Factor | μdK | [cm²/V² * s] | |

The following equations are the semi-physical expressions used to model the bias dependence of the saturating electric field and saturation velocity.

| | | | |
|---|---|---|---|
| Saturating Electric Field | $F_S$ | [V/μm] | $= V_S / [(\mu_{sat} + \mu_{satK}V_{gte})\, 10000]$ |
| Fixed Saturating Channel Mobility | μsat | [cm²/V * s] | |
| Saturating Channel Mobility Gate Bias Factor | μsatK | [cm²/V² * s] | |
| Saturation Velocity | $V_S$ | [cm/s] | |

The following equations describe the semi-physical model for the source access region conductance.

Figure 11:
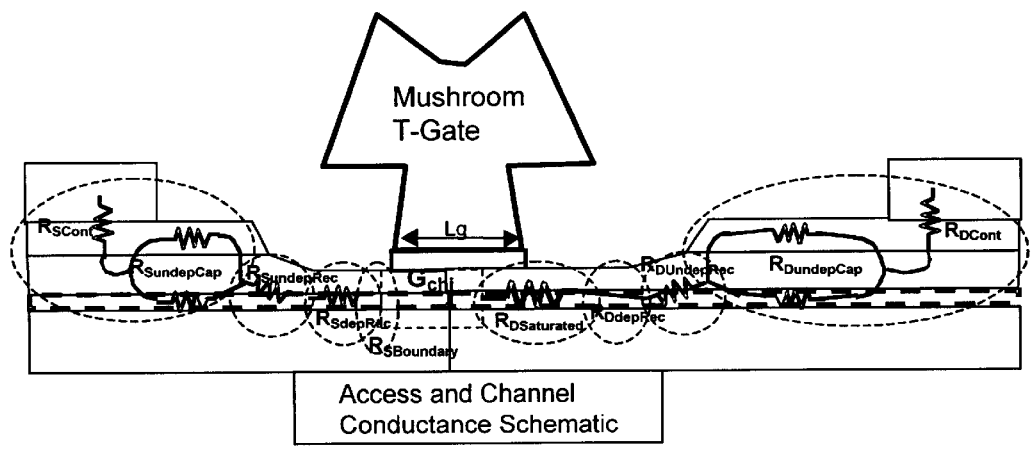
FIG. 11 is a diagram of an electric conductance model used in the semi-physical example.

FIG. 11 is a schematically illustrates how electrical conductance in the source and drain access regions are modeled in the example.

| | | | |
|---|---|---|---|
| Source Access Resistance | $R_S$ | [Ω] | $= (R_{SundepCap} + R_{SAccess} + R_{SBoundary})/W_g - R_{cont}/RF_{rconF} +$ |
| Source Access Resistance: Channel and Cap | $R_{S\,undepCap}$ | [Ω * μm] | $R_{SH}[D_{sg} - (REC_{sg} + L_g/2)] =$ $R_{SdepRec}^{ON} * MR_s * \tanh\{[KC_{fK} *$ $(V_{gs} - VC_{fOn} + V_{ds} * MC_{fL})] + 1\}/2 * \{V_{gs}/$ $2 * [1 - \tanh(KR_{sK}(V_{gs} - VR_{sOn}))]\} * \{\tanh$ $[KR_{sSat}(V_{ds} - VR_{sKnee})] + 1\}/2 + R_{SundepRec} * \{\tanh[$ |
| Source Access Resistance: Recess and Undepleted Cap | $R_{SAccess}$ | [Ω * μm] | $KR_{sK}(V_{gs} - VR_{sOn})] + 1\}/2 =$ $R_{SdepRec}^{ON} * MR_s * \tanh\{[KR_{sK} * V_{gs} + KR_{sL} * V_{ds} +$ $VR_{sOff}] + 1\}/2 * \{(1 + V_{ds}MR_{sL}) * MR_{sK} * [1 -$ $\tanh(KR_{sSat}(V_{ds} - VR_{sKnee}))]/[2 * (1 + [V_{gs}/((1 +$ |
| Source Access Resistance: Crowding resistance due to conductance mismatch | $R_{SBoundary}$ | [Ω * μm] | $V_{ds}MR_{sL}) * MR_{sK}]^{(rRs)}]^{(1/rRs)}\}$ |

-continued

| | | | |
|---|---|---|---|
| Resistance of the Source Recess Access region at high on-state bias ($V_{on}$) | $R_{S\,depRec}{}^{ON}$ | [$\Omega * \mu m$] | = $R_{SHdep}$ ( $REC_{sg}$ ) |
| Resistance of the Undepleted Source Recess Access region | $R_{S\,undepRec}$ | [$\Omega * \mu m$] | = $R_{SHundep}$ ( $REC_{sg}$ ) |
| Uncapped, Fully Depleted Sheet Resistance | $R_{SHdep}$ | [$\Omega$/sq] | = $1/(q\,N_{max}\,\mu_{ave})$ |
| Capped, Undepleted Sheet Resistance | $R_{SH}$ | [$\Omega$/sq] | = $1/(1/R_{SHCap} + 1/R_{SHundep})$ |
| Uncapped, Undepleted Sheet Resistance | $R_{SHundep}$ | [$\Omega$/sq] | = $F_{surfUndep} / (q\,N_{max}\,\mu_{undchan})$ |
| Cap Sheet Resistance | $R_{SHCap}$ | [$\Omega$/sq] | = $1 / [q\,N_{sCap}\,\mu_{cap}(\,H_{cap} - H_{capEtch}\,)\,]$ |
| Surface Depletion Factor | $F_{surfUndep}$ | [] | |
| High On-state bias: Diode Turn-on voltage | $V_{ON}$ | [V] | = $\Phi_b - \Delta E_C - \Delta E_f$ |
| Ohmic Contact Resistance | $R_{cont}$ | [$\Omega * \mu m$] | |
| RF Ohmic Contact Resistance Reduction Factor | $RF_{rconF}$ | [] | |
| Source Access Resistance Bias Modification Factor | $MR_s$ | [] | |
| Cf-Vds Bias Modification Factor | $MC_{fL}$ | [] | |
| Rs-Vds Bias Modification Factor | $MR_{sL}$ | [] | |
| Rs-Vgs Bias Modification Factor | $MR_{sK}$ | [] | |
| Cf-Vgs Swith point to On-state | $VC_{fOn}$ | [] | |
| Cf-Vgs Bias Expansion Factor | $KC_{fK}$ | [] | |
| Rs-Vgs Smith point to On-state | $VR_{sOn}$ | [] | |
| Rs-Vgs Swith point to Off-state | $VR_{sOff}$ | [] | |
| Rs-Vds Swith point from Off-On transition | $VR_{sKnee}$ | [] | |
| Rs-Vds Bias Expansion Factor | $KR_{sL}$ | [] | |
| Rs-Vgs Bias Expansion Factor | $KR_{sK}$ | [] | |
| Rs-Vds Bias Expansion Factor @ Rs Saturation | $KR_{sSat}$ | [] | |
| Rs Bias Shaping Factor | $\gamma R_s$ | [] | |

The following equations describe the drain access region conductance:

| | | | |
|---|---|---|---|
| Drain Access Resistance | $R_D$ | [$\Omega$] | = ( $R_{DRF} + R_{DN}$ ) = ( $R_{DAccess} + R_{DundepCap} + R_{DundepRec} + R_{DSaturated}$ ) / $W_g$ |
| Drain Access Resistance, except for recess access | $R_{DRF}$ | [$\Omega$] | - $R_{DN}$ |
| Drain Recess Access Resistance | $R_{ON}$ | [$\Omega$] | = ( $R_{DRec}$ ) / $W_g$ - $R_{DdepRec}{}^{ON}$ ( $MR_d * V_{gs} + 1$ ) [ 1 - |
| Drain Access Resistance: Recess and Undepleted Cap | $R_{DAccess}$ | [$\Omega * \mu m$] | tanh( $KR_{daccK} * [\,V_{gs} - VR_{dOn} + V_{ds} * MR_{daccL}\,]$ ] ] / 2 = $R_{cont}/RF_{rconF} + R_{SH}[\,D_{gd}$ |
| Drain Access Resistance: Channel and Cap | $R\,D_{undepCap}$ | [$\Omega * \mu m$] | - ($REC_{gd} + L_g/2$)] |
| Resistance of the Undepleted Drain Recess Access region | $R\,D_{undepRec}$ | [$\Omega * \mu m$] | = $R_{SHundep}$ ( $REC_{gd}$ )= $MR_{dSat} * V_{ds}\,exp\,\{\,-[\,V_{gs} + V_{ds} * MR_{dL} + VR_{dSatOff}]^{2/}\,(2$ |
| Resistance of the Saturated Drain Recess Access region | $R_{DSaturated}$ | [$\Omega * \mu m$] | $VR_{dSat\sigma})\,) / \{\,VR_{dSat}[1 + (V_{ds}/VR_{dSat})^{\gamma Rd}\,]^{1/\gamma RdA + 1/\gamma Rd)}\,\}$ |
| Resistance of the Drain Recess Access region at high on-state bias ($V_{on}$) | $R\,D_{depRec}$ | [$\Omega * \mu m$] | = $R_{SHdep}$ ( $REC_{gd}$ ) = $\delta_{VL}\,\{\,1 + (\,R_{DAccess} - R_{DundepCap}\,) /(\,2\delta_{VL}) + sqrt[\,\delta^2$ |
| | $R_{DRec}$ | [$\Omega * \mu m$] | + (($R_{DAccess} - R_{DundepCap})/(2\delta_{VL}) - 1)^2]\,\}$ |
| Drain Access Resistance Bias Modification Factor | $MR_d$ | [] | |
| Rd-Vds Access Bias Modification Factor | $MR_{daccL}$ | [] | |
| Rd-Vgs Swith point to On-state | $VR_{dOn}$ | [] | |
| Rd-Vgs Swith point at saturation | $VR_{dSat}$ | [] | |
| Rdaccess-Vgs Bias Expansion Factor | $KR_{daccK}$ | [] | |
| Rd-Vds Saturation Bias Modification Factor | $MR_{dSat}$ | [] | |
| Rd-Vds Access Resistance Bias Modification Factor | $MR_{dL}$ | [] | |
| Rd-Vgs Saturation Swith point to Off-state | $VR_{dSatOff}$ | [] | |
| Rd-Vgs Saturation Swith point | $VR_{dSat}$ | [] | |
| Rd-Vgs Saturation Swith point transition width | $VR_{dSat\sigma}$ | [] | |
| Rd Bias Shaping Factor | $\gamma R_d$ | [] | |

Semi-Physical Determination Of Small-Signal Equivalent Circuits

To derive values for the familiar small signal equivalent circuit as shown in FIG. 1, a small signal excitation analysis must be applied to the semi-physically modeled physical expressions. The method of applying such an analysis is as follows:

1) Gate Terminal Voltage Excitation

Apply a small +/- voltage delta around the desired bias condition, across the gate-source terminals.

Equivalent circuit element Gm=delta(Ids)/delta (Vgs') where delta (Vgs') is mostly the applied voltage deltas, but also subtracting out that voltage which is dropped across the gate source access region, shown as RsCont, RsundepCap, RsundepRec, ResdepRec, and RsBoundary in FIG. 11, above.

Equivalent circuit element Cgs and Cgd takes the form of delta(Nsn)/delta(Vgs)*Lgn, where delta (Nsn) is the appropriate charge control expression, and Lgn is the gate source or gate drain charge partitioning boundary length.

Equivalent circuit element Ri=Lgs/(Cgschannel*vs) where Cgs channel is the portion of gate source capacitance attributed to the channel only, and vs is the saturated electron velocity.

2) Drain Terminal Voltage Excitation

Apply a small +/− voltage delta around te same bias condition as in 1, but the delta is applied across drain source terminals.

Equivalent circuit element Rds=1/{delta(Ids)/delta (Vds')} where Vds' is mostly the applied voltage deltas, but also subtracting out voltage which is dropped over both the gate source and gate drain access regions.

Equivalent circuit element Cds is taken to be the sum of the appropriate fringing capacitance Semi-Physical models, or can take the form of delta(Nsd)/delta(Vds')*Xsat, were Nsd is the charge control expression for charge accumulation between the appropriate source and drain charge boundaries, and Xsat is the length of the saturated region, if in saturation.

3) On-mesa Parasitic Elements: The equivalent circuit elements, Rs and Rd are expressed by the appropriate electrical conduction models of the source and drain access regions.

The RF performance can be predicted at an arbitrary bias point.

Table 3 represents a comparison of the values for a high frequency equivalent circuit model derived from equivalent circuit model extraction from and semi-physical modeling for the sample illustrated in Table 2.

TABLE 2

Comparison of Modeled Equivalent Circuit Results for Semi-physical Modeling Method, and Equivalent Circuit Model Extraction

| Intrinsic Equivalent Circuit Parameter | Equivalent Circuit Model | Semi-Physical Device Model |
|---|---|---|
| Cgs | 0.227745 pF | 0.182 pF |
| Rgs | 64242 Ω | infinite Ω |
| Cgd | 0.017019 pF | 0.020 pF |
| Rgd | 133450 Ω | infinite Ω |
| Cds | 0.047544 pF | 0.033 pF |
| Rds | 160.1791 Ω | 178.1 Ω |
| Gm | 135.7568 mS | 124 mS |
| Ri | 3.034 Ω | 2.553 Ω |
| Tau | 0.443867 pS | 0.33 pS | leads to the results of the extracted model results being slightly off from the optimum physically significant solution.

TABLE 3

Comparison of Modeled "Parasitic" Equivalent Circuit Results for Semi-physical Modeling Method, and Equivalent Circuit Model Extraction

| Extrinsic Equivalent Circuit Parameter | Equivalent Circuit Model | Semi-Physical Device Model |
|---|---|---|
| Rg | 1.678 Ω | 1.7 Ω |
| Lg | 0.029314 nH | 0.03 nH |
| Rs | 1.7 Ω | 1.21 Ω |
| Ls | 0.002104 nH | 0.003 nH |
| Rd | 3.309899 Ω | 5.07 Ω |
| Ld | 0.031671 nH | 0.02 nH |
| Cpg | 0 pF | 0.02 pF |
| Cpd | 0 pF | 0.01 pF |

Figure 12:
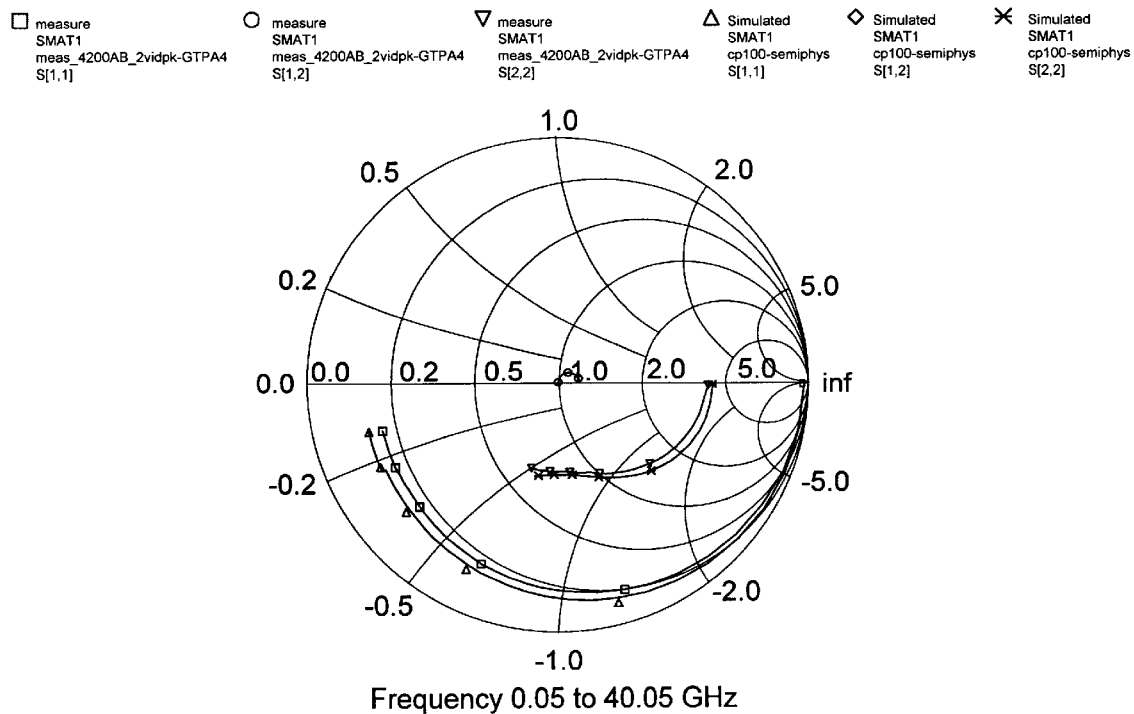
FIG. 12 is a Smith chart illustrating the measured vs modeled S-parameters S11, S12 and S22 simulated in accordance with the method in accordance with the present invention.
Figure 13:
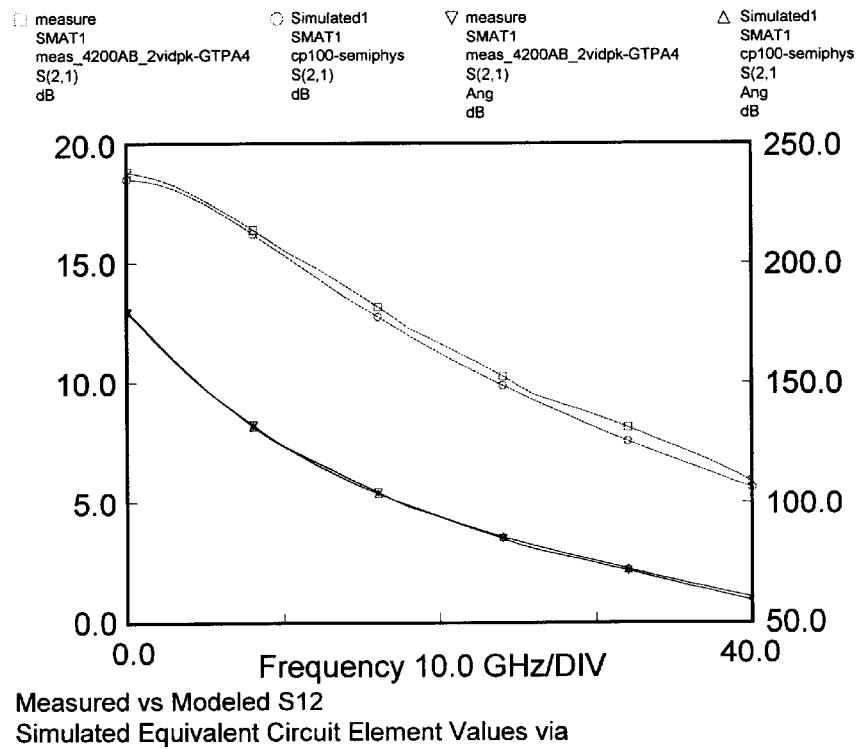
FIG. 13 is similar to FIG. 12 and illustrates the measured vs. modeled values for the S21 parameter.
Figure 14:
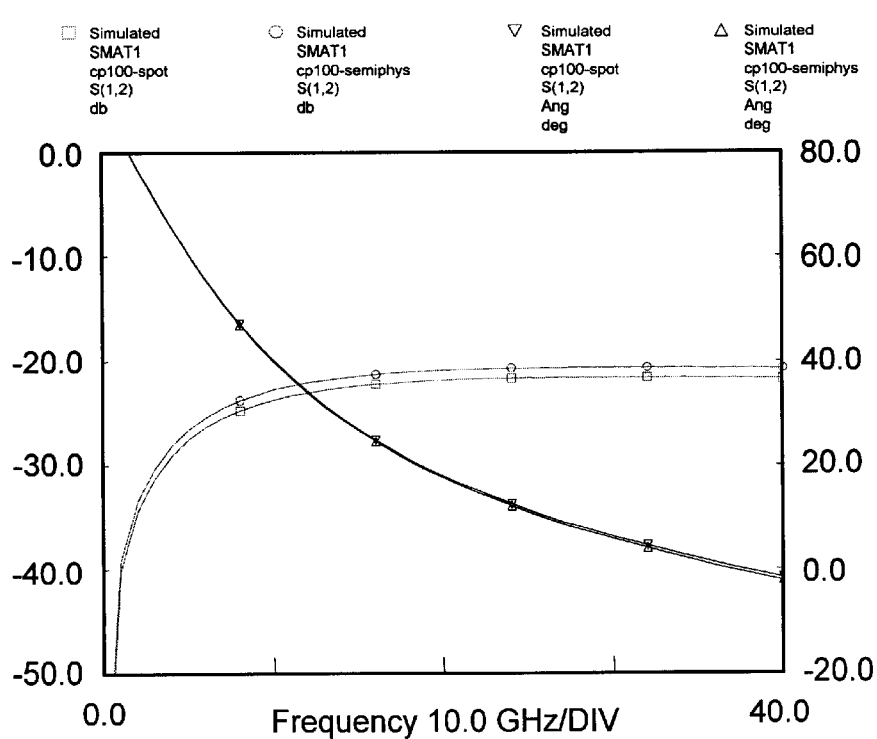
FIG. 14 is similar to FIG. 12 but for the S12 S-parameter.

As shown in FIGS. 12, 13 and 14, the modeled results that are simulated using the semi-physically derived equivalent circuit model very accurately replicate the measured high frequency, S-parameter data.

Figure 65:
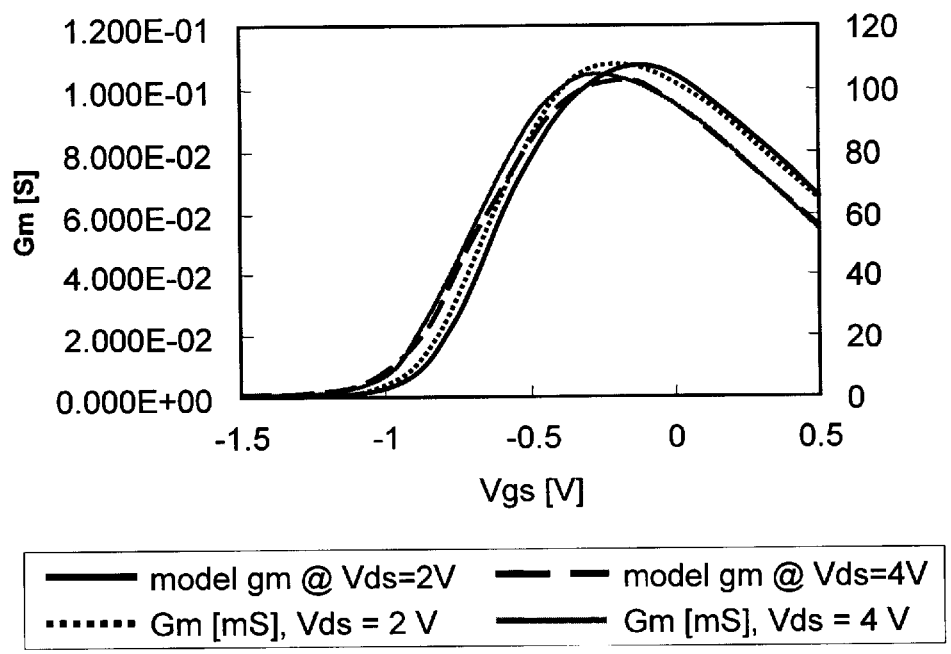
FIG. 65 is a graphical illustration of the semi-physically modeled vs measured small signal Gm.

The following equations represent the small-signal excitation derivation of small-signal equivalent circuit modeled Gm. FIG. 65 illustrates the semi-physically simulated bias equations of the small signal Gm compared to measured data.

| | | |
|---|---|---|
| Semi-Physically Modeled Drain-Source Current Control | $I_{ds}$ [A] | $= g_{ch} V_{ds} (1 + \lambda V_{ds}) / [1 + (V_{ds}/V_{sate})^m]^{1/m}$ |
| Small-Signal Determination of equiv Circuit Gm value | $g_{mRF}$ [S] | $= dI_{ds} / d(V_{gs} - V_{sAcc}) =$ $I_{dsW} * (R_{SUndepCap} + R_{SAccess} + R_{SBoundary} + R_{probes}/W_g)$ |
| Source-Access voltage drop | $V_{SAcc}$ [V] | |
| Fine Extrinsic Saturation Voltage | $V_{sate}$ [V] | $= I_{satcom} / g_{ch}$ |
| Extrinsic Conductance of the Linear Region, Under the gate | $g_{ch}$ [S] | $[1 + g_{chi} (R_s + R_d)]$ |
| Intrinsic Conductance of the Linear Region, Under the gate | $g_{chi}$ [S] | $= (q N_s \mu_{ave} W_g) / L_g$ |

The results of the semi-physical modeling method produce a small-signal equivalent circuit values which are relatively more accurate than the physical device simulator in this case. Furthermore, given the differences in the parasitic embedding, treatment of the two approaches, the results given in Table 3 yield much closer results than a comparison of equivalent circuit values.

Figure 66:
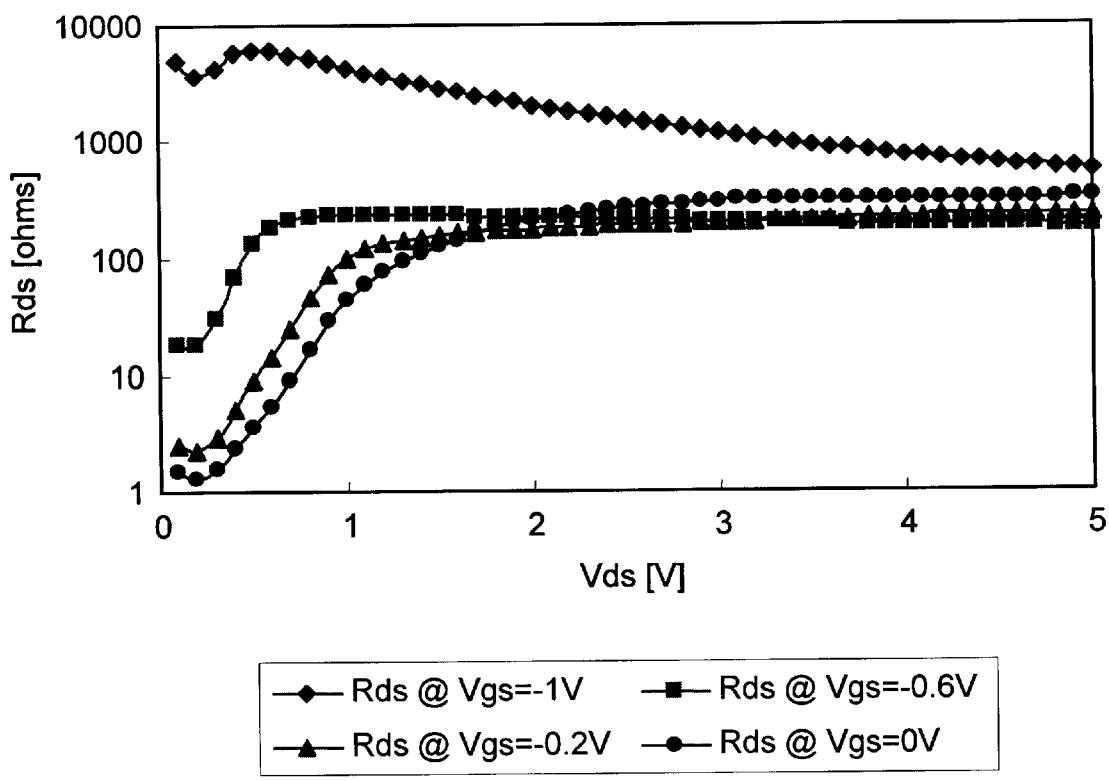
FIG. 66 is a graphical illustration of the semi-physically simulated bias dependence of the small-signal output conductance Rds.

Table 3 lists the values of parasitic elements used in the model derivations. An important difference between the extracted equivalent circuit model and the semi-physically derived one is the use of Cpg and Cpd to model the effect of launch capacitance for the tested structure. This difference The following equations represent the small-signal excitation derivation of Rds. FIG. 66 illustrates the semi-physically simulated biase-dependence of the small-signal Rds.

| | | | |
|---|---|---|---|
| Small-Signal Deterimination of equiv. Circuit Rds value | $R_{ds}$ | [Ω] | $= 1 / g_{dsRF} =$ |
| | $g_{dsRF}$ | [S] | $\{ dI_{ds} / d(V_{ds} - R_{probeD} * I_{ds} - V_{sAcc} - V_{dAcc} - V_{dSat})\} * r_{dsF} = I_{dsW} * (R_{DUndepCap} + R_{DUndepRec} + R_{DAccess} +$ |
| Drain-Access voltage drop | $V_{DAcc}$ | [V] | $R_{probeD}/W_g$ ) |
| Drain-Saturated Region voltage drop | $V_{DSAT}$ | [V] | $= I_{dsW} * (R_{DSaturated})$ |
| External Test probe or lead resistance | $R_{probeD}$ | [Ω] | $= (RF_{rdsF} + 1) *$ |
| High Frequency conductance dispersion factor | $r_{dsF}$ | [] | $\tanh( 10 * \| V_{ds} - V_{th} \| ) + 1$ |
| High Frequency conductance dispersion | $RF_{rdsF}$ | [] | |

Figure 67:
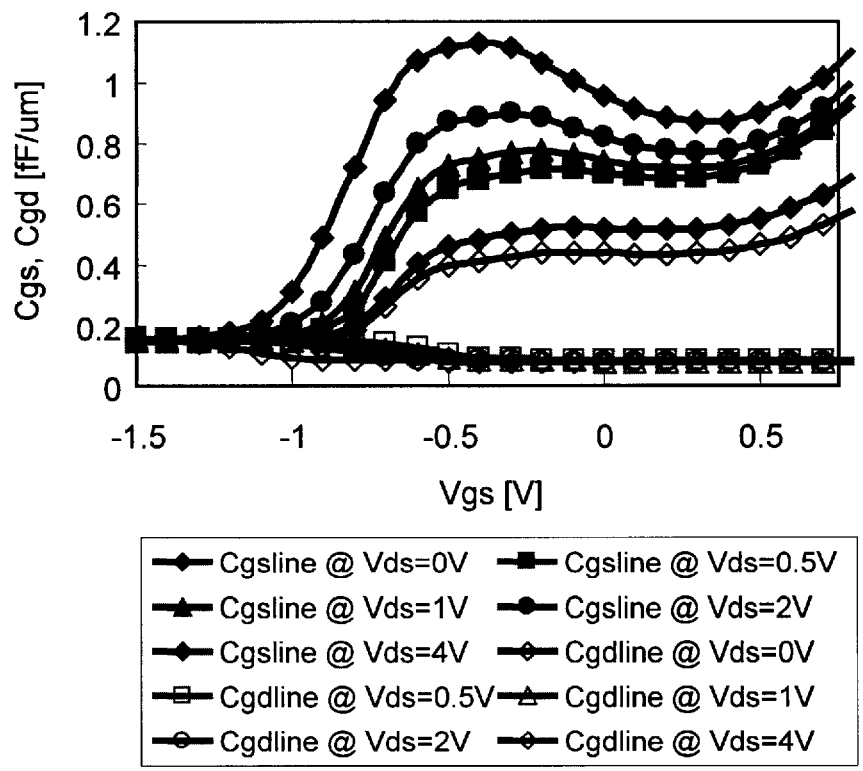
FIG. 67 is a graphical illustration of the semi-physically simulated bias dependence of the small signal gate-source and gate-drain capacitance Cgs and Cgd.

The following equations may be used for the small-signal excitation derivation of Cgs and Cgd. FIG. 67 illustrates the semi-physically simulated bias-dependence of the small-signal Cgs and Cgd.

the previous examples was used because the example MMIC circuit was fabricated utilizing the same HEMT device technology.

| | | | |
|---|---|---|---|
| Small-Signal Deterimination of equiv. Circuit Rds value | $C_{gs}$ | [fF/μm] | $= C_{gdf} + \beta\, C_{gcTet}\, L_{gs} *$ $\{1 - [V_{seten} - V_{des})/(2*V_{seten} - V_{dea})]^2\}$ |
| | $C_{gd}$ | [fF/μm] | $= C_{gdf} + \beta\, C_{gcTet}\, L_{gs} *$ $\{1 - [V_{seten}/(2*V_{seten} - V_{dea})]^2\}$ |
| Parasitic Gate-Source Fringing Capacitance | $C_{gsf}$ | [fF/μm] | $= Cg_{serf}C_{f\text{-}ferm1}SiNF + Cgsf_{source} + Cgsf_{pad}$ |
| Parasitic Gate-Source Fringing Capacitance | $C_{gdf}$ | [fF/μm] | $= Cg_{serf}C_{f\text{-}ferm1}SiNF + Cgdf_{cap} + Cgdf_{pad}$ |
| Total Specific Gate-Channel Capacitance | $C_{gcTot}$ | [fF/μm] | $= C_{gc} + C_{gcdonor}$ |
| | | | $= C_{gc}Msh_{Kchen}/$ |
| Specific Gate-Channel Capacitance | $C_{gc}$ | [fF/μm] | $\{[1 + (N'_s/N_O + N_{maxOc})^{65\,c})^{(1+1/\gamma c)}]\}$ |
| Effective Drain-Source Voltage Control | $V_{dse}$ | [V] | $= V_{dc}/[1 + (V_{ds}/V_{seten})^m]^{1/m}$ |
| Specific Gate-Donor Layer Accumulation Capacitance | $C_{gcdonor}$ | [fF/μm] | $= q$ of $N_{sDonor}/dV_{gs}$ |
| Ideal Specific Gate-Channel Capacitance | $c_{gc}$ | [fF/μm] | $= q$ of $N'_s/dV_{gs}$ |
| | | | $= (N'_s + N_s)*(d_t + \Delta d_t)Msh_{Kper} * V_{gte}/$ |
| Empirical Parasitic Donor Charge Control Expression | $N_{sDonor}$ | [cm$^{-2}$] | $(d_i + \Delta d_i)$ |
| Fringing capacitance to surface of source-access region | $C_{gsurf}$ | [fF/μm] | |
| Empirical Fringing capacitance-bias shaping expression | $C_{f\text{-}form1}$ | [] | $= \{1 - \tanh[KC_{1K}(V_{gs} - VC_{tOn} + V_{ds}MC_{fL})]\}/2$ |
| Fringing capacitance to source-access region | $C_{gs/Source}$ | [fF/μm] | |
| Fringing capacitance to source metal pads | $C_{gs/Pad}$ | [fF/μm] | |
| Fringing capacitance to drain-access Capped Region | $C_{gd/Cap}$ | [fF/μm] | |
| Fringing capacitance to drain metal pads | $C_{gd/Pad}$ | [fF/μm] | |
| Dielectric Coating Thickness Factor | SiNF | [] | |
| Specific Gate-Channel Capacitance Bias Modification Factor | $Msh_{Kcahn}$ | [] | |
| Donor Charge Bias Modification Factor | $Msh_{Kper}$ | [] | |
| Empirical Specific Charge Control Shaping Parameter | $\kappa^C$ | [] | |

Figure 68:
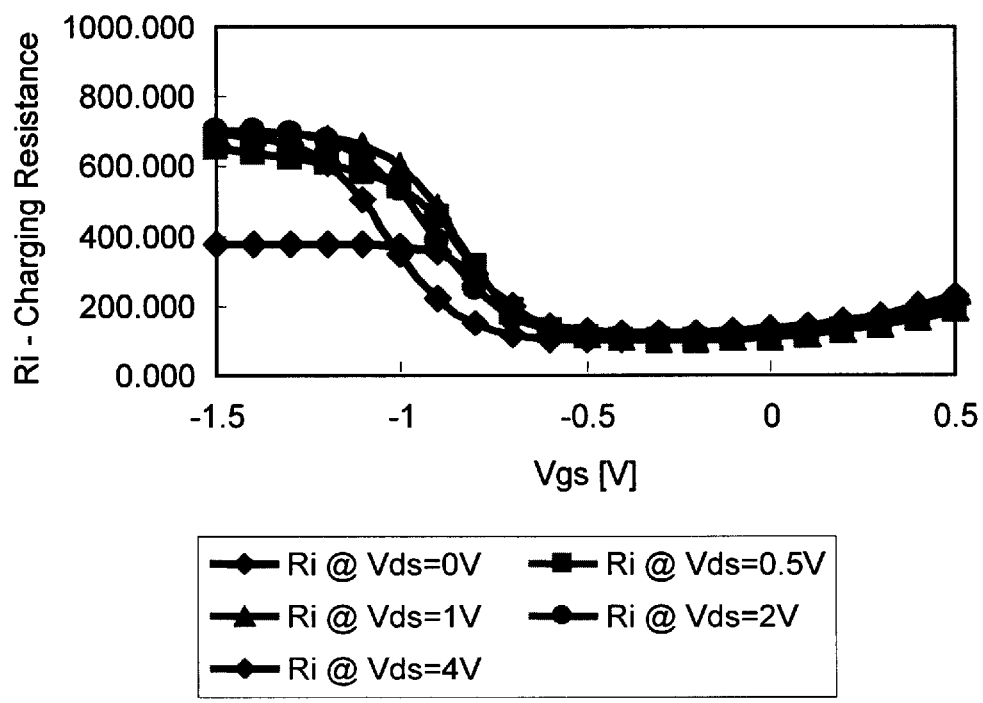
FIG. 68 is a graphical illustration of the semi-physically simulated bias-dependence of the small signal gate source charging resistance Ri.

The following equations are involved in the small-signal excitation derivation of Ri. FIG. 68, which follows, shows the semi-physically simulated bias-dependence of the small-signal Ri.

In this example, the bias-dependence small-signal gain and noise performance of a two-stage balanced K-band MMIC LNA amplifier is replicated through microwave

| | | | |
|---|---|---|---|
| Gate-Source Non-quasistatic charging resistance | $R_{iCharge}$ | [Ω * μm] | $= L_{gs2}\, W_g / [ C_{gsChan}\, W_g\, v_s ] =$ |
| Gate-Channel Source Capacitance | $C_{gsChan}$ | [fF/μm] | $C_{gsf} + \beta\, C_{gc}\, L_{gs} *$ $\{ 1 - [ (V_{saten} - V_{dse}) / ( 2 * V_{saten} - V_{dse})]^2 \}$ |

Figure 69:
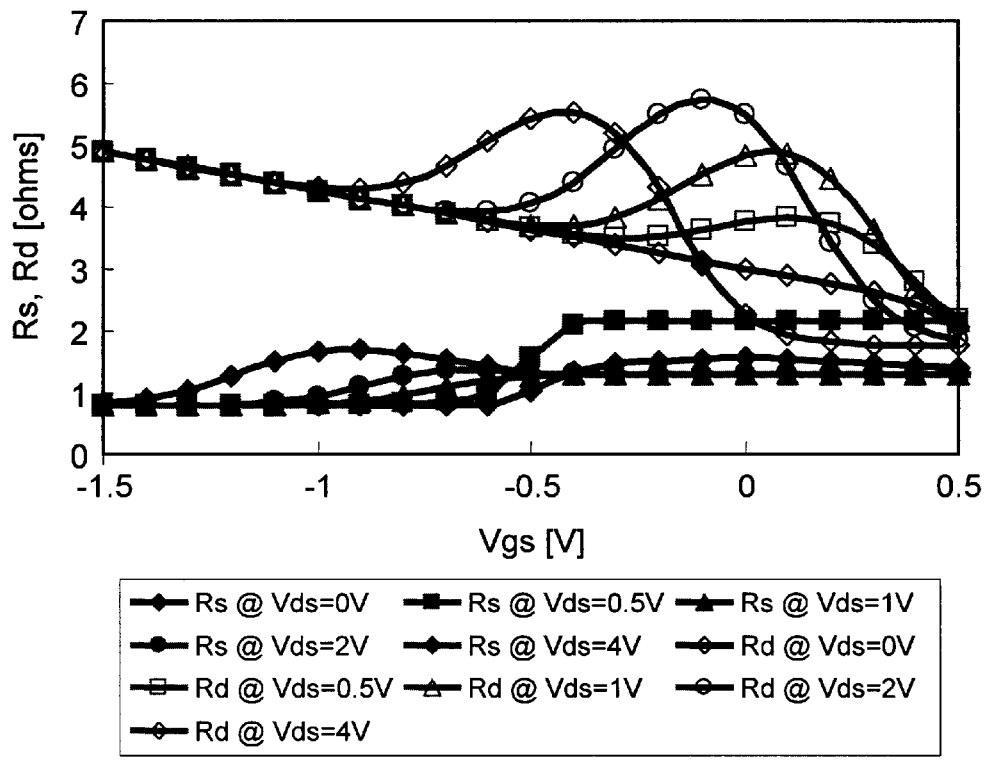
FIG. 69 is a graphical illustration of the semi-physcially bias dependence of the small signal source and drain resistance Rs and Rd.

FIG. 69 below shows the semi-physically simulated bias-dependence of the on-mesa parasitic access resistances, Rs and Rd.

Example Of Semi-Physical Model And Bias-Dependence Small-Signal Source And Drain Resistance, Rs And Rd.

The following example verifies how the semi-physical small-signal device model is able to provide accurate projections for bias-dependent small-signal performance. In this example, the same semi-physical device model as used in circuit simulation using small signal and noise equivalent circuits that were generated by the semi-physical model. The results of the measured and modeled results are shown below in Table 4. As seen from these results, the semi-physical device model was able to accurately simulate the measured bias-dependent performance, even though the bias variation was quite wide.

TABLE 4

Measured vs. Modeled Gain NF and Gain @ 23.5 Ghz for K-band MMIC LNA at Difference Bias Conditions

| Bias Condition | Measured Gain @ 23.5 GHz | Predicted Gain @ 23.5 GHz | Measured NF @ 23.5 GHz | Predicted NF @ 23.5 GHz |
|---|---|---|---|---|
| Vds = 0.5 V 112 mA/mm | 15.2 dB | 15.8 dB | 2.97 dB | 2.77 dB |
| Vds = 1.0 V 112 mA/mm | 20.6 dB | 21.0 dB | 2.29 dB | 2.20 dB |
| Vds = 2.0 V 112 mA/mm | 19.8 dB | 20.2 dB | 2.25 dB | 2.15 dB |
| Vds = 3.0 V 112 mA/mm | 18.9 dB | 19.1 dB | 2.30 dB | 2.11 dB |
| Vds = 3.5 V 112 mA/mm | 18.4 dB | 18.5 dB | 2.34 dB | 2.18 dB |
| Vds = 4.0 V 112 mA/mm | 18.0 dB | 18.0 dB | 2.37 dB | 2.27 dB |
| Vds = 2.0 V 56 mA/mm | 16.4 dB | 18.0 dB | 2.45 dB | 2.21 dB |
| Vds = 2.0 V 170 mA/mm | 21.4 dB | 20.9 dB | 2.38 dB | 2.21 dB |
| Vds = 2.0 V 225 mA/mm | 22.2 dB | 21.0 dB | 2.65 dB | 2.6 dB |
| Vds = 3.0 V 225 mA/mm | 21.4 dB | 20.3 dB | 2.71 dB | 2.61 dB |
| Vds = 3.0 V 170 mA/mm | 20.5 dB | 20.0 dB | 2.42 dB | 2.22 dB |
| Vds = 4.0 V 170 mA/mm | 19.6 dB | 19.2 dB | 2.50 dB | 2.29 dB |

Figure 70:
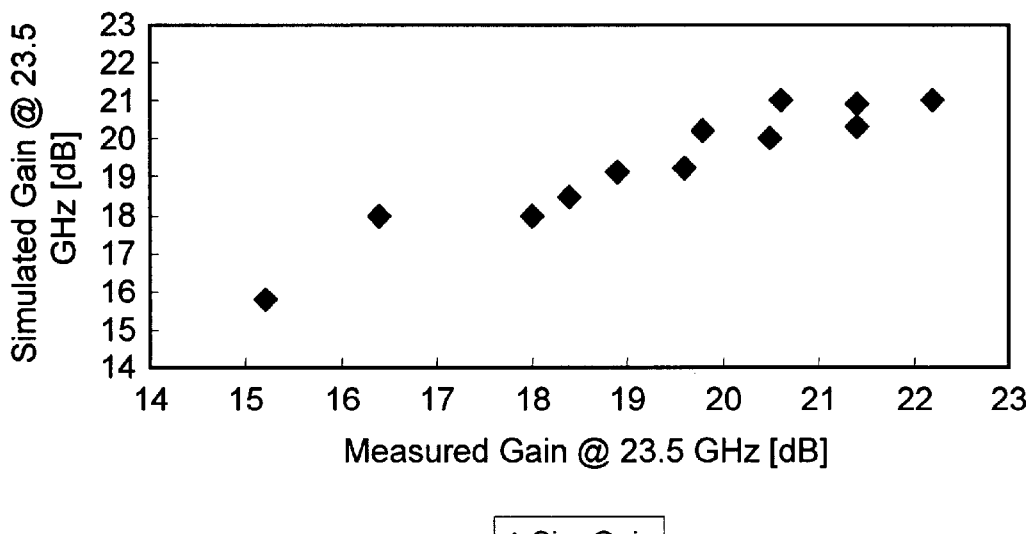
FIG. 70 is a graphical illustration of the measured vs modeled bias dependence gain at 23.5 Ghz for a K-band MMIC amplifier.

A plot of measured vs. modeled gain for the values listed in Table 3, above, is shown in FIG. 70.

Example Of Semi-Physical Model Accurate Physical Nature

The following example verifies how the semi-physical small-signal device model is able to provide accurate projections for physically dependent small-signal performance. In this example, the same semi-physical device model as used in the previous examples was used.

In this example, physical process variation was input into the semi-physical device model in terms of statistical variation about known averages, cross-correlation, and standard deviations. The goal of this exercise was to replicate the measured DC and small-signal device variation. The degree of accurate replication indicates the degree to which the semi-physical model is physically accurate.

Table 5 below lists the simulated, and known process variation that was used:

TABLE 5

Statistical Process Variation Model

| Parameter | Nominal | Standard Dev. |
|---|---|---|
| Gate Length | 0.15 μm | 0.01 μm |
| Gate-Source Recess | 0.16 μm | 0.015 μm |
| Gate-Drain Recess | 0.24 μm | 0.020 μm |
| Etch Depth | 780 A | 25 A |
| Pass. Nitride Thickness | 750 A | 25 A |
| Gate-Source Spacing | 0.7 μm | 0.1 μm |
| Source-Drain Spacing | 1.8 μm | 0.15 μm |

In the course of microelectronic component production, sample devices are tested in process in order to gain statistical process control monitor (PCM) data. FIGS. 71A and 71B shows schematically the kind of data that is extracted and recorded from measured device I–V's during PCM testing.

Figure 73:
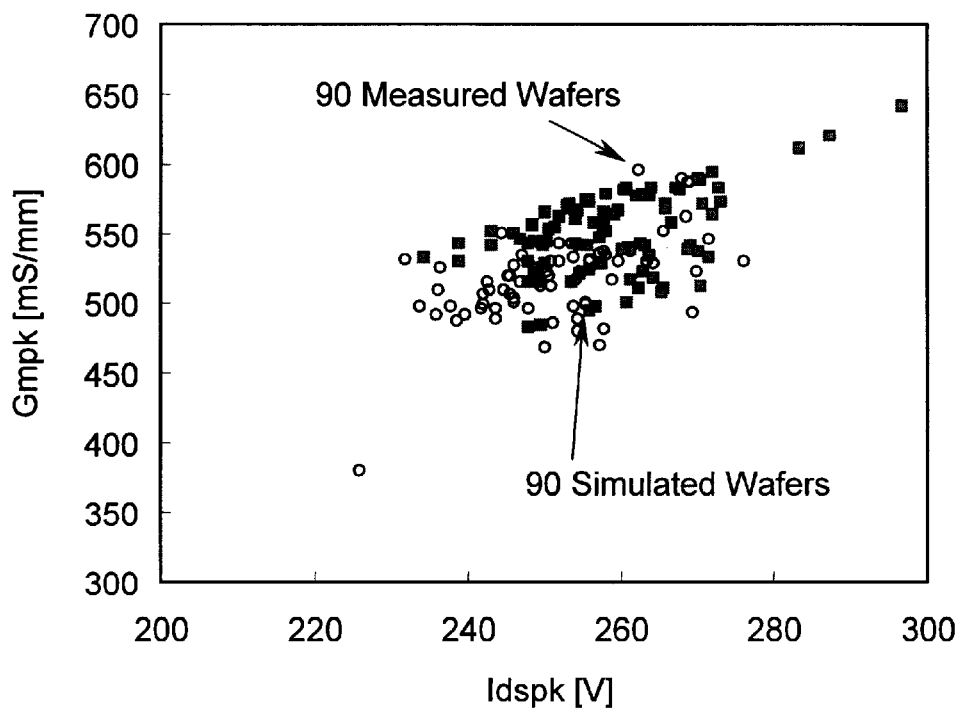
FIG. 73 is a graphical illustration of the measured vs semi-physically simulated process variation for Idpk and Gmpk.
Figure 74:
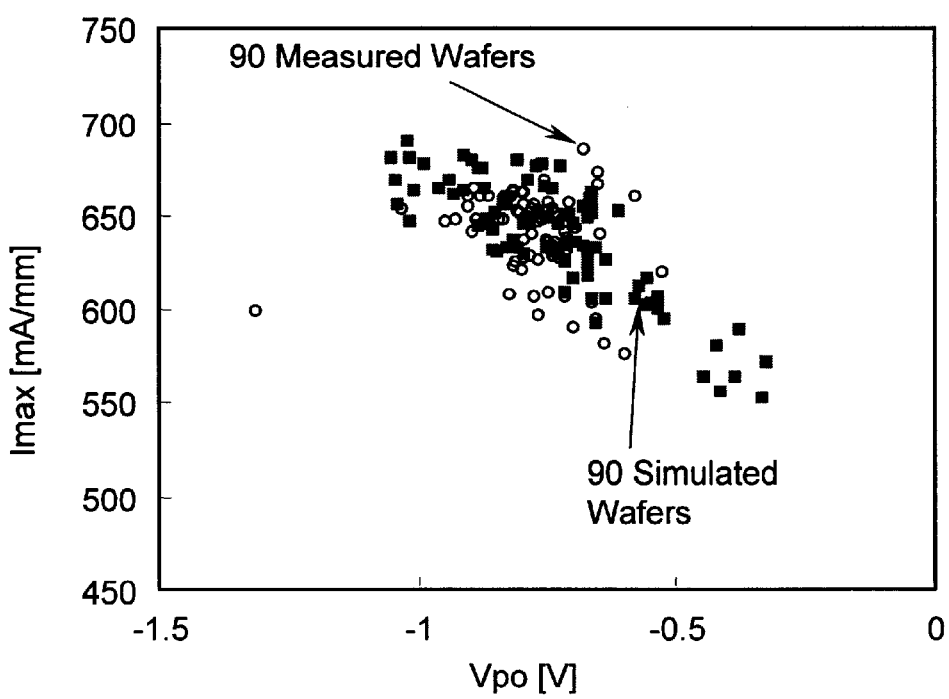
FIG. 74 is a graphical illustration of the measured vs semi-physically simulated process variation for Imax and Vpo.

Since the semi-physical device model is able to simulate I–V's, it was able to simulate the variation of I–V's due to physical process variation. These I–V's were analyzed in the same fashion to extract the same parameters that are recorded for PCM testing. FIGS. 72, 73 and 74 show how accurately the simulated results match with measured process variation. FIG. 72 shows how the semi-physically simulated Vgpk and Gmpk match with actual production measurements. FIG. 73 shows how simulated Idpk and Gmpk match, also. Finally, FIG. 74 shows how simulated Imax and Vpo also match very well.

Small-signal S-parameter measurements are also taken in process for process control monitoring. These measurements are used to extract simple equivalent circuit models that fit the measured S-parameters. Since the semi-physical device model is able to simulate these equivalent circuit models, it was able to simulate the variation of model parameters due to physical process variation.

Figure 75:
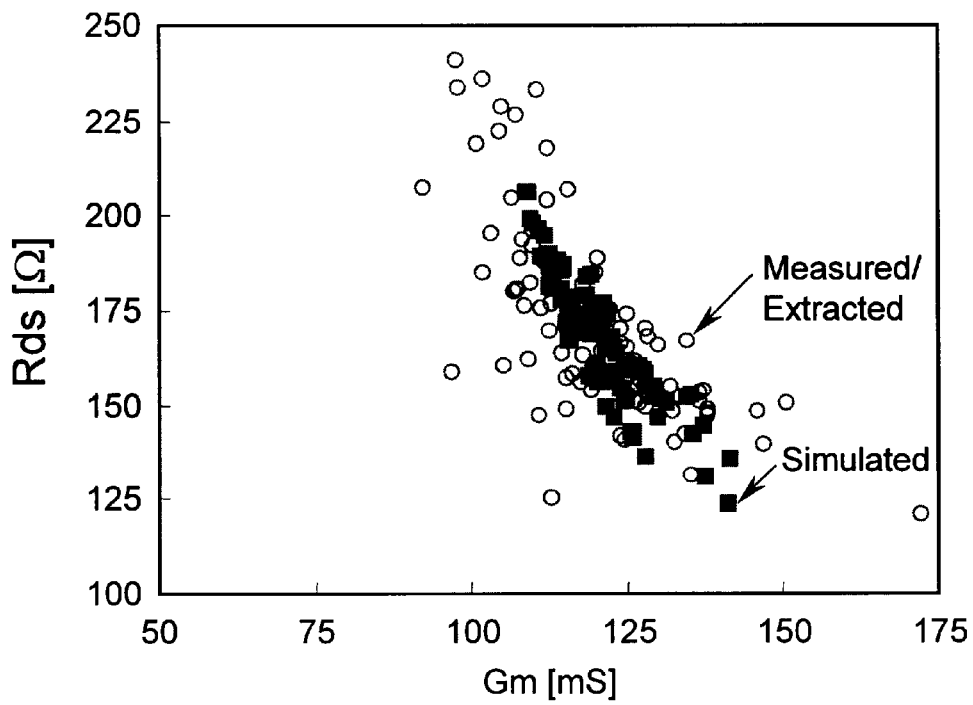
FIG. 75 is a graphical illustration of the measured/ extracted vs semi-physically simulated process variation for the small signal equivalent model Rds and Gm.
Figure 76:
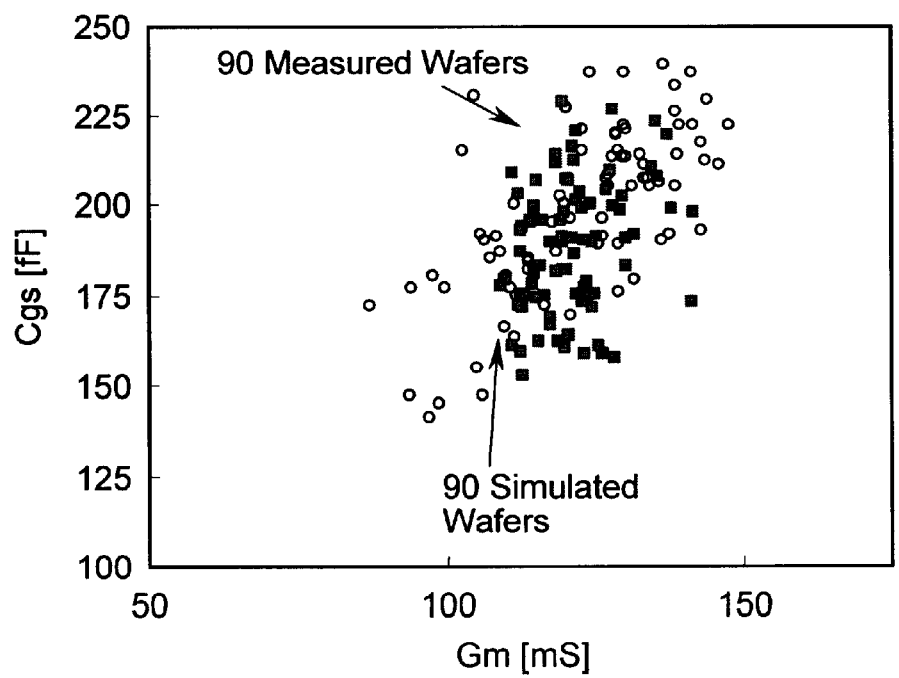
FIG. 76 is a graphical illustration of the measured/ extracted vs semi-physically simulated process variation for the small signal equivalent model Cgs and Gm.
Figure 77:
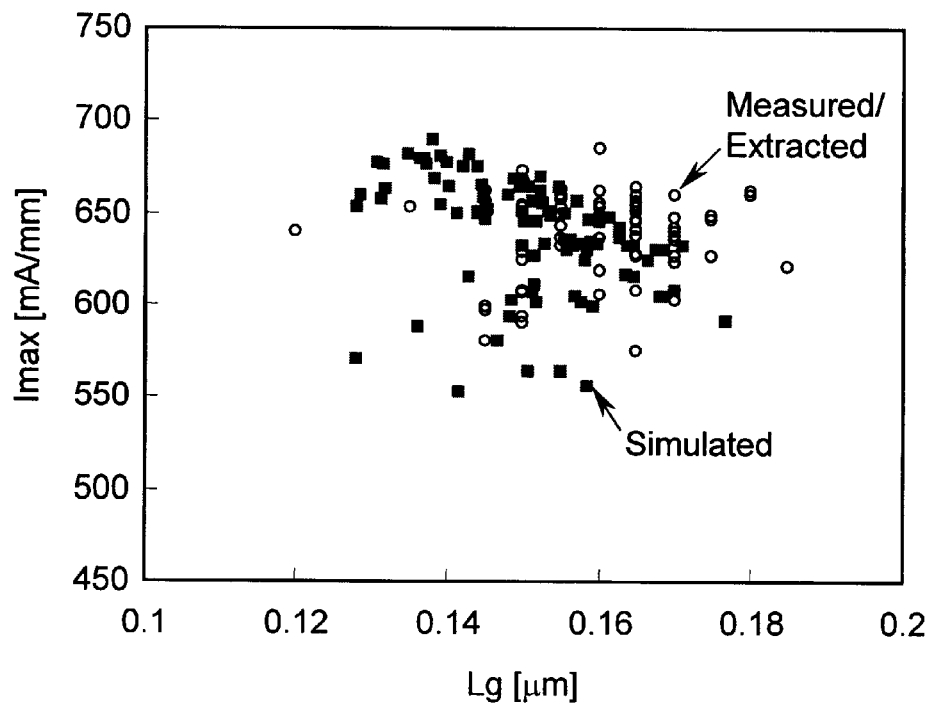
FIG. 77 is a graphical illustration of the measured vs semi-physically simulated physical dependence for Imax as a function of physical gate length.
Figure 78:
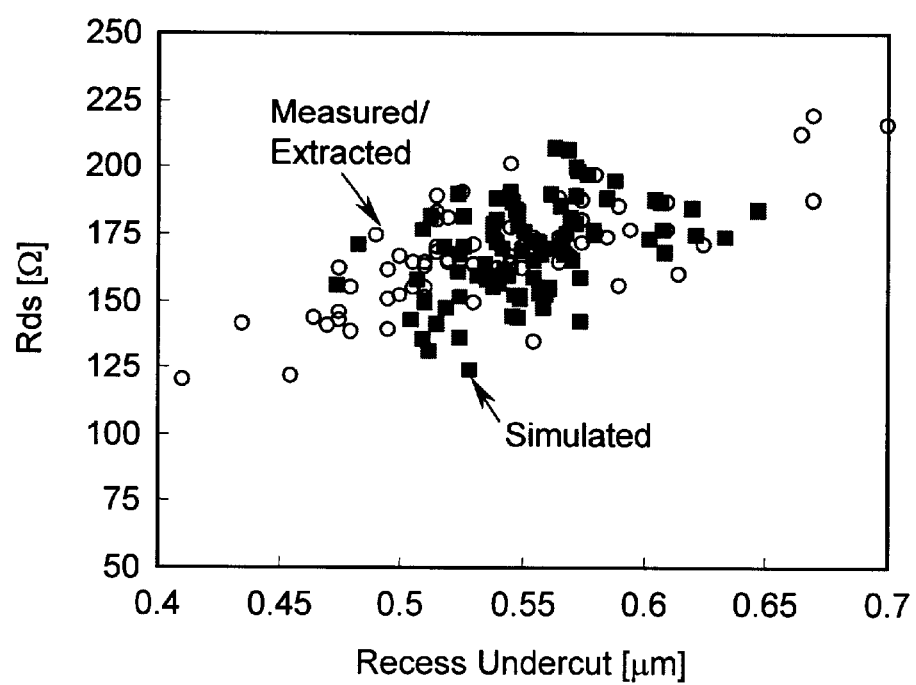
FIG. 78 is a graphical illustration of the measured/ extracted model vs semi-physically simulated physical dependence for Rds as a function of physical recess undercut width.

FIGS. 75 and 76 show how accurately the simulated results match with measured/extracted process variation for the small-signal model parameters. FIG. 75 shows how the semi-physically simulated Rds and Gm match very well with actual extracted model process variation More direct and convincing evidence supporting the accurate, physical nature of the semi-physical model can be shown be comparing the dependence of simulated and measured performance to real physical variable. As shown in FIG. 77, the semi-physical model is able to very accurately reproduce the dependence of Imax upon gate length. In addition, the semi-physical model is also able to replicate physical dependence for high-frequency small-signal equivalent circuits. This is shown in FIG. 78, which shows that it is able to reproduce the dependence of Rds with Recess undercut width.

Hybrid Approach

As mentioned above, the modeling approach in accordance with the present invention is a hybrid of semi-physical and data-fitting modeling. The first step in the hybrid modeling approach is to derive a semi-physical device model as discussed above. Secondly, a data-fitting nonlinear device model whose expressions satisfy the charge conservation law is selected. An exemplary data-fitting nonlinear device model is disclosed in "A New Empirical Model for HEMT Devices," by Y. C. Chen, *IEEE Microwave Guided Wave Letters*, Vol. 8, No. 10, October 1998. This model satisfies the charge conservation constraint for current. In order to complete the description of the nonlinear model the following charge expressions are used:

Gate Charge (Empirical Nonlinear Model) $Q_G$ [C] $\dfrac{= (C_{gmax} + C_{gmin}) * V_{gs}/2 + C_{gd} * (V_{ds} - V_{gs})}{(C_{gmax} - C_{gmin}) * \ln\{\cosh[\alpha_c(V_{gs} - V_{g0})]\}/(2^{\alpha}{}_{cg})}$ This equation satisfies the conservation constraints for charge as follows:

$$\frac{\partial Qg}{\partial Vgs \partial Vds} \equiv \frac{\partial Qg}{\partial Vds \partial Vgs}$$

This condition, which is requisite for path integration independence of the expressed charge is satisfied by the expression above.

Figure 15:
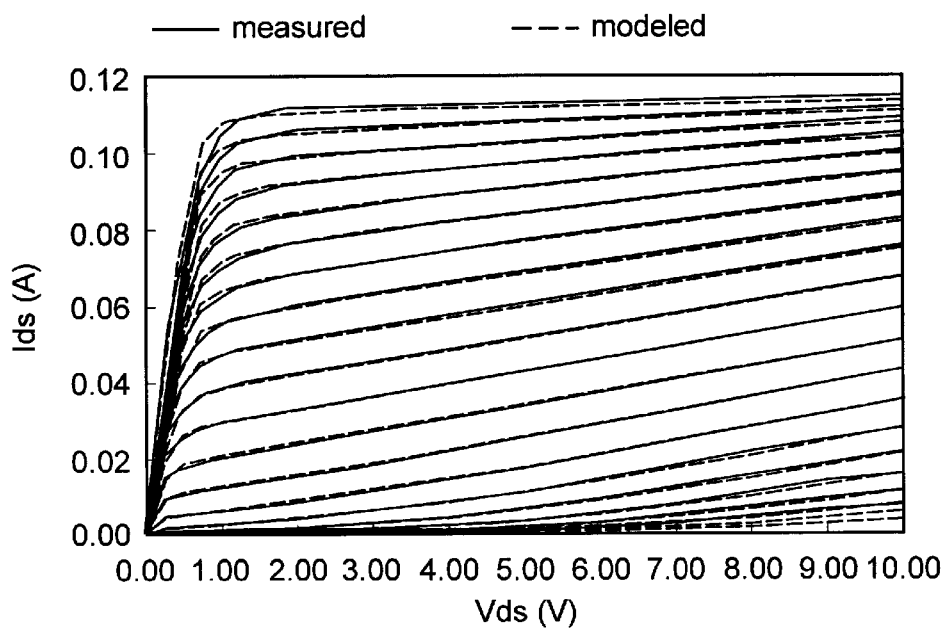
FIG. 15 is a graphical illustration illustrating the fitting of non-linear data-fitting model to a semi-physically modeled I–V characteristics in accordance with the present invention.
Figure 16:
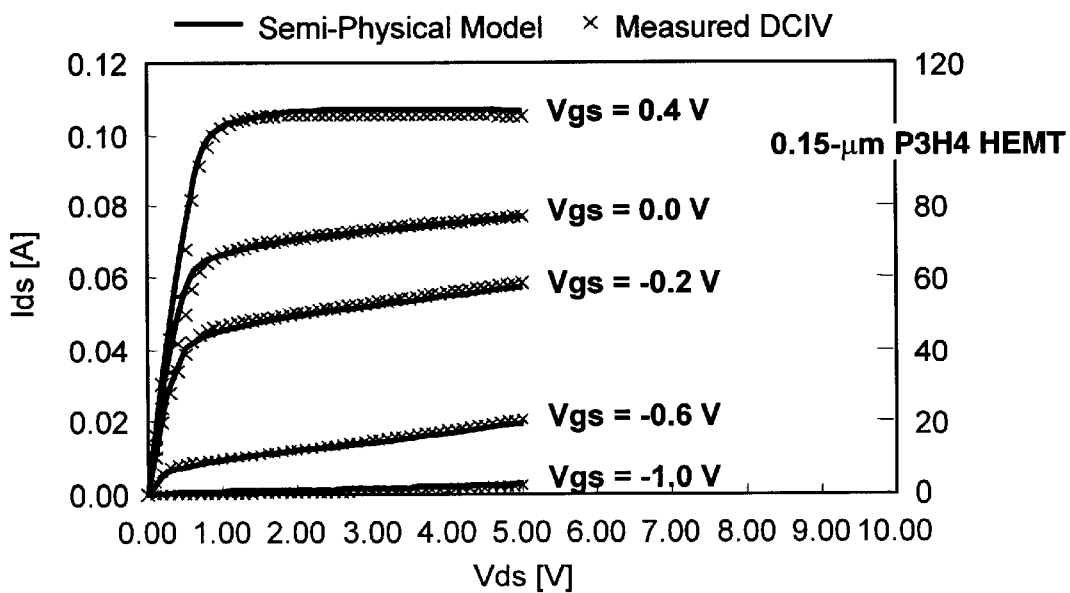
FIG. 16 is a graphical illustration illustrating an example of the measured-to-model I–V characteristics of a semi-physical modeling method.

FIG. 15 demonstrates that the chosen nonlinear data-fitting model relatively accurately fits the semi-physically modeled I–V characteristics. The nonlinear model that is chosen in this example is "A New Empirical Model for HEMT Devices, supra. FIG. 16 demonstrates how the semi-physical model relatively accurately models the measured IV characteristics. By transitivity the nonlinear data-fitting model fits the measured characteristic.

Table 6 below lists the model parameters used with the data-fitting model to fit the semi-physically modeled data.

TABLE 6

Parameters Used in the Nonlinear Data-Fitting Model

| Data-Fitting Model Parameter | Units | Value |
| --- | --- | --- |
| Wref | [μm] | 200 |
| Tau | [ps] | 0.33 |
| Cgmax | [pF] | 0.178 |
| Cgmin | [pF] | 0.04 |
| Acg | [] | 5.5 |
| Vcg | [V] | −0.73 |
| Cds | [pF] | 0.031971822 |
| Cdg | [pF] | 0.016268 |
| Crf | [pF] | 1000000 |
| Rc | [ohm] | 5000 |
| Ri | [ohm] | 5.841183873 |
| Rg | [ohm] | 0.858333333 |
| Rs | [ohm] | 1.338126967 |
| Rd | [ohm] | 3.74236047 |
| Lg | [nH] | 0.018 |
| Ld | [nH] | 0.015 |
| Ls | [nH] | 0 |
| Isatdiode | [A] | 1E-13 |
| Ndiode | [] | 1.2 |
| Rdiode | [ohm] | 32.5 |
| Ipk | [A] | 0.122875 |
| Vk | [V] | 0.606207 |
| Lam | [1/V] | 0.019058 |
| A00 | [] | −2.167863 |
| A01 | [] | 0.088367 |
| A02 | [] | −0.001507 |
| A10 | [] | 2.805016 |
| A11 | [] | −0.019706 |
| A12 | [] | −0.005367 |
| A20 | [] | −1.205267 |
| A21 | [] | 0.167415 |
| A22 | [] | −0.010151 |
| A30 | [] | 4.494973 |
| A31 | [] | −0.964896 |
| A32 | [] | 0.050914 |
| A40 | [] | 0.446656 |
| A41 | [] | −0.145595 |
| A42 | [] | 0.008631 |

TABLE 6-continued

Parameters Used in the Nonlinear Data-Fitting Model

| Data-Fitting Model Parameter | Units | Value |
| --- | --- | --- |
| Vgmax | [V] | 0.6 |
| Vgmin | [V] | −1.4 |
| Rldg | [ohm] | 1000000 |
| Rlgs | [ohm] | 35000 |
| Vpo | [V] | −0.6797 |

Figure 17:
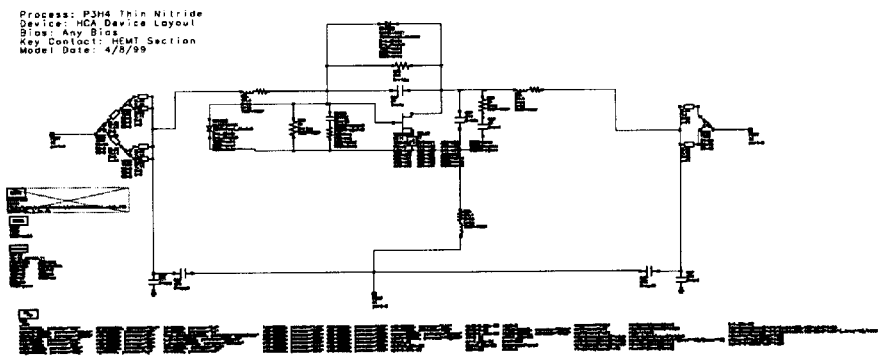
FIG. 17 is an implementation of the nonlinear data-fitting model as a user defined model in LIRBA 6.1.

FIG. 17 illustrates the implementation of the nonlinear data-fitting model into a commercially available microwave CAD tool, for example, LIBRA 6.1 by Agilent Technologies. The LIBRA 6.1 CAD tool contains large signal simulation capabilities based on the harmonic balance algorithm. The particular view shown in FIG. 17 illustrates the circuit element schematic that was implemented and not the actual enabling implementation of the user defined model which is normally implemented as a computer program code extension to LIBRA 6.1. The procedures by which user-defined models may be added to LIBRA 6.1 are discussed in detail in User's Manual entitled "User-Defined Elements" Series VI User Manuals, released 6.0 Hewlett Packard, HP Part No. E4605-90033, July 1995.

Figure 18A:
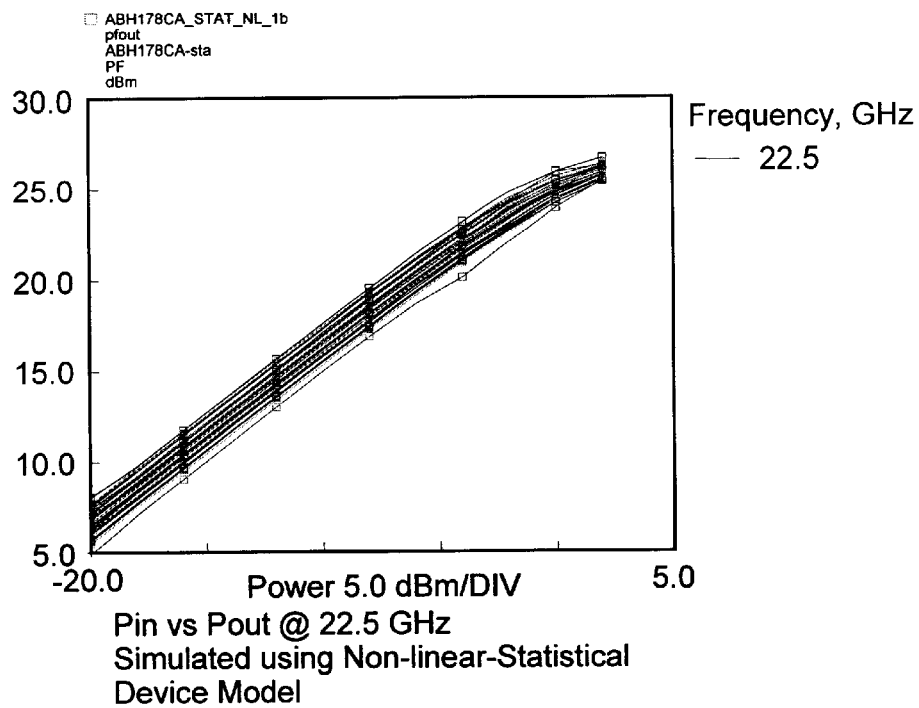
FIGS. 18A and 18B illustrate the measured vs. modeled input power as a function of output power for a 22–23 GHz high-power amplifier.
Figure 18B:
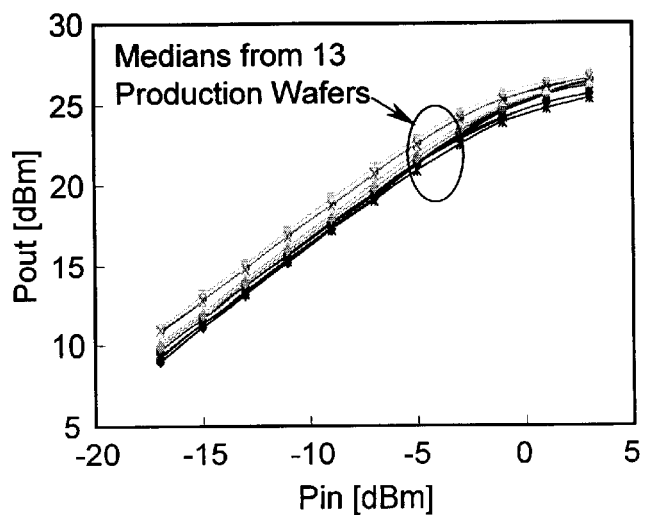

FIGS. 18A and 18B illustrate how the hybrid device modeling produces relatively accurate large signal simulation results. In particular, the input power response is shown for a two-stage balanced high-power amplifier at a frequency of 22.5 GHz. The measured responses are shown in FIG. 18B while the simulated response is shown in FIG. 18A. As shown, the measured vs. model responses are relatively close to each other indicating a relatively high degree of accuracy for the device modeling process.

The following example demonstrates the ability of the approach to accurately incorporate the effect known physical process changes into the simulation of large signal device characteristics. The multiple curves that are shown in each plot of FIGS. 18A and 18B may be obtained from: several measured circuits from a plurality (i.e. 13) wafers in the case of measured data; and simulated performance variation due to simulated physical process variation. The simulated process variation used is as discussed below under the caption "PM$^2$ Process Perturbation to Measured Model Method for Semiconductor Device Technology Modeling". The parameters used to simulate the process variation are provided below in Table 7.

The tables that have been generated for a 0.15 micrometer HEMT process relate to a realistic distribution of physical process variation. The following process parameters were varied accordingly as shown in Table 7.

TABLE 7

Physical Process Variation Model Parameters

| Parameter | Nominal | Standard Dev. |
| --- | --- | --- |
| Gate Length | 0.15 μm | 0.01 μm |
| Gate-Source Recess | 0.16 μm | 0.015 μm |
| Gate-Drain Recess | 0.24 μm | 0.020 μm |
| Etch Depth | 780 A | 25 A |
| Pass. Nitride Thickness | 750 A | 25 A |
| Gate-Source Spacing | 0.7 μm | 0.1 μm |
| Source-Drain Spacing | 1.8 μm | 0.15 μm |

A physical correlation may be simulated between the recess spacing and gate length. A correlation factor of 0.5 between gate length and both recess dimensions may be incorporated in the semi-physical model statistics. Although the process variation described above is simple and realistic it is adequate in describing all of the DC and RF performance variations for wafer means/medians.

Figure 19:
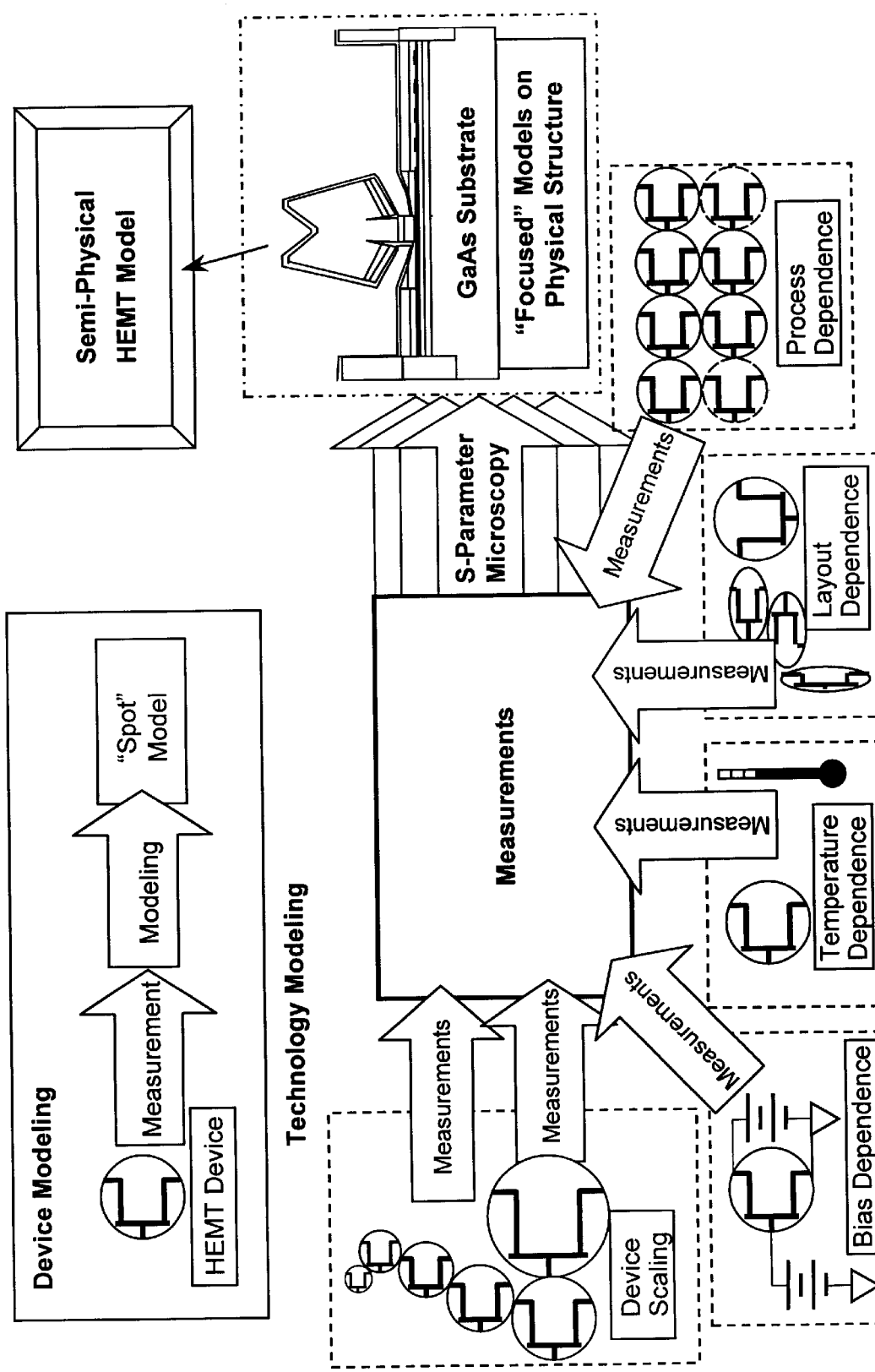
FIG. 19 is a block diagram illustrating the semiconductor semi-physical modeling in accordance with the present invention.
Figure 20:
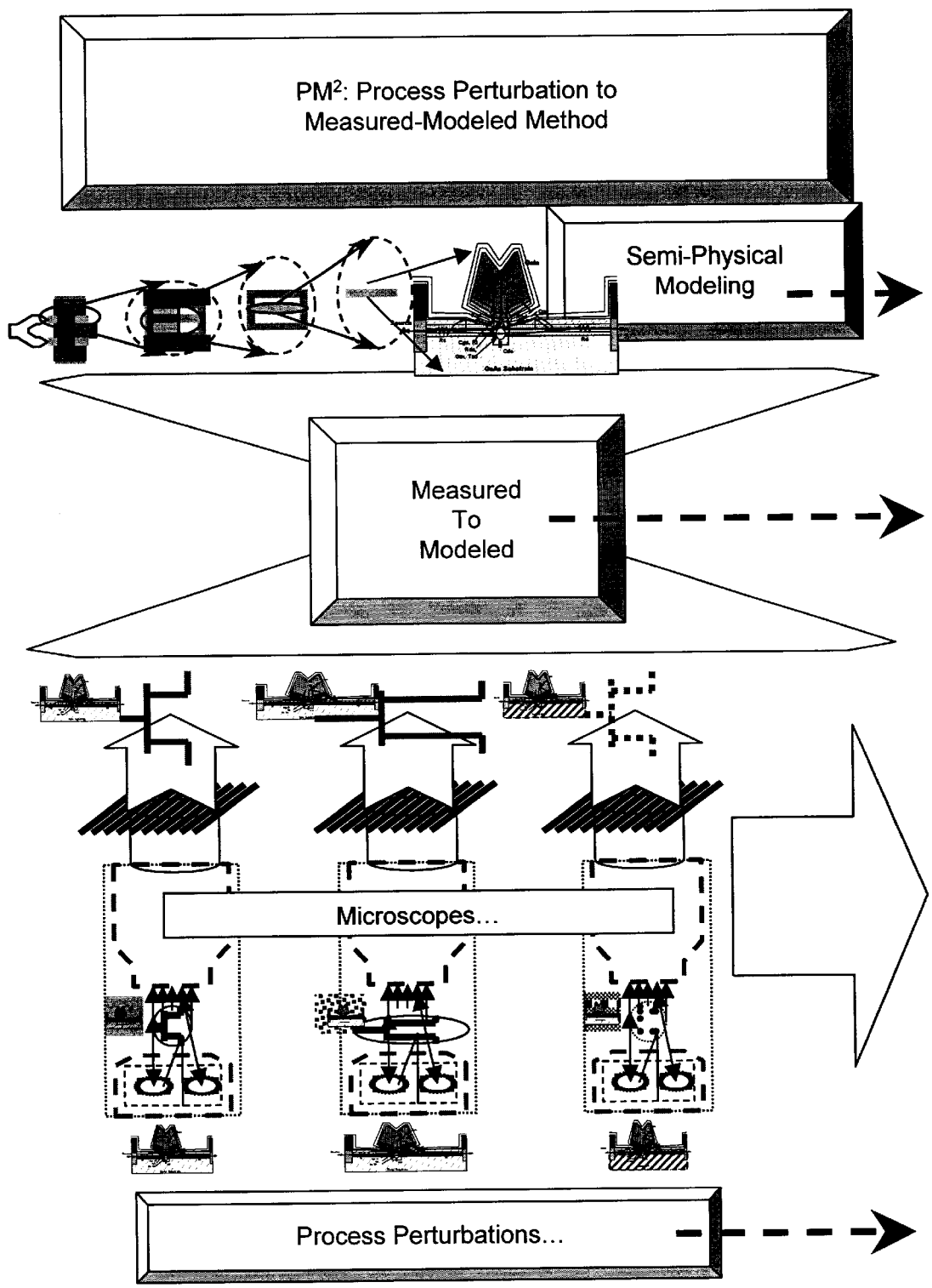
FIG. 20 is a block diagram of the semi-physical model used in the processed perturbation to measured model method for modeling semiconductors which utilizes S-parameter microscopy in accordance with the present invention.

Process Perturbation To Measured Modeled Method For Semiconductor Device Technology Modeling A method for modeling semiconductor devices based upon a process perturbation to measured modeled ($PM^2$) methodology can be used to develop a physically-based technology model that ultimately becomes more and more accurate as more and more process perturbation experiments are performed. As shown in FIG. 19, various parameters, such as device scaling, bias dependence, temperature dependence, layout dependence and process dependence can be modeled using this technique to analyze measurements taken for any imaginable set of process perturbations. The more measurements that are taken, the semi-physical model becomes more and more "corrected". For example, by performing more $PM^2$ experiments in which the gate length of high electron mobility transistor (HEMT) samples are varied to much longer lengths than originally studied, the models for velocity saturation and effective gate source charge control length can be refined to provide more accurate results for longer gate lengths. Also, by performing temperature dependent measurements the temperature dependence on the material parameters is able to be refined to better fit the modeled to the measured results.

An important part of the $PM^2$ modeling methodology is a measured-to-model microscope (i.e. S-parameter microscope) which is able to look into the "guts" of a semiconductor device. With this capability a relatively comprehensive physically-based model for the entire device technology can be developed.

The perturbation method is discussed below in connection with FIGS. 19–24. An important aspect of the perturbation method is a measured-to-model microscope (S-parameter microscope) as discussed below in connection with FIGS. 25–39. The measured-to-model microscope may utilize a filter in order to remove the contribution of device layout parasitics to the modeled electrical characteristics. This may be done to accomplish clear representations of the internal physical operation for the measured device. One embodiment of such a filter for P-FET layouts is discussed in connection with FIGS. 40–58. The exemplary measured-to-model microscope, also called an S-parameter microscope, utilizes an extraction algorithm for extracting modeled parameters as generally discussed in connection with FIGS. 59–64.

The following example illustrates the use of the $PM^2$ modeling concept to create a complete, physically-based model for the source resistance of a HEMT device. The $PM^2$ experiment is used to determine the physical model characteristics are as follows:

1) Characterize standard HEMT samples
   A) Use standard fabrication process to produce HEMT samples that are embedded within a standard device layout.
   B) Collect information regarding the physical dimensions of the source-access region by way of a scanning electron microscope (SEM).
   C) Test the sample devices using S-parameter microscopy to establish physically representative equivalent models.

2) Characterize the standard HEMT samples with device layout experiments
   A) Use standard fabrication process to produce HEMT samples that have device layout experiments that vary the physical dimensions of the source access region, for example, gate source spacing etc.
   B) Collect information regarding the physical dimensions of the source access region by way of SEM.
   C) Test the sample devices with S-parameter microscopy to establish physically representative equivalent models.

3) Characterize the HEMT samples with a thin GaAs "cap"
   A) Use standard fabrication process to produce thin cap HEMT samples embedded within the standard device layout.
   B) Collect information regarding the physical dimensions of the source access region by way of a SEM.
   C) Test using S-parameter microscopy to establish physically representative equivalent models.

Figure 21A:
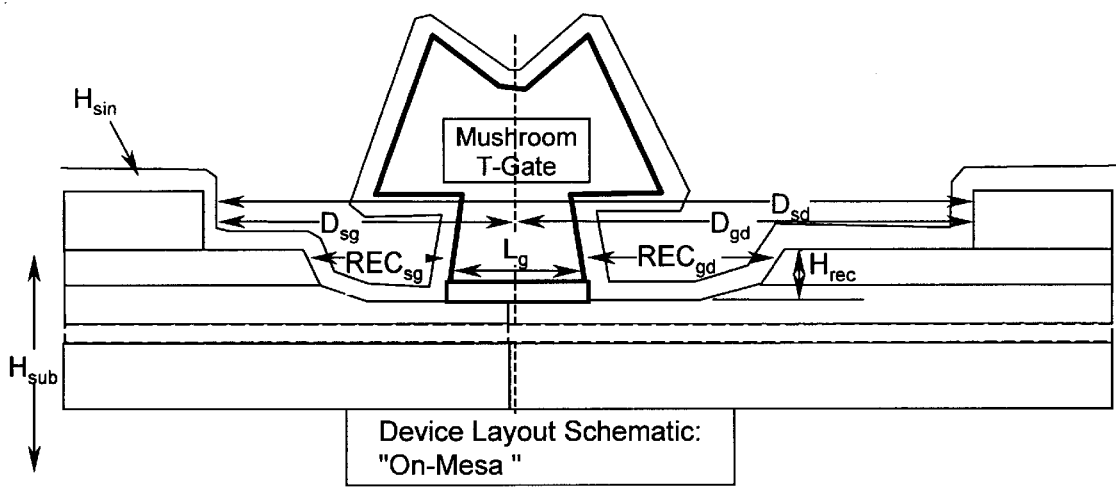
FIG. 21A is a schematic cross-sectional diagram of a standard HEMT used in the $PM^2$ experiment.
Figure 21B:
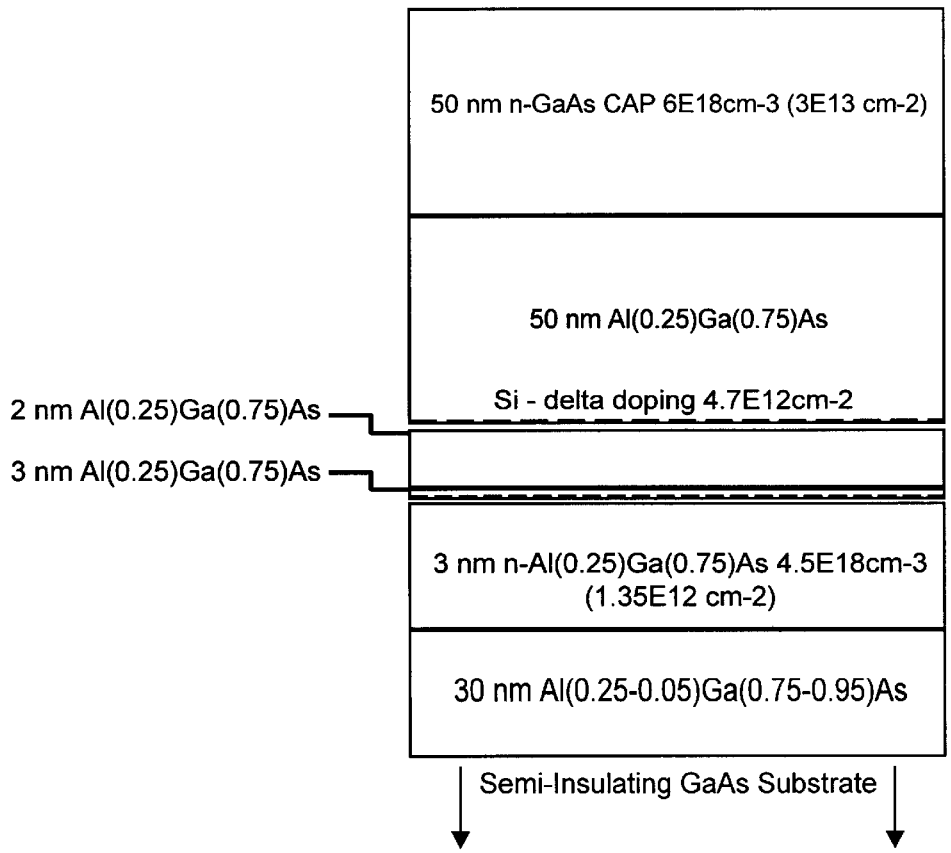
FIG. 21B is a cross-sectional diagram illustrating the epistack for the exemplary HEMT device used to demonstrate the model.
Figure 22:
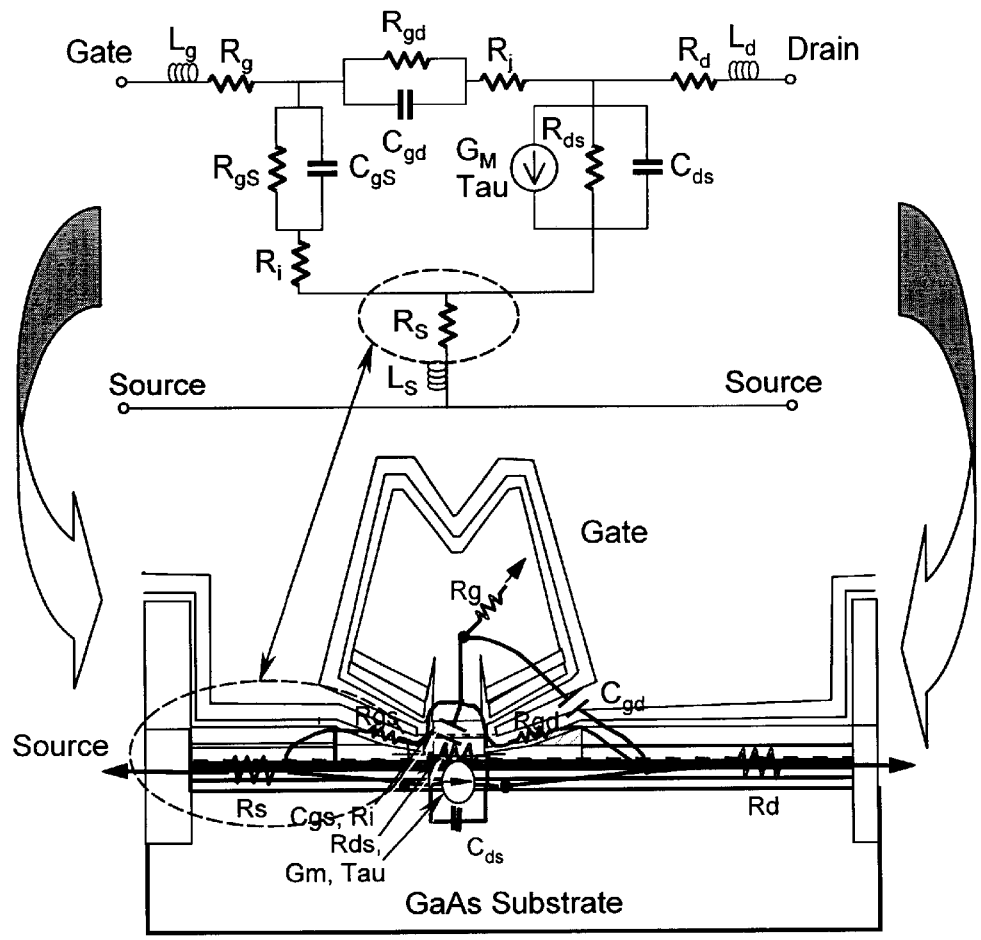
FIG. 22 is schematic diagram illustrating the correspondence of the small signal equivalent circuit components to the detail of the device physical structure.
Figure 51A:
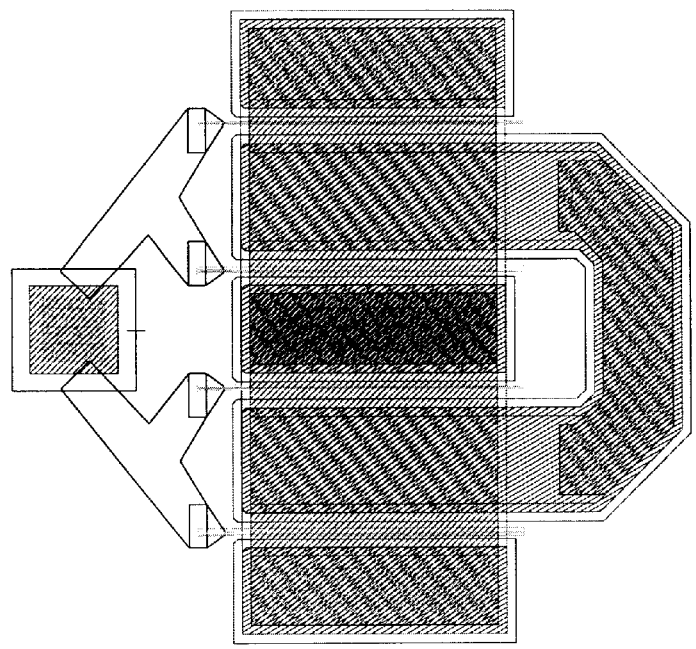
FIG. 51A is an exemplary device layout of a π-FET with four gate fingers.

A cross-sectional diagram of the HEMT sample used in the example is illustrated in FIG. 21A. A diagram of a standard device for a standard Pi-FET example layout is shown in FIG. 51A. A cross-sectional diagram of the material epi-stack present in the HEMT is shown in FIG. 7B. For the third part of the $PM^2$ experiment above, the GaAs cap is thinned down to 7.5 nm instead of the standard thickness of 50 nm keeping the same doping density.

After a sample wafer is fabricated for the standard HEMT sample, Scanning Electron Microscopy (SEM) is used to determine the dimensions of the critical structural components. The measured and intended structural dimensions are identified in Table 8 below, where measured refers to SEM determined dimension and standard indicates the normal or intended specification. Each of the dimensions listed in Table 8 are correlated to the cross-sectional diagram illustrated in FIG. 21A.

TABLE 8

SEM Measured and Intended Structural Dimension for a "Standard" HEMT Device Sample

| | units | Measured | Standard |
| --- | --- | --- | --- |
| Lg | [μm] | 0.15 | 0.15 |
| Dsg | [μm] | 0.78 | 0.8 |
| Dsd | [μm] | 1.935 | 2 |
| Lg + RECsg + RECgd | [μm] | 0.56 | 0.52 |

Figure 27:
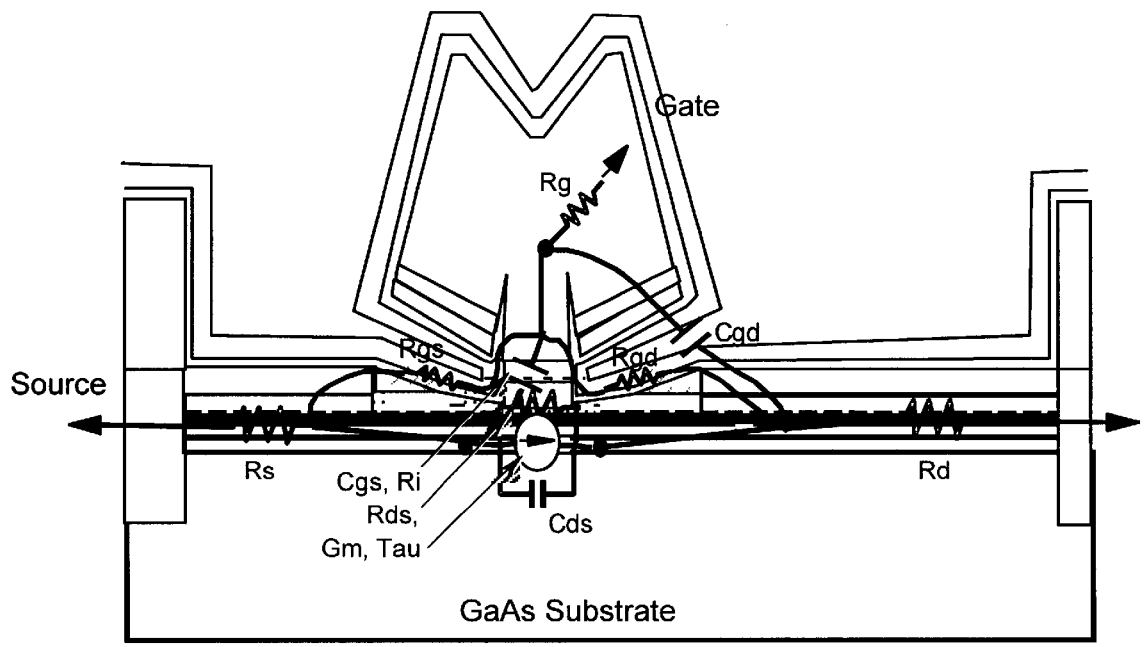
FIG. 27 is similar to FIG. 25 but illustrates the approximate locations of the model elements in the HEMT FET device illustrated is FIG. 25.
Figure 28:
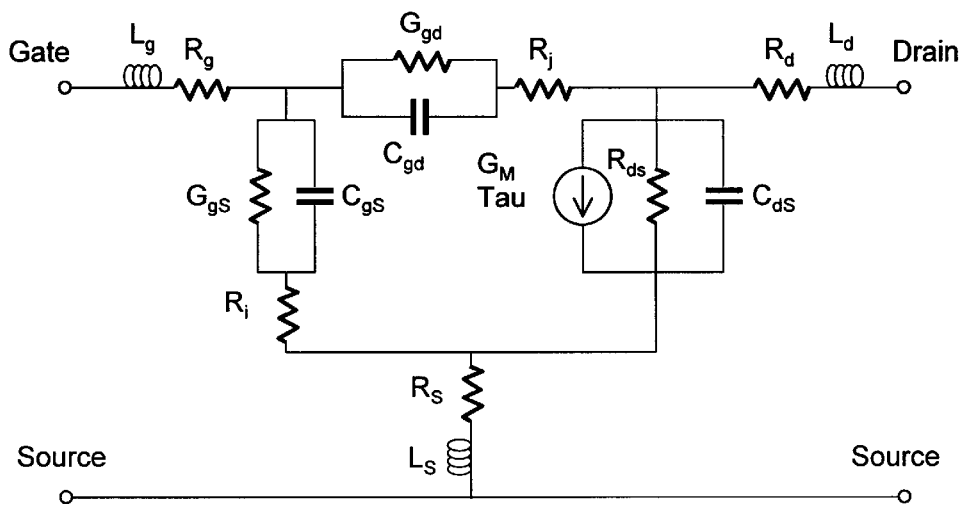
FIG. 28 is a schematic diagram of a common source FET equivalent circuit model.
Figure 29:
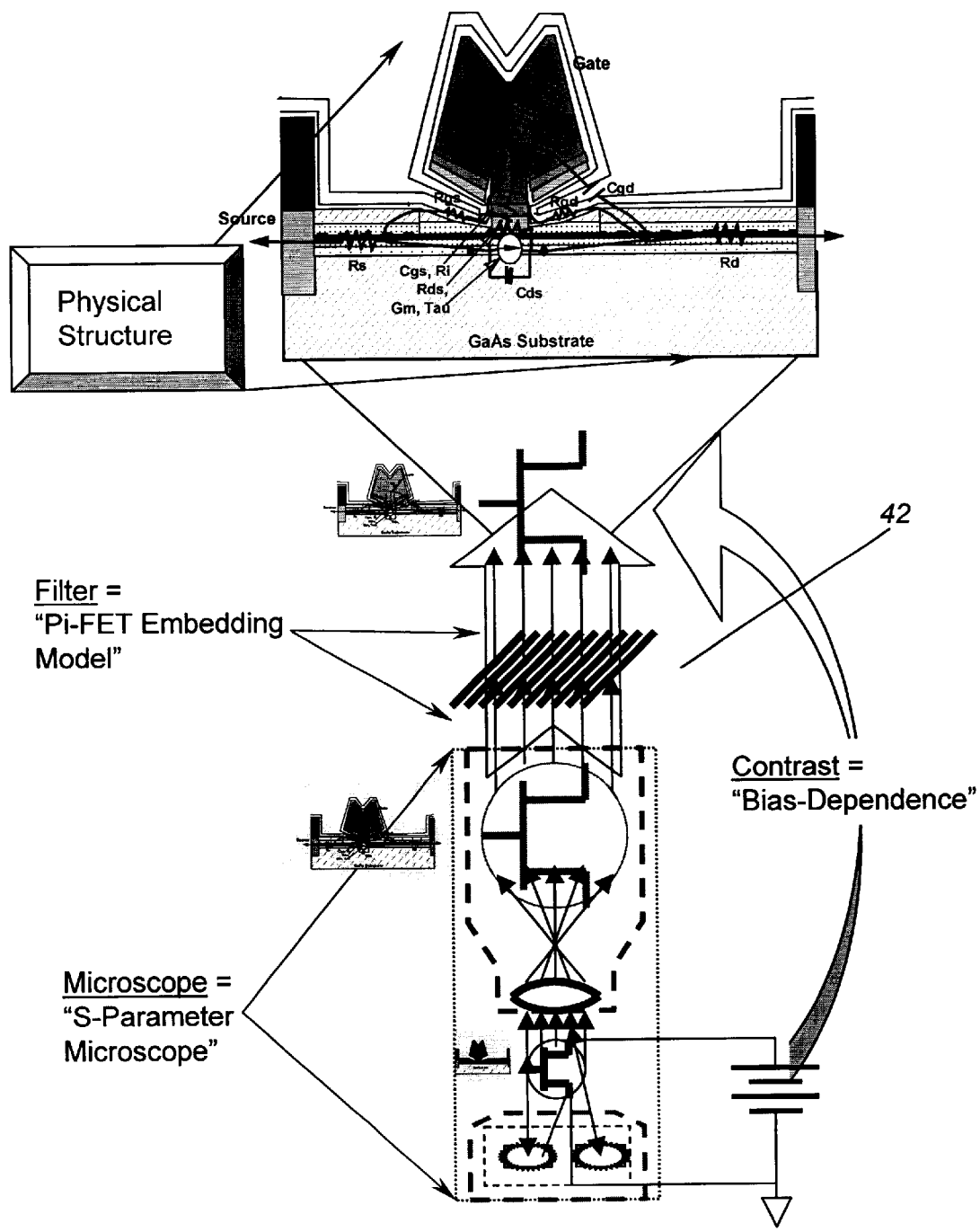
FIG. 29 is an illustration of specific application of the S-parameter microscope illustrated in FIG. 25.

Next, S-parameter microscopy as described below and in connection with FIGS. 25–64 is used to determine physically representative, model representations of the source access resistance. The exemplary Pi-FET may be modeled and used as a filter in the S-parameter microscopy as generally described. This is accomplished by measuring the S-parameters of the sample devices up to 40 GHz and subsequently extracting equivalent small signal circuit models as discussed in detail below in connection with S-parameter microscopy. The small signal equivalent circuit model serves as an electrical representation of the physical structure of the measured device and can be used to roughly sketch the details of its internal structure. The correspondence between equivalent circuit elements and structural items within the device are shown in FIG. 28 below. The relationship of the quantity "Rs" and the source access region is shown.

Figure 36:
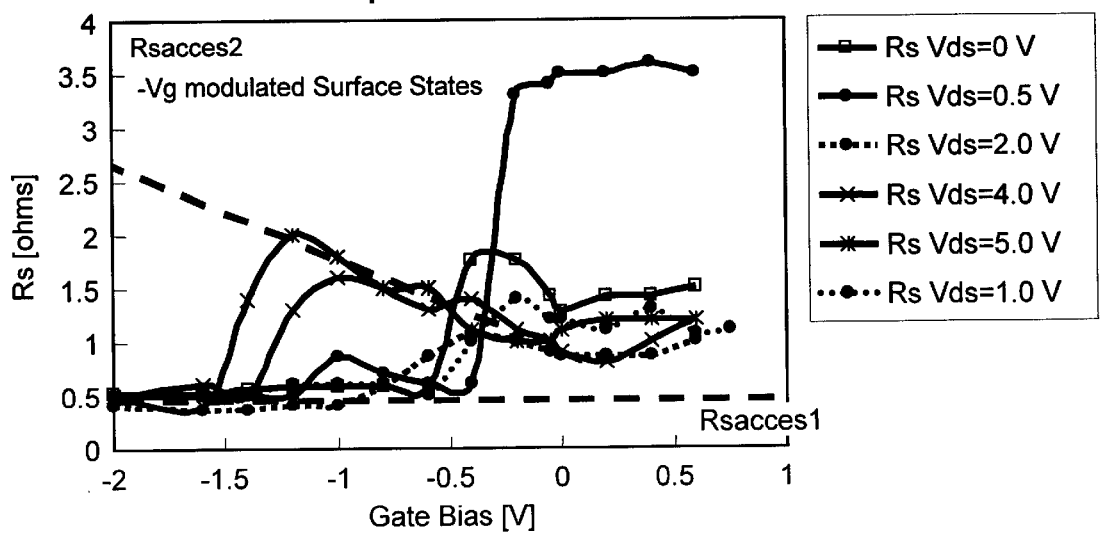
FIG. 36 is a graphical illustration of a charge control map of the charge and electric field distribution in the on mesa source access region shown with $R_s$ as a function bias in accordance with the present invention.

The results of the S-parameter microscopy measurements are shown in FIG. 36 which plot the bias dependent characteristics of the source resistance Rs. From these bias dependent characteristics, a preliminary physical model which fits the measured data can be constructed.

Figure 23:
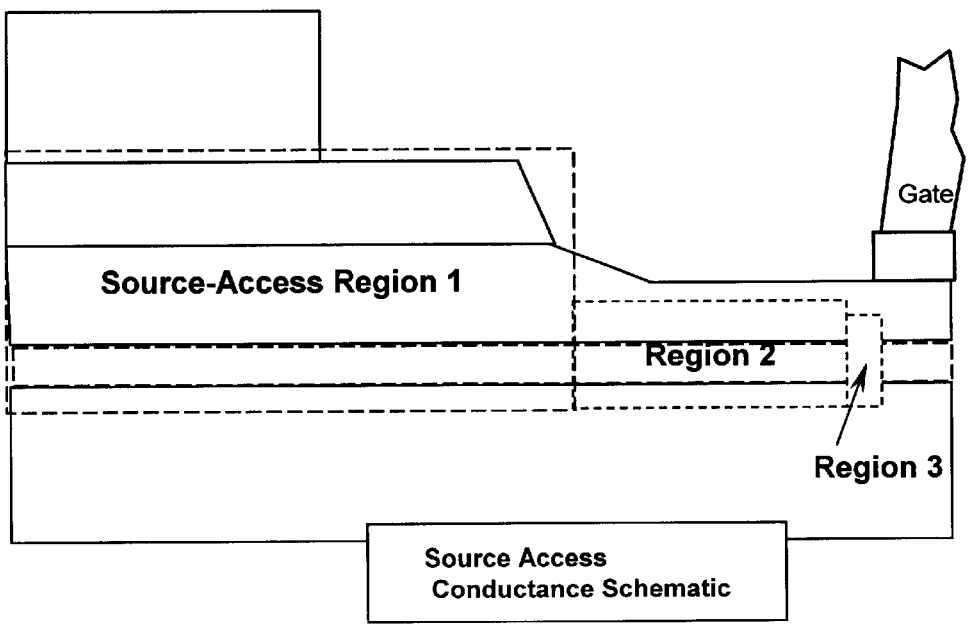
FIG. 23 is a schematic diagram of the source access conductance of the HEMT.

Three physical effects were found to contribute to the overall behavior of the measured source resistance: resistance of the access region before the region; resistance within the source access recess; and a boundary resistance caused by sudden change in sheet carrier concentration between the source access and the channel directly under the gate. These phenomena and their physical locations within the source access recess are illustrated in FIG. 23, where the regions 1, 2 and 3 correspond to each of the effects discussed above.

From these observations, a form of semi-physical model describing bias-dependent characteristics of Rs in a HEMT device can be established as set forth in the equations below.

$$R_S \ [\Omega] = (R_{SundepCap} + R_{SAccess} + R_{SBoundary})/W_g = R_{cont}/RF_{rconF} +$$

$$R_{SundepCap} \ [\Omega * \mu m] \ R_{SH}[D_{sg} - (REC_{sg} + L_g/2)]$$

In part two of the $PM^2$ experiment, the HEMT device samples are fabricated and tested and the length of the source access region is intentionally varied. After the samples are fabricated, the intended dimensions are verified through SEM. S-parameter microscopy is also used to extract the source resistance for comparison. The experimental source gate dimensions along with the extracted source resistance at a bias point of Vds=1.0, Vgs =0.01 are provided in Table 9 below.

TABLE 9

Extracted Source Resistance vs. Source-Gate Distance

| | Dsg [μm] | Rs [Ω] |
|---|---|---|
| | 0.4 | 1 |
| | 0.8 | 1.2 |
| | 1 | 1.3 |
| | 1.2 | 1.45 |
| Measured Sheet Res: | 109.1 | Ω/sq |
| Extracted Sheet Res: | 110 | Ω/sq |

The data in Table 9 is used to confirm the preliminary semi-physical model for Region 1's source-access resistance (Rsundep Cap) illustrated above. This confirmation can be verified by comparing the extracted sheet resistance (Rsh) by S-parameter microscopy and the $PM^2$ experiments against sheet resistance extracted by an independent Van der Pauw measurements. "Modem GaAs Processing Methods" by Ralph Williams, Artech House, Norwood, Mass. 1990. Even though the experiment may be conducted using HEMT devices with a different material or epi stack, the experiment illustrates the validation of a semi-physical model form for Region 1 resistance. Also the terms RECsg and Lg may be assumed to be roughly constant for all of the Dsg test samples. In the final part of the $PM^2$ experiment, the full form of the semi-physical source resistance model is validated. Based on the full bias dependent measurement of the part 1, the complete semi-physical model expression source resistance as a function of gate and drain bias can be represented in the equations below:

$$R_S \ [\Omega] = (R_{SundepCap} + R_{SAccess} + R_{SBoundary})/W_g$$
$$= R_{cont}/RF_{rconF} +$$

$$R_{SundepCap} \ [\Omega^*\mu m] \ R_{SH}[D_{sg}-(REC_{sg}L_g/2)]$$
$$= R_{SdepRec}^{ON} * MRs*\tanh\{[KC_{fK}*$$
$$(V_{gs}-VC_{fOn}+V_{ds}*MC_{fL})]+1\}/2*$$
$$\{V_{gs}/2*[1-\tanh( KR_{sK}(V_{gs}-VR_{sOn}))]\}*$$
$$\{\tanh [KR_{sSat} (V_{ds}-VR_{sKnee})]+1\}/2 +R_{SundepRec},$$

$$R_{SAccess} \ [\Omega^*\mu m] \ \{\tanh[KR_{sK} (V_{gs}-VR_{sOn})]+1\}/2$$
$$= R_{SdepRec}^{ON} * MR_s* \tanh \{[KR_{sK}*V_{gs} + KR_{sL}*$$
$$V_{ds} +VR_{sOff}] + 1\}/2* \{(1+V_{ds}MR_{sL})*MR_{sK}*[1$$
$$\tanh(KR_{sSat}(V_{ds}-VR_{sKnee}))]/ [2*(1 + [V_{gs}/((1$$

$$R_{SBoundary} \ [\Omega^*\mu m] \ +V_{ds}MR_{sL})*MR_{sK})]^{yRs})^{(1/yRs)}]\}$$

Figure 24A:
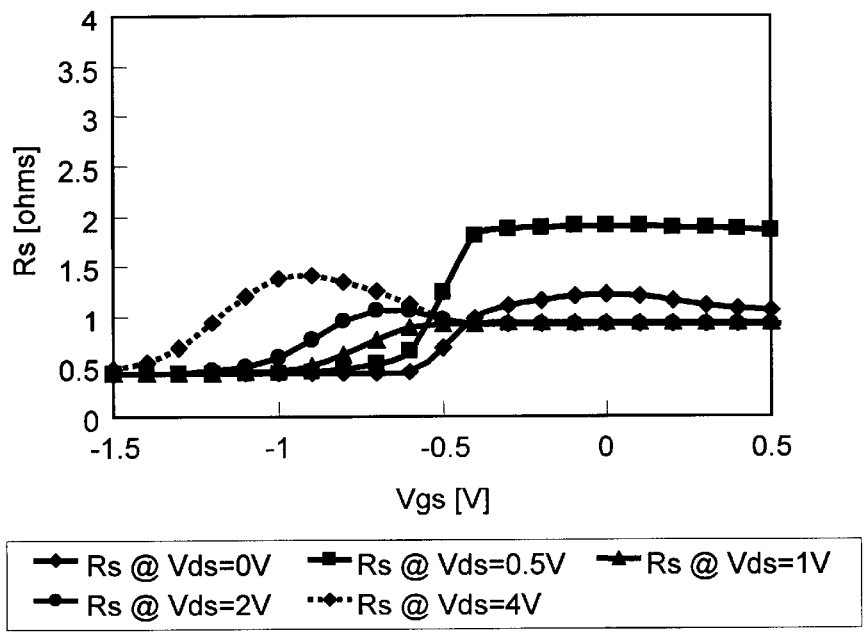
FIG. 24A is a graphical illustration of a source resistance $R_s$ as a function of the biasing voltage $V_{gs}$ for different drain-to-source voltages $V_{ds}$.
Figure 24B:
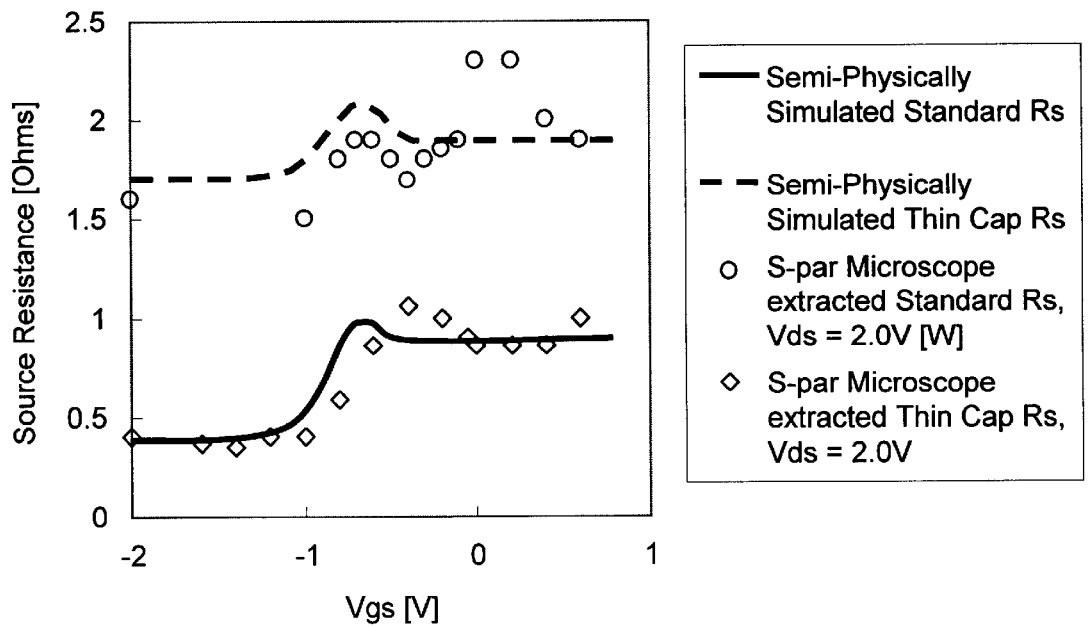
FIG. 24B is a graphical illustration of the source resistance $R_s$ as a function of the gate-to-source voltage illustrating the measured vs. semi-physically modeled approaches.

The simulated result for the sample fabricated in part 1 of the $PM_2$ experiments is shown in FIG. 24A. Comparing FIG. 24A with FIG. 36 indicates that the semi-physical model adequately replicates the measured results. The result of the experiment is shown below in FIG. 24B. As expected the bias dependent source resistance of the thin "cap" sample has the same form, only offset higher by an amount that corresponds to the change in Rsh in Region 1 of the source access.

S-Parameter Microscopy

The S-parameter Microscopy (SPM) method utilizes bias dependent S-parameter measurements as a form of microscopy to provide qualitative analysis of the internal charge and electrical field structure of the semiconductor device heretofore unknown. Pseudo images are gathered in the form of S-parameter measurements extracted as small signal models to form charge control maps. Although finite element device simulations have heretofore been used to calculate the internal charge/electric field of semiconductor devices, such methods are known to be relatively inaccurate. The S-parameter microscopy provides a relatively accurate method for determining the internal charge and electric field within a semiconductor device. With accurate modeling of the internal charge and electric field, all of the external electrical characteristics of the semiconductor devices can be relatively accurately modeled including its high frequency performance. Thus, the system is suitable for making device technology models that enable high frequency MMIC yield analysis forecasting and design for manufacturing analysis.

S-parameter microscopy is similar to other microscopy techniques in that SPM utilizes measurements of energy reflected to and from a sample to derive information. More particularly, SPM is based on transmitted and reflective microwave and millimeter wave electromagnetic power or S-parameters. As such, S-parameter microscopy is analogous to the combined operation of scanning and transmission electron microscopes (SEM and TEM). Scattered RF energy is analogous to the reflection and transmission of the electron beams in the SEM and TEMs. However, instead of using electron detectors as in the SEM and TEMs, reflectometers in a network analyzer are used in S-parameter microscopy to measure a signal. S-parameter microscopy is similar to other microscopy techniques in that both utilize; measurement of scattering phenomenon as data; include mechanisms to focus measurements for better resolution; and include mechanisms to contrast portions of the measurement to discriminate detail as shown in Table 10 below:

TABLE 10

| General Microscopes | S-Parameter Microscope |
| --- | --- |
| Measure of scattered energy | Measures S-Parameters |
| Mechanism for "focus" | Focuses by extraction of <u>Unique</u> equivalent circuit models |
| Mechanism for "contrast" | Contrasts by using bias dependence to finely discriminate the nature and location of charge/electric fields |

RESULT: Detailed "images" of device's internal charge and electric field structure.

Images as discussed herein, in connection with S-parameter microscopy do not relate to real images, but are used provide insight and qualitative detail regarding the internal operation of a device. More specifically, S-parameter microscopy does not provide visual images as in the case of traditional forms of microscopy. Rather, S-parameter microscopy images are more like maps which are computed and based on a non-intuitive set of measurements.

Figure 25:
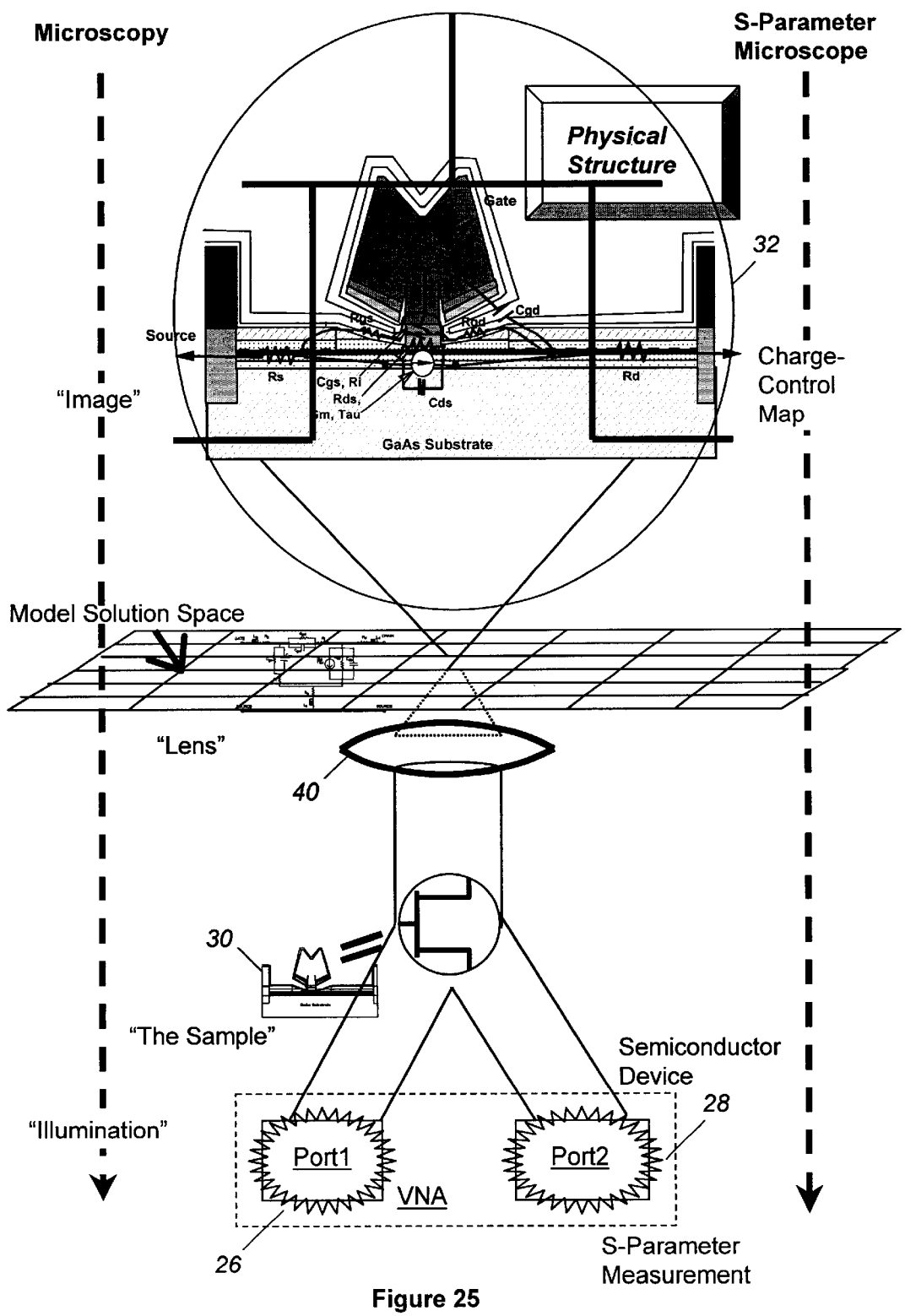
FIG. 25 represents an exemplary S-parameter microscope in accordance with the present invention.
Figure 26:
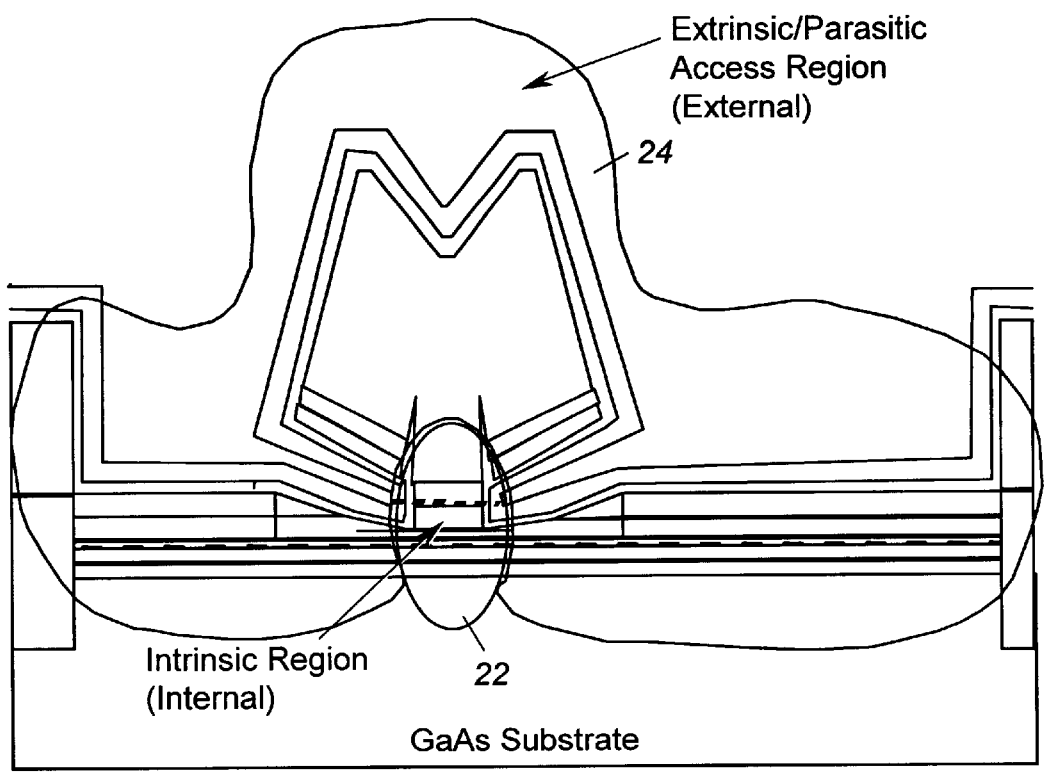
FIG. 26 illustrates the internal and external regions of an exemplary HEMT device.

FIG. 25 illustrates a conceptual representation of an S-parameter microscope generally identified with the reference numeral 20. The S-parameter microscope 20 is analogous to a microscope which combines the principles of SEM and TEM. Whereas SEM measures reflections and TEM measures transmissions, the 2-port S-parameter microscope 20 measures both reflective and transmitted power. As a result, data derived from the 2-port S-parameter microscope contains information about the intrinsic and extrinsic charge structure of a device. More particularly, as in known in the art, SEM provides relatively detailed images of the surface of a sample through reflected electrons while TEM provides images of the internal structure through transmitted electrons. The reflective signals are used to form the external details of a sample while transmitted electrons provide information about the interior structure of a device. In accordance with an important aspect of the invention, S-parameter microscopy utilizes a process of measuring reflective and transmitted signals to provide similar "images" of the charge structure of a semiconductor device. As used herein the internal and external electrical structure of a semiconductor device are commonly referred to as intrinsic device region and 22 and extrinsic parasitic access region 24 as shown in FIG. 26. Also contributing to the external electrical structure of the device are parasitic components associated with its electrodes and interconnects, which are not shown. These are "layout parasitics" the so-called device or its so-called internal electrical structure.

Referring to FIG. 25, the ports 26 and 28 are emulated by S-parameter measurements. The S-parameter measurements for a specific semiconductor device, generally identified with the reference number 30, are processed in accordance with the present invention to provide charge control maps, shown within the circle 32, analogous to images in other microscopy techniques. These charge control maps 32, as will be discussed in more detail below, are expressed in the form of equivalent circuit models. As shown in FIG. 27, the linear circuit elements may be used in the models to represent the magnitude and state of charge/electric fields inside the semiconductor device 30. The position of the circuit elements within the model topology is roughly approximate the physical location within the device structure, hence the charge control map represents a diagram of the device's internal electrical structure.

The interpretation of the exact location of measured charge/electric fields within the semiconductor device is known to be ambiguous since an equivalent circuit model, for example, as illustrated in FIG. 28 with discrete linear elements, is used to represent the distributed structure of the charge/electric fields in the actual device. Although there is no exact method for distinguishing the physical boundaries between measured quantities, bias dependence is used to clarify how the S-parameters should be discriminated, separated and contrasted. In particular, changing bias conditions is known to change the magnitude and shift boundaries between the charge and electric fields within the device. The changes are normally predictable and qualitatively well known in most technologies. As such, the charge control maps can readily be used as maps illustrating the characterization of physical changes in magnitude, location and separation of electric charge and electric fields.

Figure 30:
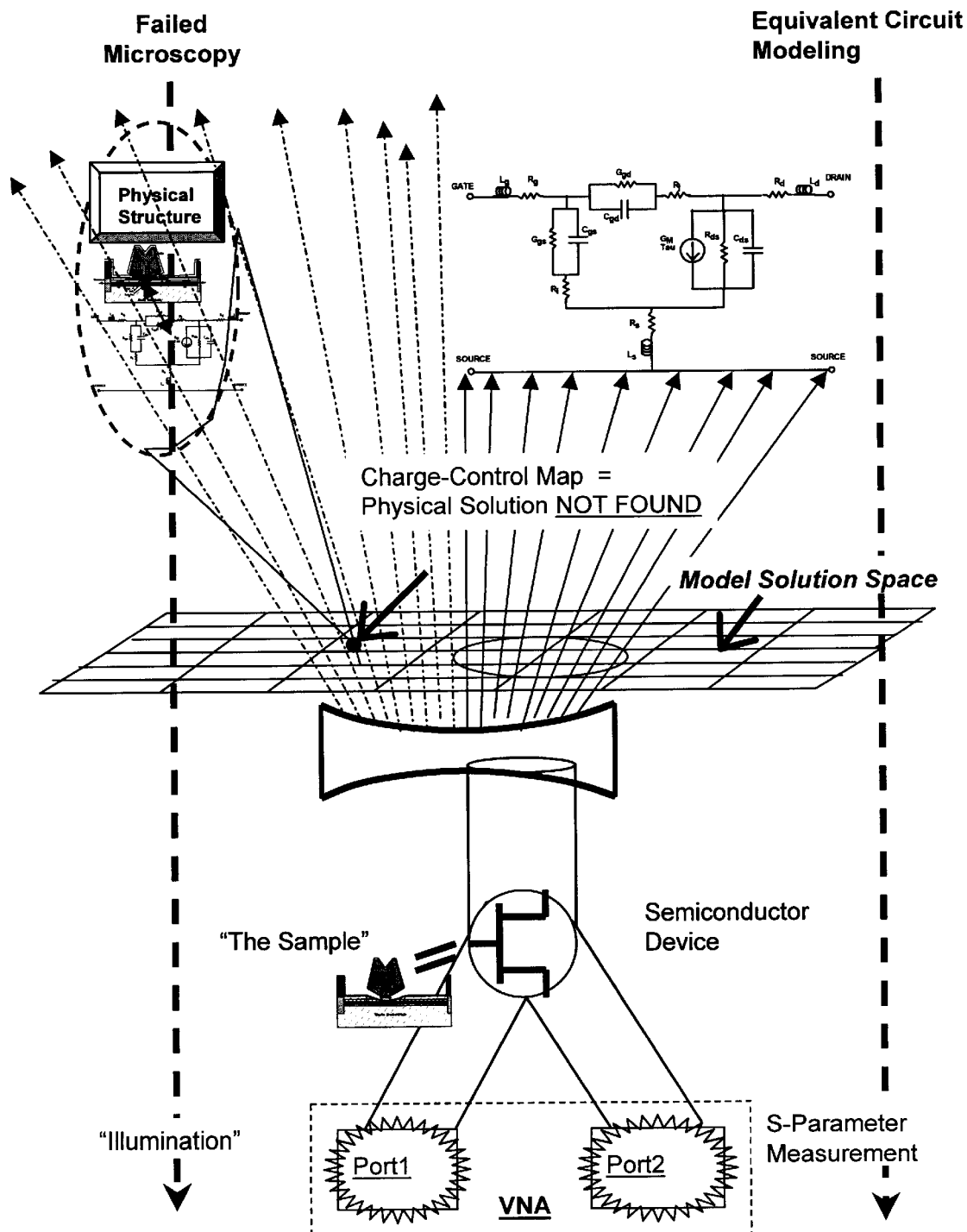
FIG. 30 is similar to FIG. 25 which demonstrates the inability of known systems to accurately predict the internal charge and electrical field structure of a semiconductor device.

Analogous to other forms of microscopy, the S-parameter microscope 20 emulates a lens, identified with the reference numeral 40 (FIG. 25). The lens 40 is simulated by a method for the extraction of a unique equivalent circuit model that also accurately simulates the measured S-parameter. More particularly, parameter extraction methods for equivalent circuit models that simulate S-parameters are relatively well known. However, when the only goal is accurately fitting measuring S-parameters, an infinite number of solutions exist for possible equivalent circuit parameter values. Thus, in accordance with an important aspect of the present invention, only a single unique solution is extracted which accurately describes the physical charge control map of the device. This method for unique extraction of equivalent circuit model parameters acts as a lens to focus the charge control map solution. As discussed and illustrated herein, the lens 40 is subsequently simulated by a filter that is based on an apparent layout parasitic embedding model. As discussed below, the layout parasitic embedding model consists of linear elements which simulate the effect of the device's electrodes and interconnects upon its external electrical characteristics. A Pi FET embedding model 42, is described below. This model effectively acts as a filter to remove the electrical structure of the extrinsic parasitic access contribution to the preliminary charge control map solution. The resultant filtered charge control map solution represents a clearer "image" which shows only the electrical structure of the intrinsic device. This enhanced imaging is needed in order to achieve as accurate a view of the internal electric charge/field as possible. Unlike conventional extraction techniques as illustrated in FIG. 30, which can only extract non-unique equivalent circuit models and not the unique charge control map, the S-parameter microscope 20 is able to relatively accurately model the internal electric charge/field structure within a semiconductor device.

Figure 31:
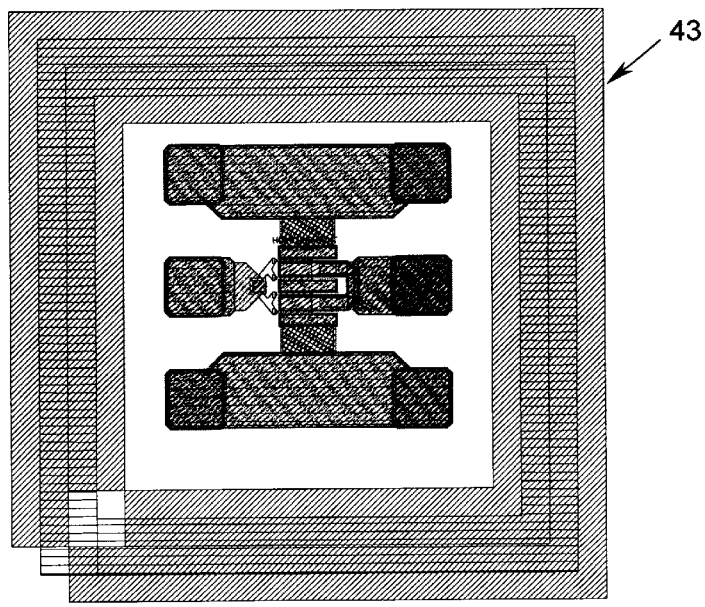
FIG. 31 is a plan view of a four-fingered, 200 $\mu$m GaAs HEMT device.

An exemplary application of the S-parameter microscope is illustrated in detail below. In this example, an exemplary GaAs HEMT device with four gate fingers and 200 µm total gate periphery formed in a Pi-FET layout as generally illustrated in FIG. 31 and identified with the reference numeral 43, is used. The GaAs HEMT 43 is adapted to be embedded in a 100 μm pitch coplanar test structure to facilitate on water S-parameter measurement.

Figure 32:
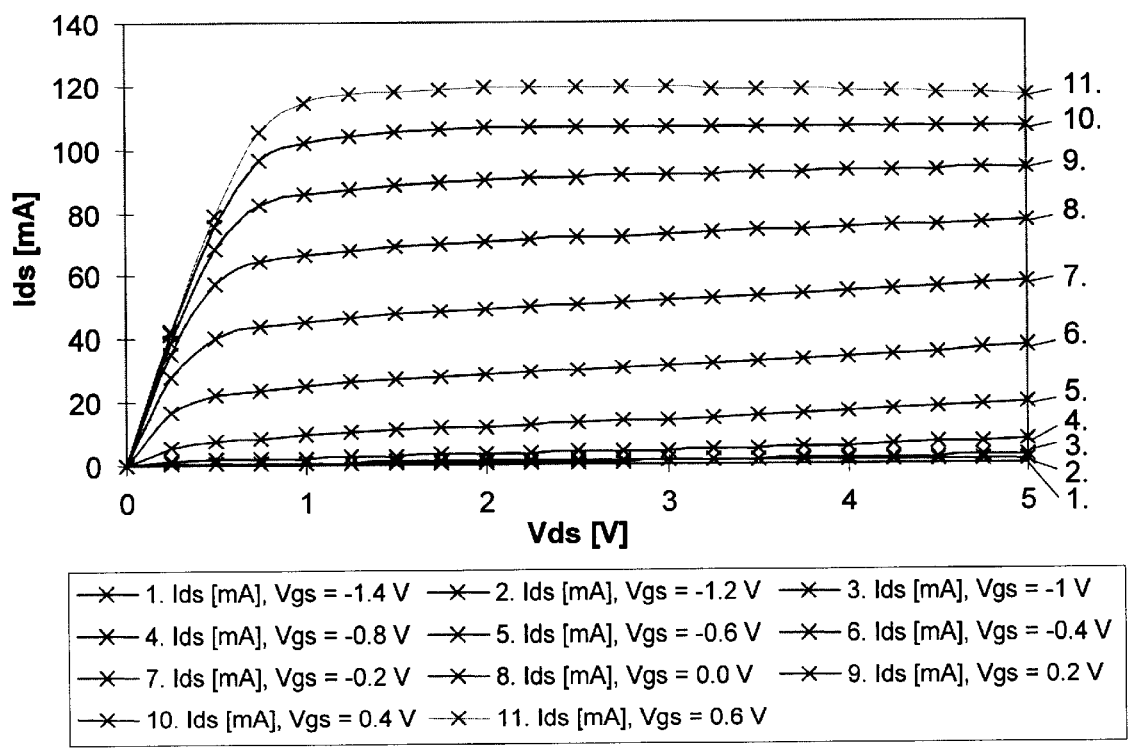
FIG. 32 is a graphical illustration illustrating the measured drain-to-source current $I_{ds}$ as a function of drain-to-source voltage Vds for the sample FET device illustrated in FIG. 31.
Figure 33:
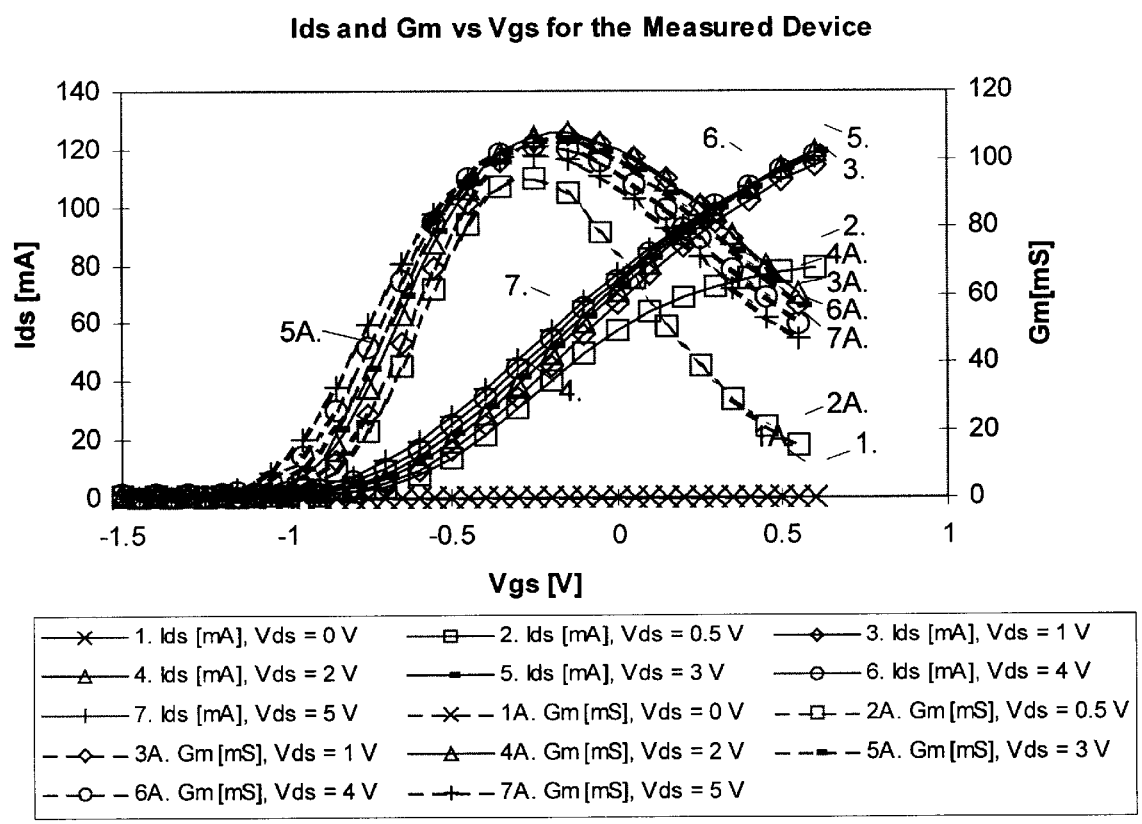
FIG. 33 is a graphical illustration illustrating the drain-to-source current $I_{ds}$ and transconductance $G_m$ as a function of the gate-to-source voltage $V_{gs}$ of the sample FET device illustrated in FIG. 31.

Initially, as illustrated in FIGS. 32 and 33, the I–V characteristics for the device are measured. In particular, the drain source current Ids is plotted as a function of drain-to-source voltage Vds at various gate voltages Vgs as shown in FIG. 32. and FIG. 33 illustrates the drain-to-source current Ids as a function of gate voltage Vgs and transconductance Gm (i.e. the derivative of Ids with respect to Vgs) at different drain voltages Vds. These I–V characteristics are typical of HEMT devices, which are one type of three-terminal semiconductor device technology.

Figure 34:
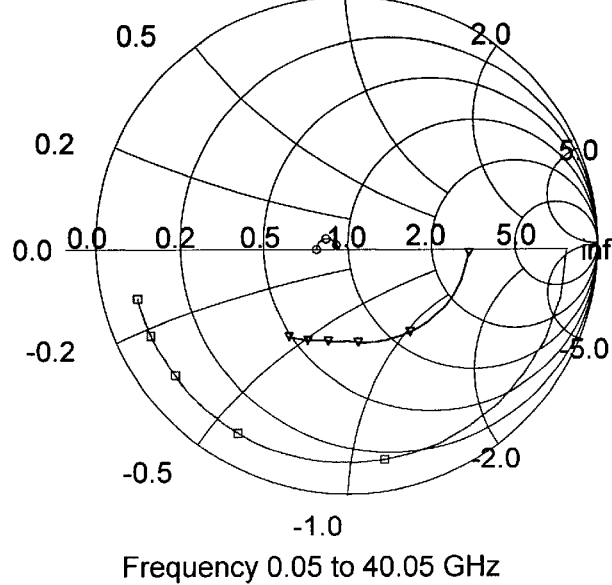
FIG. 34 is a Smith chart illustrating the measured S11, S12 and S22 parameters from frequencies of 0.05 to 40.0 GHZ for the FET device illustrated in FIG. 31.
Figure 35:
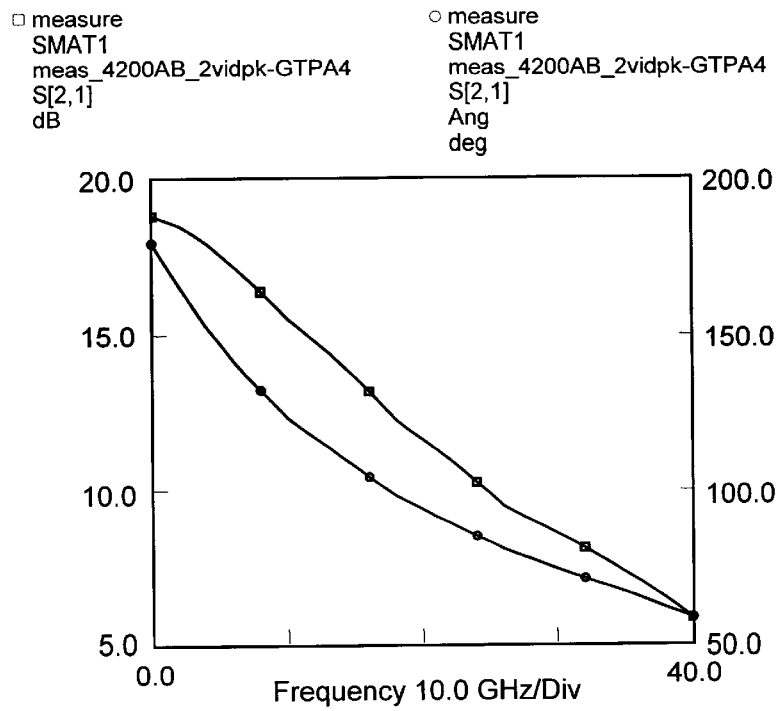
FIG. 35 is a graphical illustration of the magnitude as a function of angle for the S21 S-parameter for frequencies of 0.05 to 40 GHz for the exemplary FET illustrated in FIG. 31.

Table 11 shows the bias conditions in which S-parameters were measured. The S-parameters were measured from 0.05 to 40 GHz at each bias condition. FIG. 34 illustrates a Smith chart illustrating the measured S-parameters S11, S12 and S22 for frequencies from 0.05 to 40.0 GHz. FIG. 35 is a graphical illustration of magnitude as a function of angles for the measured S-parameter S21 for frequencies from 0.05 to 40.0 GHz.

TABLE 11

| | Measured S-parameter Bias Conditions | | | | | |
|---|---|---|---|---|---|---|
| Biases Vgs | Vds = 0 V | Vds = 0.5 V | Vds = 1.0 V | Vds = 2.0 V | Vds = 4.0 V | Vds = 5.0 V |
| −1.6 V | Yes | Yes | Yes | Yes | Yes | Yes |
| −1.4 V | Yes | Yes | Yes | Yes | Yes | Yes |
| −1.2 V | Yes | Yes | Yes | Yes | Yes | Yes |
| −1 V | Yes | Yes | Yes | Yes | Yes | Yes |
| −0.8 V | Yes | Yes | Yes | Yes | Yes | Yes |
| −0.6 V | Yes | Yes | Yes | Yes | Yes | Yes |
| −0.4 V | Yes | Yes | Yes | Yes | Yes | Yes |
| −0.2 V | Yes | Yes | Yes | Yes | Yes | Yes |
| 0 V | Yes | Yes | Yes | Yes | Yes | Yes |
| 0.2 V | Yes | Yes | Yes | Yes | Yes | Yes |
| 0.4 V | Yes | Yes | Yes | Yes | Yes | Yes |
| 0.6 V | Yes | Yes | Yes | Yes | Yes | Yes |

Using the small signal model illustrated in FIG. 28, the extracted small signal equivalent circuit values are obtained as illustrated in Table 12 for each S-parameter at each bias condition, using the extraction method discussed below.

TABLE 12

Bias-dependent Small-signal Equivalent Circuit Models

| Vd [V] | Vg [V] | Rg + Ri [W] | Rs [W] | Rd [W] | Lg [nH] | Ls [nH] | Ld [nH] | Cgs [pF] | Cdg [pF] | Cds [pF] | Gm [mS] | Rds [W] | Tau [pS] | Rgs [W] | Rgd [W] |
|---|---|---|---|---|---|---|---|---|---|---|---|---|---|---|---|
| 0 | −2 | 4.32849 | 0.51256 | 4.2 | 0.01972 | 0.00001 | 0.02650 | 0.04154 | 0.04154 | 0.04324 | 0 | 10000000 | 0 | 904000000 | 904000000 |
| 0 | −1.6 | 4.11231 | 0.52 | 4 | 0.028 | 0 | 0.0245 | 0.045 | 0.045 | 0.045 | 0 | 10000000 | 0 | 87000 | 87000 |
| 0 | −1.4 | 3.01231 | 0.55 | 3.53898 | 0.02754 | 0.00001 | 0.02343 | 0.05012 | 0.05012 | 0.04674 | 0 | 1000000 | 0 | 70000 | 70000 |
| 0 | −1.2 | 3.97956 | 0.58579 | 3.92313 | 0.02740 | 0.00001 | 0.02455 | 0.05497 | 0.05497 | 0.04674 | 0 | 3532.954 | 0 | 59895.6 | 59895.6 |
| 0 | −1 | 3.67822 | 0.58 | 3.7 | 0.02634 | 0.00123 | 0.0253 | 0.06322 | 0.06322 | 0.047 | 0 | 200 | 0 | 60000 | 60000 |
| 0 | −0.8 | 3.67134 | 0.58 | 3.67134 | 0.02622 | 0.00347 | 0.02597 | 0.08009 | 0.08009 | 0.04883 | 0 | 51.8679 | 0 | 60000 | 60000 |
| 0 | −0.6 | 3.39996 | 0.58579 | 3.50319 | 0.02764 | 0.00353 | 0.02398 | 0.0923 | 0.0923 | 0.15973 | 0 | 7.84388 | 0 | 970000000 | 970000000 |
| 0 | −0.4 | 3.33401 | 1.76777 | 3.3 | 0.02324 | 0.00356 | 0.03387 | 0.10025 | 0.10025 | 0.18057 | 0 | 6.65812 | 0 | 65565.93 | 65565.93 |
| 0 | −0.2 | 3.31632 | 1.76777 | 3.3 | 0.02421 | 0.00347 | 0.03443 | 0.10446 | 0.10446 | 0.42106 | 0 | 4.75859 | 0 | 58682.78 | 58682.78 |
| 0 | 0 | 3.09963 | 1.41421 | 3.5 | 0.01566 | 0.00334 | 0.03144 | 0.10768 | 0.10768 | 0.45837 | 0 | 3.49009 | 0 | 55000 | 55000 |
| 0 | 0.2 | 3.16448 | 1.28033 | 3.30807 | 0.02664 | 0.00384 | 0.02818 | 0.11001 | 0.11001 | 1.40002 | 0 | 1.40002 | 0 | 16926.72 | 16926.72 |
| 0 | 0.6 | 2.45244 | 1.41421 | 2.61956 | 0.02664 | 0.00352 | 0.02845 | 0.12479 | 0.12479 | 1.67455 | 0 | 1.25101 | 0 | 3811.933 | 3811.933 |
| 0 | 0.6 | 2.48828 | 1.5 | 2.3 | 0.01881 | 0.00320 | 0.03089 | 0.14170 | 0.14170 | 2.02902 | 0 | 2.94325 | 0 | 478.3791 | 478.3791 |
| 0 | 0.755 | 4.31968 | 0.5 | 4 | 0.03374 | 0.0 | 0.01699 | 0.04725 | 0.03892 | 0.04621 | 0.22384 | 1.02E+08 | 0.12638 | 100403 | 8.10E+07 |
| 0.5 | −1.6 | 4.80961 | 0.5 | 3.53898 | 0.02817 | 0.0 | 0.02476 | 0.05172 | 0.03907 | 0.04440 | 0.5 | 10000000 | 0 |  |  |
| 0.5 | −1.4 | 4.24223 | 0.5 | 3.92313 | 0.02913 | 0.00030 | 0.02260 | 0.05921 | 0.03981 | 0.04616 | 0.73202 | 1.08E+08 | 0.67233 | 24714.05 | 9.23E+07 |
| 0.5 | −1.2 | 3.91986 | 0.85355 | 3.7 | 0.02881 | 0.00354 | 0.02758 | 0.07264 | 0.03983 | 0.04586 | 5.67280 | 7.00E+02 | 0.24830 | 9.90E+07 | 9.80E+07 |
| 0.5 | −1 | 3.25620 | 0.7 | 3.67134 | 0.02841 | 0.00319 | 0.02461 | 0.09074 | 0.04253 | 0.04625 | 28.00607 | 254.802 | 0.26110 | 69641.32 | 69641.32 |
| 0.5 | −0.8 | 3.22405 | 0.6 | 3.50319 | 0.02953 | 0.00325 | 0.02583 | 0.10155 | 0.04589 | 0.04748 | 73.80795 | 84.25923 | 0.16328 | 16066.22 | 6.36E+07 |
| 0.5 | −0.6 | 2.78789 | 0.6 | 3.3 | 0.03058 | 0.00337 | 0.02529 | 0.10933 | 0.05957 | 0.0669 | 107.5056 | 38.90041 | 0.0001 | 8.77E+07 | 7.84388 |
| 0.5 | −0.4 | 1.71421 | 0.6 | 3.3 | 0.01976 | 0.00343 | 0.02305 | 0.14987 | 0.05706 | 0.35247 | 116 | 9.43176 | 0.03061 | 18440.16 | 9.70E+07 |
| 0.5 | −0.2 | 0.14250 | 3.3 | 3.4 | 0.02067 | 3.78E−09 | 0.02305 | 0.16889 | 0.09085 | 0.5 | 108 | 7 | 150.048 | 1.00E+08 | 1.00E+08 |
| 0.5 | 0 | 2.35907 | 3.4 | 3.4 | 0.01797 | 0.00373 | 0.01532 | 0.21366 | 0.04018 | 1.4 | 100 | 1.45897 | 447.6913 | 9915.727 | 1.00E+08 |
| 0.5 | 0.2 | 1.38026 | 3.5 | 3.30807 | 0.02537 | 0.00563 | 0.02082 | 0.115 | 0.115 | 2 | 85 | 1.2 | 156.7027 | 8630.088 | 9.90E+07 |
| 0.5 | 0.4 | 1.56731 | 3.5 | 3.00269 | 0.03453 | 0.00556 | 0.02100 | 0.219 | 0.115 | 2.1 | 75 | 1.4 | 0.06 | 28918.35 | 9.90E+07 |
| 0.5 | 0.6 | 1.54964 | 3.6 | 2.61956 | 0.03766 | 0.0356 | 0.02748 | 0.04706 | 0.00152 | 0.04717 | 0.03803 | 1.03E+08 | 7354.498 | 10980.53 | 1.02E+08 |
| 1 | −1.6 | 0.04221 | 0.5 | 3.9 | 0.04292 | 0.00001 | 0.01 | 0.04880 | 0.03607 | 0.04857 | 0.08627 | 1.23E+08 | 0.14547 | 71680.16 | 9.70E+07 |
| 1 | −1.4 | 5.37668 | 0.5 | 3.53120 | 0.02639 | 0.0 | 0.01 | 0.06252 | 0.03632 | 0.04551 | 1.39122 | 1.03E+08 | 0.81815 | 42870.63 | 1.00E+08 |
| 1 | −1.2 | 3.73022 | 0.6 | 4.38390 | 0.03139 | 0.00070 | 0.03059 | 0.07956 | 0.03581 | 0.04721 | 8.76451 | 6.96E+07 | 0.24286 | 9.80E+07 | 9.80E+07 |
| 1 | −1 | 2.83050 | 2.6 | 3.7 | 0.02891 | 0.00013 | 0.02741 | 0.10424 | 0.03434 | 0.04472 | 37.04396 | 266.1964 | 0.50008 | 54006.62 | 136132.8 |
| 1 | −0.8 | 3.38450 | 0.6 | 3.35829 | 0.02976 | 0.00373 | 0.02546 | 0.12806 | 0.03365 | 0.04391 | 80.28378 | 132.6002 | 0.39418 | 68255.46 | 136132.8 |
| 1 | −0.6 | 3.00864 | 0.5 | 2.68486 | 0.03200 | 0.00429 | 0.02666 | 0.13702 | 0.02974 | 0.05399 | 104.4479 | 113.1406 | 0.15717 | 139239.2 | 153397.8 |
| 1 | −0.4 | 2.20164 | 1 | 5.24976 | 0.03218 | 0.00355 | 0.02466 | 0.14376 | 0.02568 | 0.06141 | 116 | 94.51954 | 0.08080 | 5067.04 | 153397.8 |
| 1 | −0.2 | 1.77701 | 1.4 | 6.13975 | 0.03204 | 0.00296 | 0.02378 | 0.14735 | 0.02312 | 0.06126 | 108 | 116.7009 | 0.12469 | 82594.56 | 153397.8 |
| 1 | 0 | 2.04598 | 1.2 | 3.76638 | 0.03031 | 0.00341 | 0.02636 | 0.15401 | 0.02295 | 0.06518 | 100 | 97.92344 | 0.26864 | 62352.54 | 159626.4 |
| 1 | 0.2 | 2.25956 | 1.1 | 0.67552 | 0.03023 | 0.00405 | 0.02972 | 0.15538 | 0.02543 | 0.09048 | 82.93733 | 46.7057 | 0.22237 | 62140.25 | 143076.9 |
| 1 | 0.4 | 2.11654 | 1.4 | 1.20729 | 0.02779 | 0.00451 | 0.02767 | 0.15025 | 0.03258 | 0.10476 | 59.0747 | 29.71128 | 0.31347 | 32295.59 | 9.41E+07 |
| 1 | 0.6 | 2.68064 | 1.06066 | 0.53210 | 0.02169 | 0.00522 | 0.02902 | 0.15025 | 0.04746 | 0.10476 | 0.01826 | 3.74E+07 | 4.00134 | 86865.89 | 117257.9 |
| 2 | −1.6 | 4.21832 | 0.36612 | 3.64439 | 0.02558 | 0.00007 | 0.02666 | 0.04902 | 0.03373 | 0.04284 | 0.32106 | 2.26E+08 | 1.55689 | 7.62E+07 | 7.62E+07 |
| 2 | −1.4 | 4.16045 | 0.35355 | 3.78284 | 0.03206 | 0.0 | 0.00986 | 0.05184 | 0.03363 | 0.04633 | 14.66729 | 752.2115 | 0.94909 | 11969.85 | 143076.9 |
| 2 | −1.2 | 3.3 | 0.4 | 3.3 | 0.01991 | 0.00355 | 0.02582 | 0.08850 | 0.03172 | 0.04346 | 36.71951 | 267.6627 | 0.52386 | 9.90E+07 | 10100 |
| 2 | −1 | 3.97082 | 0.4 | 2.95737 | 0.02177 | 0.00351 | 0.02686 | 0.10341 | 0.03367 | 0.04403 | 86.93835 | 150.9714 | 0.56213 | 66897.18 | 14886.4 |
| 2 | −0.8 | 3.43921 | 0.58579 | 3.03263 | 0.02363 | 0.00350 | 0.02706 | 0.15517 | 0.02427 | 0.04545 | 109.7086 | 138.1298 | 0.34675 | 138869 | 138869 |
| 2 | −0.6 | 3.14409 | 0.85355 | 2.82957 | 0.02454 | 0.00343 | 0.02666 | 0.16323 | 0.02155 | 0.05049 | 115.9366 | 144.5568 | 0.24960 | 29720.56 | 154931.8 |
| 2 | −0.4 | 2.61645 | 1.06066 | 4.45931 | 0.02558 | 0.00355 | 0.02524 | 0.15694 | 0.01990 | 0.05282 | 108.1976 | 157.9708 | 0.36024 | 42443.77 | 143076.9 |
| 2 | −0.2 | 2.16237 | 1 | 5.63054 | 0.02558 | 0.00343 | 0.02524 | 0.15357 | 0.01906 | 0.04803 | 108.1976 | 157.9708 | 0.36024 | 42443.77 | 143076.9 |
| 2 | −5.40E | 2.31075 | 0.9 | 5 | 0.02351 | 0.00358 | 0.02701 | 0.15357 | 0.01906 | 0.04803 |  |  |  |  |  |

TABLE 12-continued

Bias-dependent Small-signal Equivalent Circuit Models

| Vd [V] | Vg [V] | Rg + Ri [W] | Rs [W] | Rd [W] | Lg [nH] | Ls [nH] | Ld [nH] | Cgs [pF] | Cdg [pF] | Cds [pF] | Gm [mS] | Rds [W] | Tau [pS] | Rgs [W] | Rgd [W] |
|---|---|---|---|---|---|---|---|---|---|---|---|---|---|---|---|
| 2 | 0 | 2.09877 | 0.85355 | 4.76720 | 0.02557 | 0.00359 | 0.02535 | 0.15291 | 0.01879 | 0.05078 | 109.2821 | 155.8182 | 0.27960 | 19029.68 | 125716.3 |
| 2 | 0.2 | 2.64301 | 0.85355 | 3.23486 | 0.0244 | 0.00356 | 0.02808 | 0.15727 | 0.01802 | 0.04871 | 96.42395 | 163.3582 | 0.27618 | 81117.65 | 1.10E+08 |
| 2 | 0.4 | 3.03424 | 0.85355 | 1.80413 | 0.02341 | 0.00356 | 0.02901 | 0.16401 | 0.01776 | 0.04788 | 79.14169 | 171.8245 | 0.33669 | 95099.01 | 1.05E+08 |
| 2 | 0.6 | 3.45639 | 1 | 0.61175 | 0.02245 | 0.00351 | 0.02800 | 0.17494 | 0.01767 | 0.04798 | 63.09272 | 179.6613 | 0.48062 | 47169.75 | 1.27E+08 |
| 4 | −1.6 | 1 | 0.6 | 3.6 | 0.03900 | 0.00007 | 0.01 | 0.04765 | 0.03174 | 0.04984 | 0.11140 | 8.95E+07 | 5.46641 | 15181.61 | 9.90E+07 |
| 4 | −1.4 | 4.71381 | 0.5 | 3.43796 | 0.02063 | 0.00014 | 0.02710 | 0.05937 | 0.03122 | 0.04303 | 1.41022 | 7171.182 | 1.58538 | 8.02E+07 | 1.24E+08 |
| 4 | −1.2 | 4.42193 | 1.3 | 3.2 | 0.02717 | 0.00002 | 0.00124 | 0.07691 | 0.02927 | 0.05239 | 7.58241 | 1.03E+08 | 1.52589 | 75390.74 | 9.51E+07 |
| 4 | −1 | 4.28211 | 1.6 | 3.1306 | 0.02220 | 0.00226 | 0.02517 | 0.11961 | 0.02672 | 0.04456 | 31.09359 | 417.6118 | 1.08238 | 72214.74 | 102010 |
| 4 | −0.8 | 3.92452 | 1.5 | 3.05507 | 0.02333 | 0.00280 | 0.02668 | 0.16912 | 0.02270 | 0.04603 | 68.77447 | 204.0465 | 0.84927 | 35767.7 | 147412.3 |
| 4 | −0.6 | 3.45589 | 1.3 | 3.81853 | 0.02435 | 0.00303 | 0.02526 | 0.19074 | 0.02048 | 0.04833 | 93.20885 | 171.7183 | 0.71106 | 32817.08 | 148886.4 |
| 4 | −0.4 | 3.15713 | 1.4 | 5.52029 | 0.0254 | 0.00245 | 0.02235 | 0.19523 | 0.01899 | 0.05190 | 109.7362 | 167.8084 | 0.57439 | 8.77E+07 | 150375.2 |
| 4 | −0.2 | 3.03221 | 1.1 | 3.87285 | 0.02483 | 0.00311 | 0.02631 | 0.18804 | 0.01819 | 0.04922 | 108.9203 | 184.4907 | 0.56867 | 31725.31 | 148886.4 |
| 4 | 0 | 2.78474 | 1 | 2.7 | 0.02499 | 0.00425 | 0.02735 | 0.17509 | 0.01774 | 0.04685 | 95.97723 | 207.0277 | 0.59343 | 25879.99 | 150375.2 |
| 4 | 0.2 | 3.24209 | 0.9 | 1.48994 | 0.02404 | 0.00381 | 0.02868 | 0.17879 | 0.01685 | 0.04634 | 83.82214 | 212.1484 | 0.55632 | 8.86E+07 | 153397.8 |
| 4 | 0.4 | 3.99720 | 0.8 | 1.2 | 0.02037 | 0.00414 | 0.02095 | 0.20669 | 0.01786 | 0.06562 | 83.82214 | 151.6078 | 0.55632 | 95099.01 | 105101 |
| 4 | 0.6 | 3.85544 | 1 | 1.12128 | 0.02333 | 0.00299 | 0.02312 | 0.19731 | 0.01611 | 0.04746 | 52.91232 | 231.8809 | 0.7537 | 16152.41 | 1361328 |
| 5 | −1.6 | 3.83032 | 0.4 | 3.6 | 0.02626 | 0.01559 | 0.03312 | 0.04802 | 0.03134 | 0.03869 | 0 | 4592.258 | 0 | 1.00E+09 | 106152 |
| 5 | −1.4 | 4.28848 | 1.4 | 3.4 | 0.02174 | 0.0 | 0.02839 | 0.06338 | 0.03006 | 0.04302 | 2.80405 | 8.62E+07 | 1.60443 | 83451.39 | 119614.8 |
| 5 | −1.2 | 4.21790 | 2 | 3.3 | 0.01536 | 0.00341 | 0.02351 | 0.09669 | 0.03007 | 0.04316 | 0 | 386.3951 | 0 | 19446.95 | 109368.5 |
| 5 | −1 | 4.47178 | 1.8 | 2.87325 | 0.02239 | 0.00199 | 0.02521 | 0.14703 | 0.02426 | 0.04505 | 46.24354 | 293.0981 | 1.08234 | 7.25E+07 | 137494 |
| 5 | −0.8 | 3.78294 | 1.5 | 3.46025 | 0.02367 | 0.00317 | 0.02437 | 0.18748 | 0.02118 | 0.04735 | 77.13884 | 195.8661 | 0.88373 | 9.61E+07 | 89446.16 |
| 5 | −0.6 | 3.43996 | 1.5 | 5.26075 | 0.02469 | 0.0289 | 0.02161 | 0.20516 | 0.01940 | 0.05136 | 97.94424 | 177.1967 | 0.70855 | 8.69E+07 | 140364.4 |
| 5 | −0.4 | 3.24864 | 1.1 | 3.41057 | 0.02427 | 0.00372 | 0.02454 | 0.20480 | 0.01867 | 0.04869 | 103.1449 | 189.0745 | 0.74543 | 7.78E+07 | 120940.4 |
| 5 | −0.2 | 3.36600 | 1 | 2.43302 | 0.02418 | 0.00316 | 0.02679 | 0.20094 | 0.01771 | 0.04718 | 102.8015 | 198.7121 | 0.76450 | 9.04E+07 | 67628.66 |
| 5 | 0 | 3.66823 | 1 | 1 | 0.02364 | 0.00238 | 0.03020 | 0.20166 | 0.01647 | 0.04563 | 101 | 102.8015 | 0.76450 | 1.13E+08 | 27192.43 |
| 5 | 0.2 | 3.60190 | 1.1 | 0.60143 | 0.02392 | 0.00260 | 0.02939 | 0.20083 | 0.01544 | 0.04509 | 77.64431 | 183.0196 | 0.79705 | 1.08E+08 | 14811.42 |
| 5 | 0.4 | 4.21933 | 1.2 | 0.6 | 0.02300 | 0.00249 | 0.02825 | 0.21695 | 0.01552 | 0.05731 | 65 | 133.1078 | 0.81232 | 1.00E+09 | 8890.916 |
| 5 | 0.6 | 3.80536 | 1.2 | 0.5 | 0.02404 | 0.00292 | 0.02127 | 0.21078 | 0.01532 | 0.04376 | 44 | 157.4825 | 1.20711 | | |

The values in Table 12 represent solutions that are close to the charge control map and represent physically significant solutions of the FET's electrical structure. However, the values represented in Table 12 contain the influence of external layout parasitics which, in accordance with an important aspect of the invention, are subtracted using a model for the embedding parasitics to obtain the most accurate charge control mapping to the intrinsic device characteristic. In particular, an embedding model is applied to filter the extracted equivalent circuit model values and obtain values more representative of the intrinsic device. In particular, in the exemplary embodiment, a PiFET embedding parasitic model is used to subtract capacitive contributions due to interelectrode and off-mesa layout parasitic influences. This filter essentially subtracts known quantities formed from the parameters Cgs, Cgd and Cds depending on the device layout involved. In this example, embedding of the inductive parameters is not necessary because these quantities are extrinsic and do not contribute to the charge control map of the intrinsic device.

Figure 37:
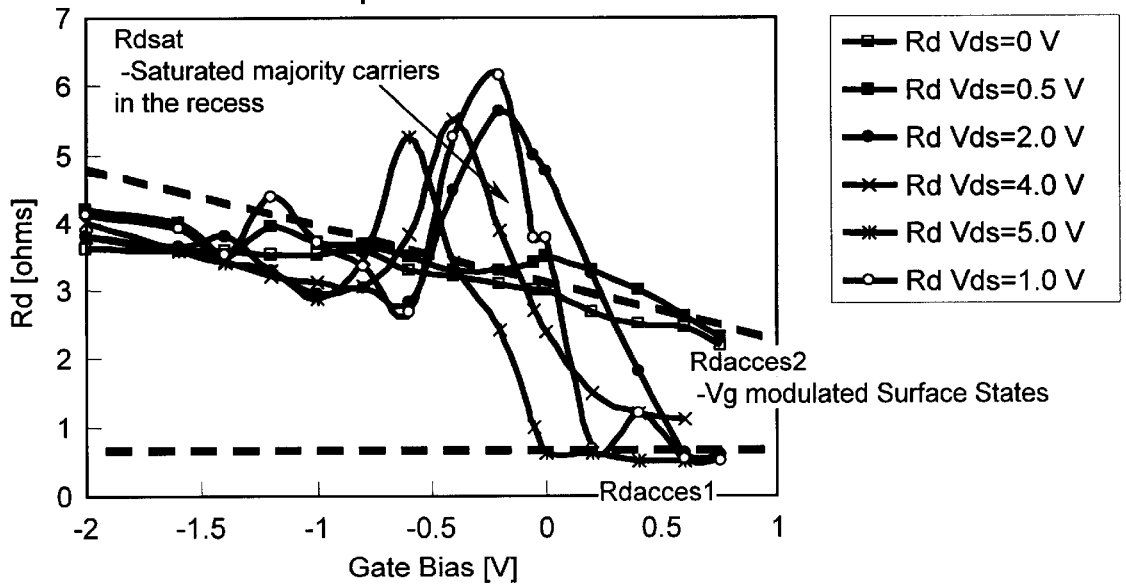
FIG. 37 is a graphical illustration of a charge control map of charge and electric field distribution in the on-mesa drain access region shown with $R_d$ as a function of bias in accordance with the present invention.
Figure 38:
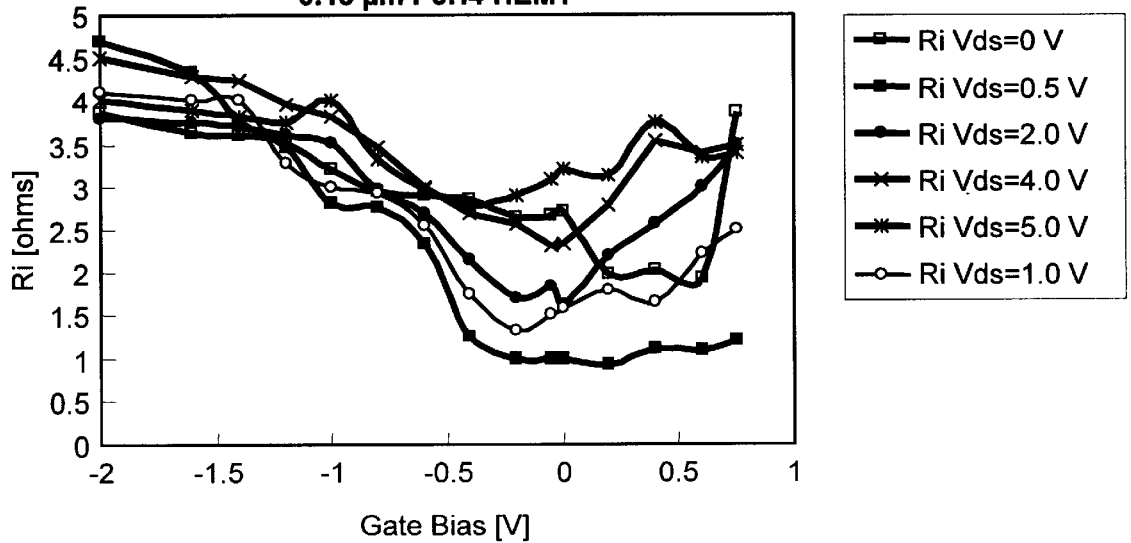
FIG. 38 is a graphical illustration of a charge control map for the non-quasi static majority carrier transport, shown with $R_i$ as a function of bias in accordance with the present invention.
Figure 39:
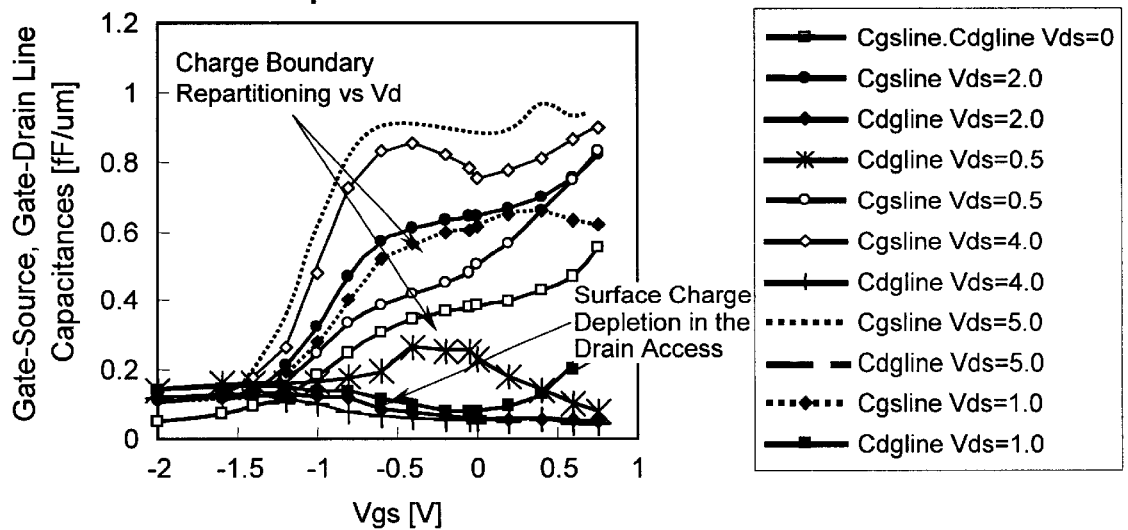
FIG. 39 is a graphical illustration of a charge control map for gate modulated charge and distribution under the gate, shown with Cgs and Cgt as function of bias in accordance with the present invention.

As discussed above, the lens with filter is used to generate unique charge control maps. In particular, FIGS. 36–39 illustrates the bias dependent charge control maps for the parameters RS, RD, RI, CGS and CGD as a function of bias. More particularly, FIG. 36 illustrates a charge control map of the charge and electric field distribution in the on-mesa source access region illustrated by the source resistance $R_s$ as a function of bias. FIG. 37 illustrates a charge control map of the charge and electric field distribution in the on-mesa drain access region illustrated by the drain resistance $R_d$ as a function of bias. FIG. 38 illustrates a charge control map for a non-quasistatic majority carrier transport illustrated by the intrinsic device charging resistance $R_i$ as a function of gate bias for different drain bias points. FIG. 39 illustrates a charge control map for gate modulated charge and distribution under the gate shown with the gate capacitance CGS and CGD as a function of bias.

Filter

As mentioned above, the S-parameter microscope 20 utilizes a filter to provide a clearer charge control map for modeling the internal electric charge/field of a semiconductor device. Although the filter is illustrated in connection with the PiFET with multiple gate fingers, as illustrated in FIGS. 40 and 41, the principles of the invention are applicable to other semiconductor devices.

Figure 40:
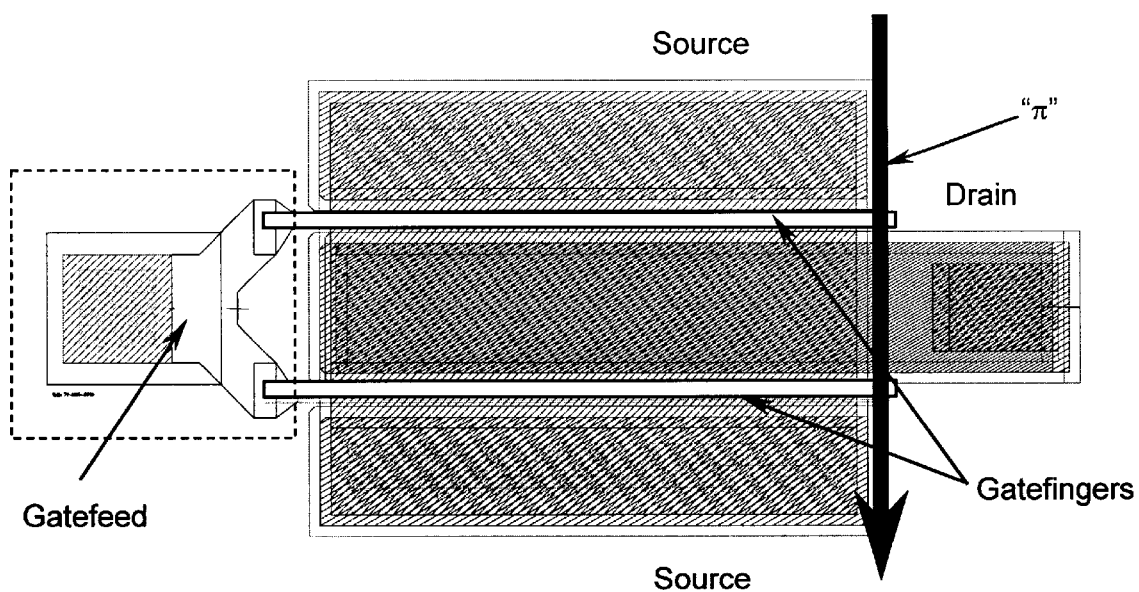
FIG. 40 is a plan view of an exemplary π-FET with two gate fingers.
Figure 41:
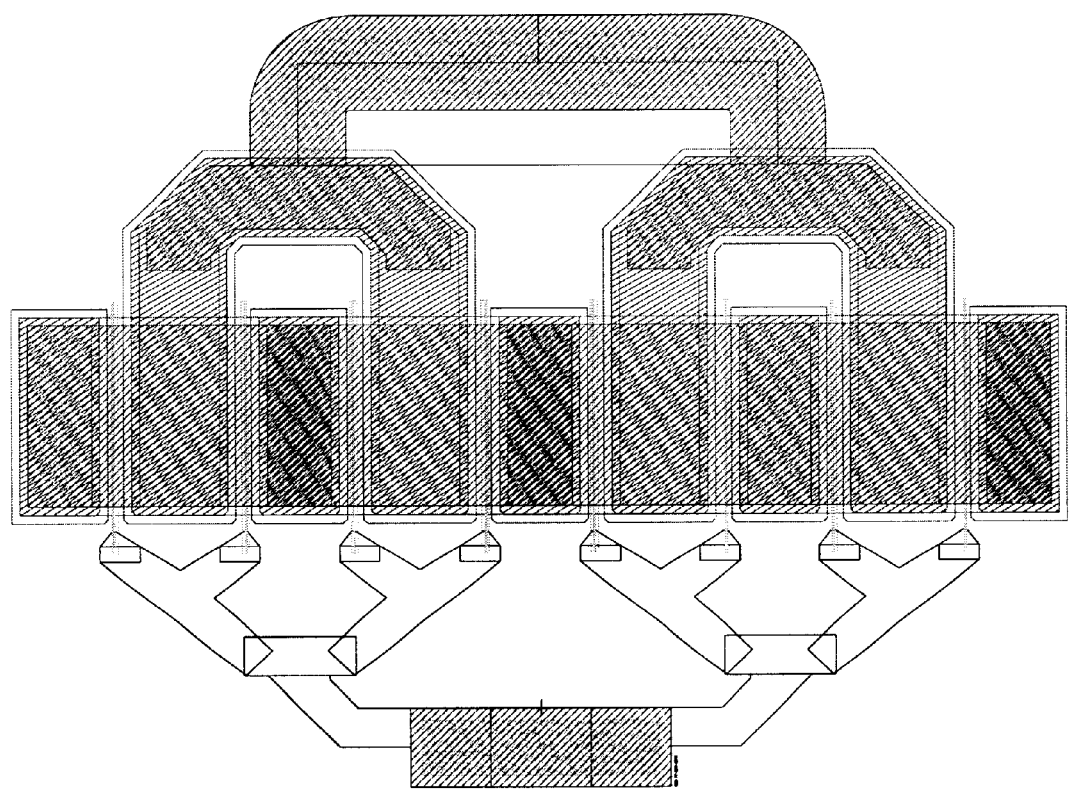
FIG. 41 is a plan view of a π-FET with four gate fingers.
Figure 42:
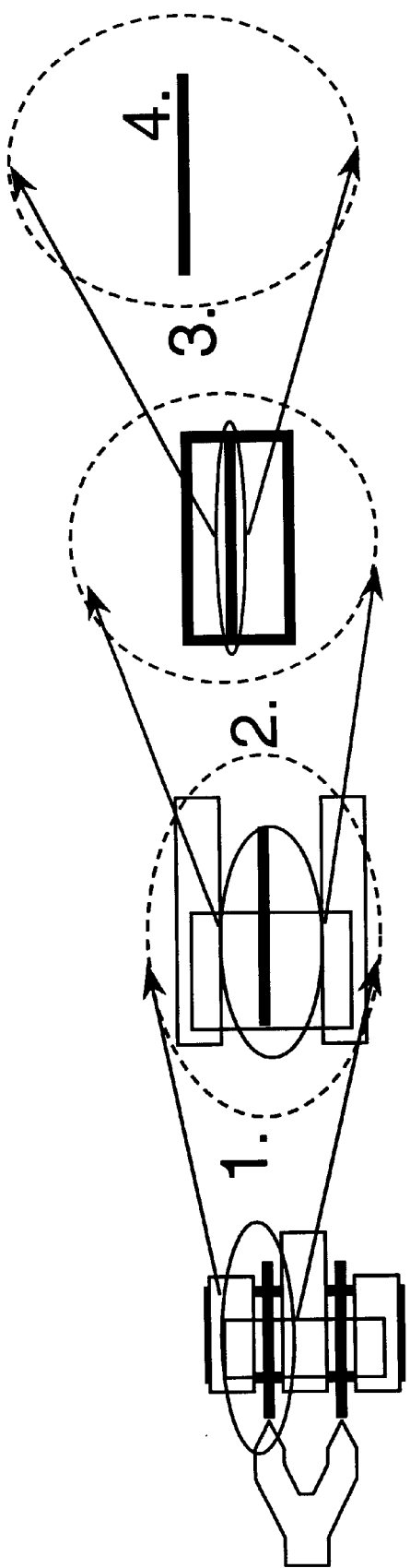
FIG. 42 is an illustration of a π-FET parasitic model in accordance with the present invention.

As illustrated in FIG. 40, PiFETs are devices in which the gate fingers and the edge of the active region resemble the greek letter A, as illustrated. Such PiFET layouts facilitate construction of multi fingered large periphery device cells, for example, as illustrated in FIG. 41. In accordance with an important aspect of the invention, the multi-finger semiconductor device is modeled as a combination of single finger device cells. Each single finger device cell is represented by a hierarchy of four models, which, in turn, are assembled together using models for interconnects to represent an arbitrary multi-fingered device cell, illustrated in FIG. 42. The four models are as follows: off mesa or boundary parasitic model; interelectrode parasitic model; on-mesa parasitic model and intrinsic model.

Figure 43:
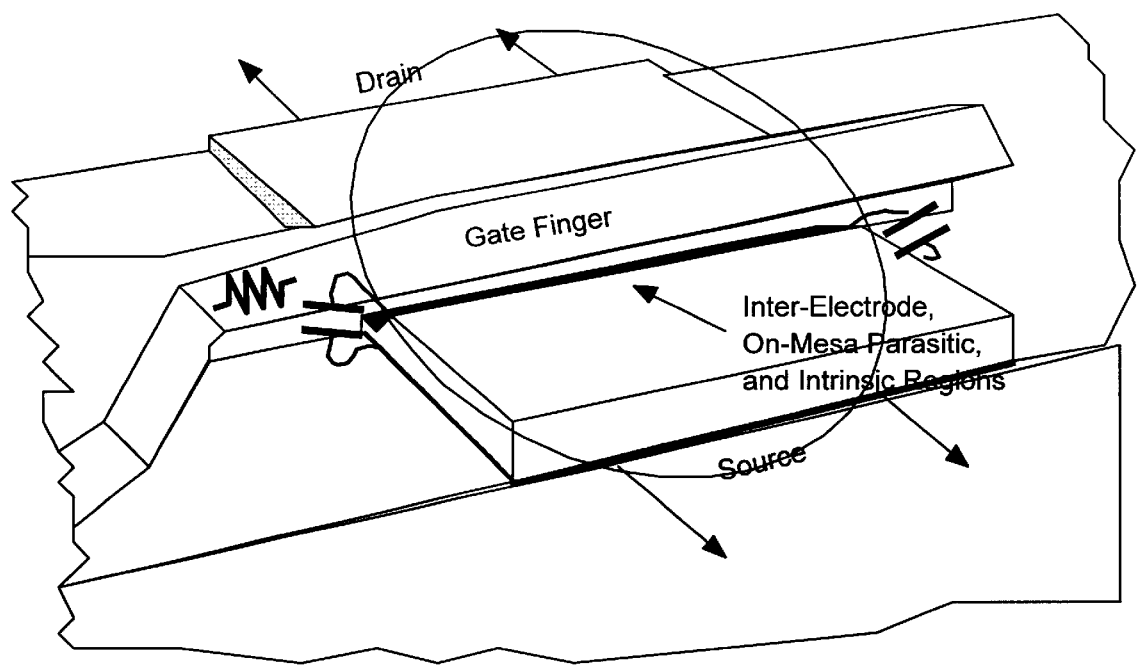
FIG. 43 is an illustration of an off-mesa parasitic model for a π-FET in accordance with the present invention.

The off-mesa parasitic model is illustrated in FIG. 43. This model represents the parasitics that exist outside the active FET region for each gate finger. In this model, the fringing capacitance of each gate finger off the active device region as well as the off-mesa gate finger resistance is modeled.

Figure 44:
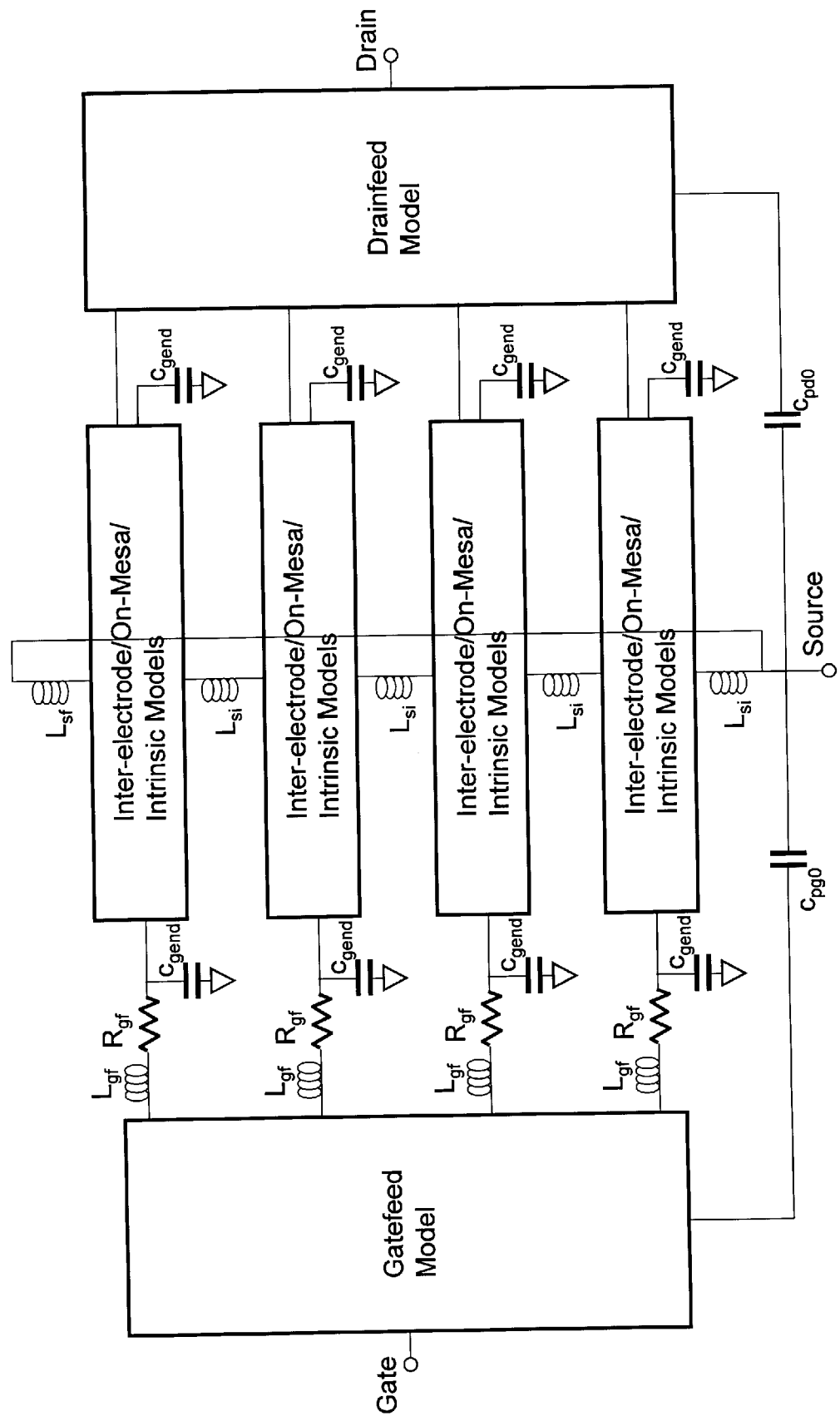
FIG. 44 is an illustration of an interconnect and boundary parasitic model in accordance with the present invention for the π-FET with four gate fingers as illustrated in FIG. 41.
Figure 45:
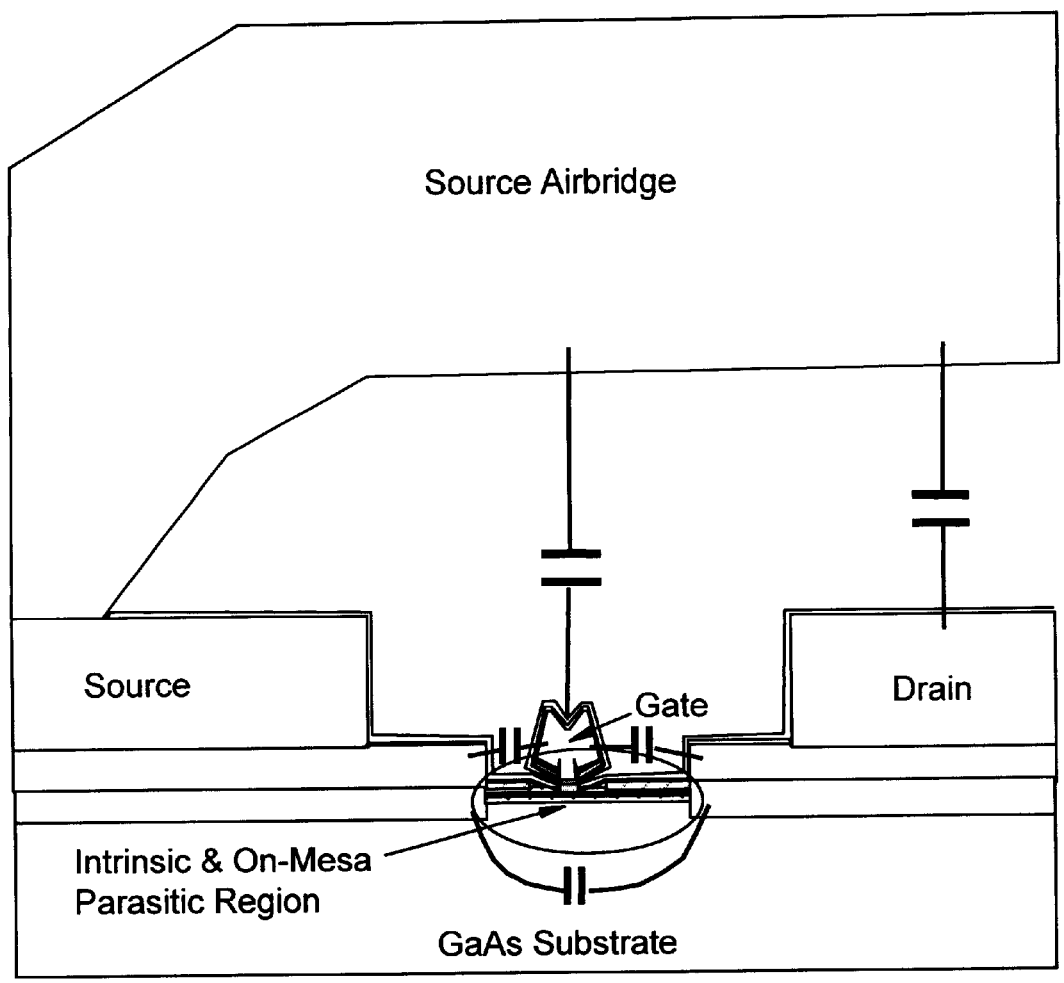
FIG. 45 is an illustration of an inter-electrode parasitic model in accordance with the present invention.
Figure 46:
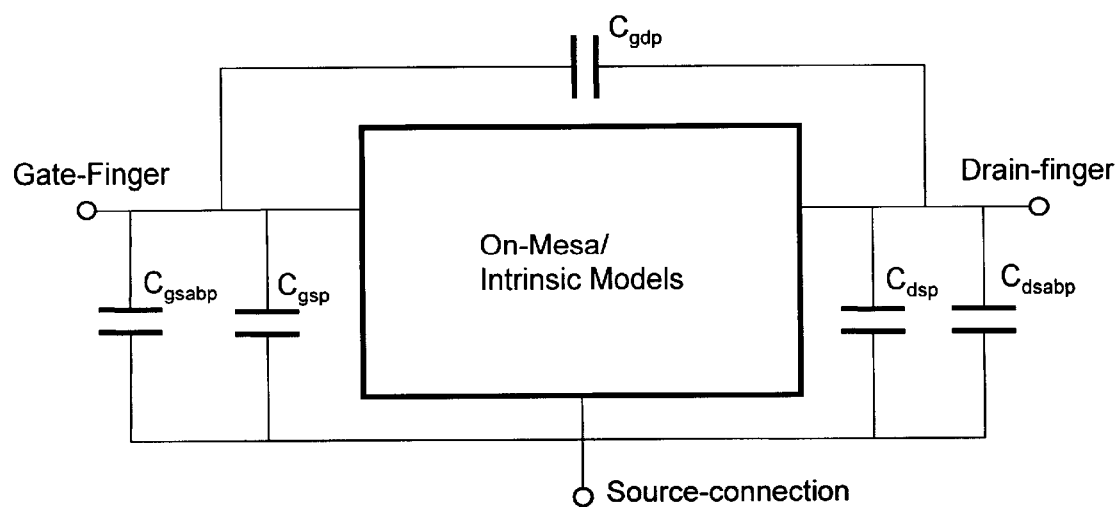
FIG. 46 is a schematic diagram of the inter-electrode parasitic model illustrated in FIG. 45.

The interelectrode parasitic model and corresponding equivalent circuit are illustrated in FIGS. 44–46. This model represents parasitics between the metal electrodes along each gate finger. The following fringing capacitance parasitics are modeled for the gate-to-source air bridge; drain-to-source air bridge; gate-to-source ohmic; gate-to-drain ohmic and source-to-drain ohmic as generally illustrated in FIG. 45.

Figure 47:
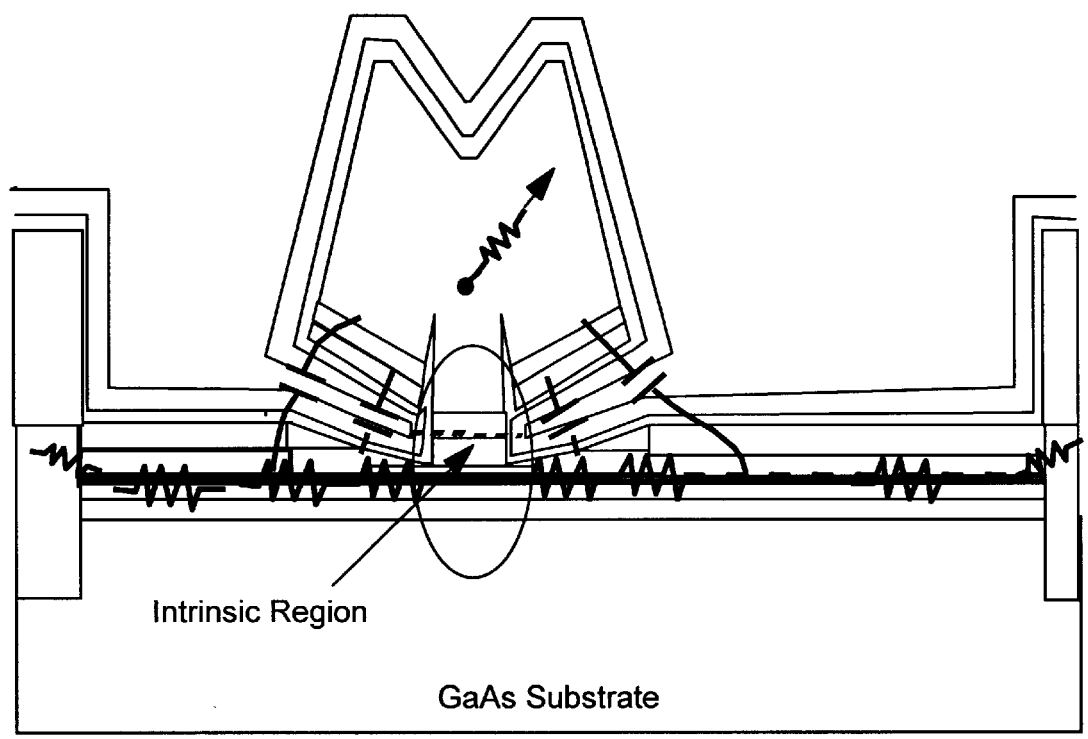
FIG. 47 is an illustration of an on-mesa parasitic model in accordance with the present invention.
Figure 48:
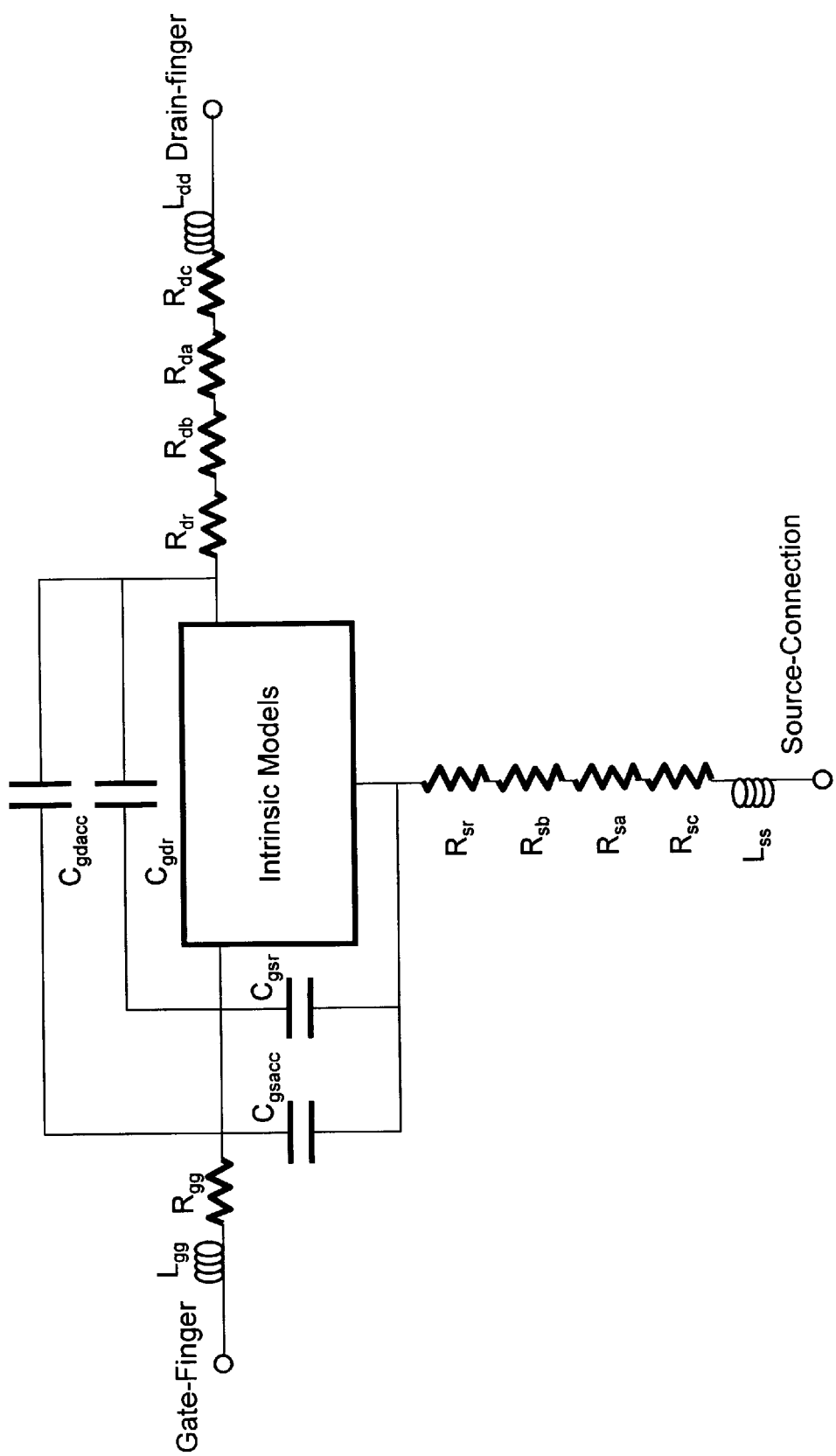
FIG. 48 is a schematic diagram of the on-mesa parasitic model illustrated in FIG. 47.

The on-mesa parasitic model and corresponding equivalent circuit are illustrated in FIGS. 47 and 48. This model represents that parasitics around the active FET region along each gate finger including various capacitance fringing parasitics and resistive parasitics. In particular, the gate-to-source side recess; gate-drain-side recess; gate-source access charge/doped cap; and gate-drain access charge/doped cap capacitance fringing parasitics are modeled. In addition, the gate metallization and ohmic contact resistive parasitics are modeled.

Figure 49:
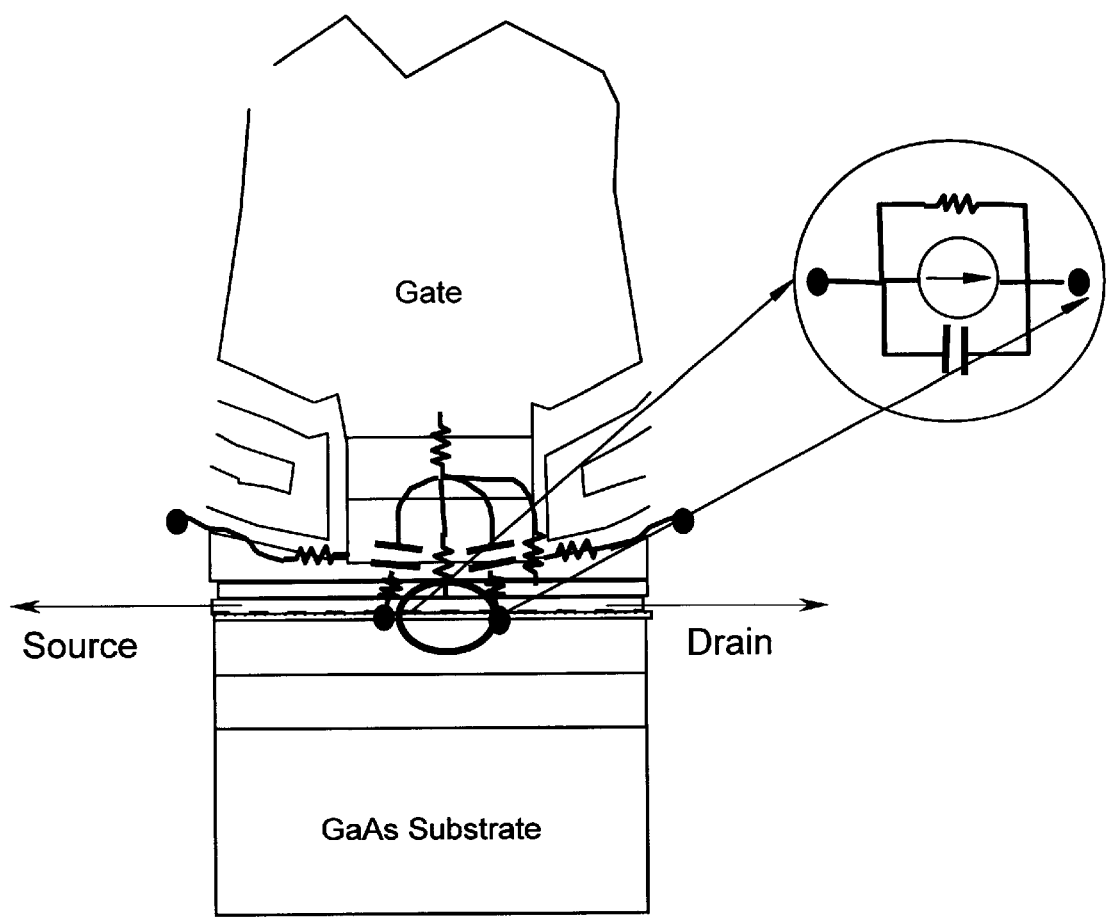
FIG. 49 is an illustration of an intrinsic model in accordance with the present invention.
Figure 50:
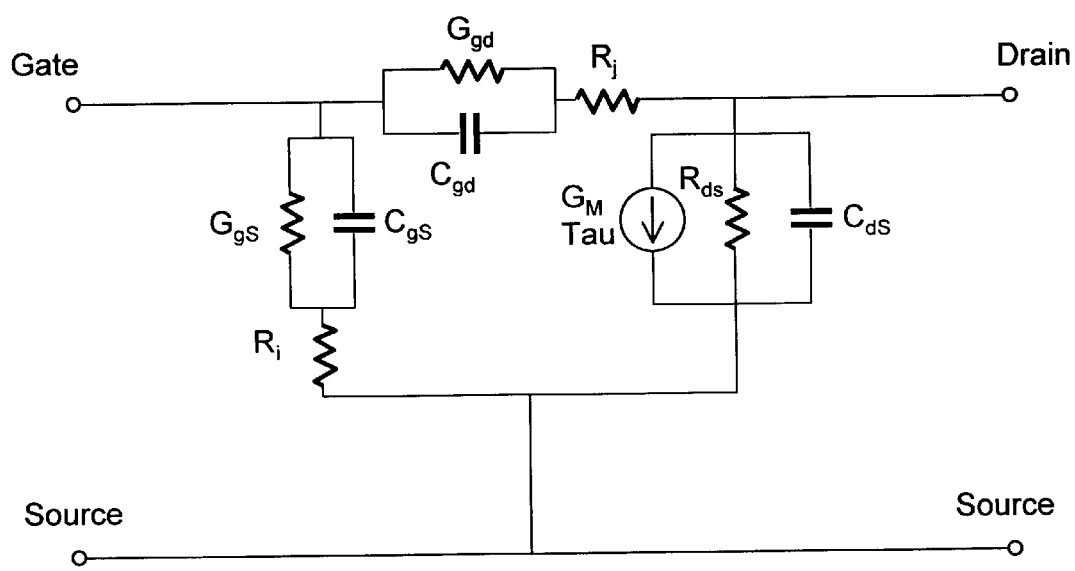
FIG. 50 is a schematic diagram of the intrinsic model illustrated in FIG. 49.

The intrinsic model and corresponding equivalent circuit are illustrated in FIGS. 49 and 50. The intrinsic model represents the physics that predominately determine the FET performance. In particular, the DC and current voltage response can be determined by physics based analytical equations for magnitude and location of intrinsic charge which are generally know in the art, for example, as disclosed in "Nonlinear Charge Control in AlGaAs/GaAs Modulation-Doped FETs," by Hughes et al, *IEEE Trans. Electron Devices*, Vol. ED-34, No. 8, August 1987. The small signal model performance is modeled by taking a derivative of the appropriate charge or current control equations to derive various terms such as RI, RJ, RDS, RGS, RGD, GM, TAU, CGS, CDS and CGD. Such control equations are generally known in the art and disclosed in detail in the Hughes et al reference mentioned above, hereby incorporated by reference. The noise performance may be modeled by current or voltage perturbation analysis "Noise Characteristics of Gallium Arsenride Field-Effect Transistors" by H. Statz, et al, *IEEE-Trans. Electron Devices*, vol. ED-21, No. 9, September 1974 and "Gate Noise in Field Effect Transistors at Moderately High Frequencies" by A. Van Der Ziel, *Proc. IEEE*, vol 51, March 1963 and "Noise Characteristics of Gallium Arsenide Field Effect Transistors," by H. Statz, *IEEE Trans.*, Vol. ED-21, No. 9, September 1974.

Figure 51B:
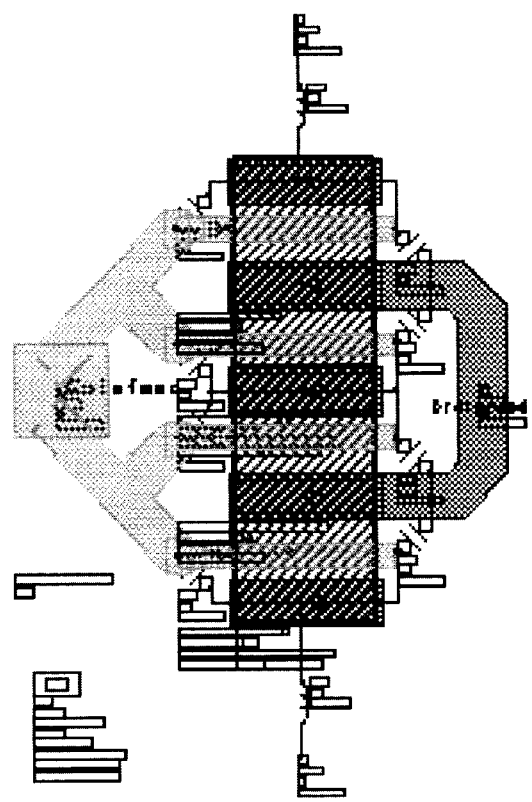
FIG. 51B is an equivalent circuit model for the π-FET illustrated in FIG. 37A.

An example of a parasitic model for use with the S-parameter microscopy discussed above is illustrated in FIGS. 51–58. Although a specific embodiment of a semiconductor device is illustrated and described, the principles of the present invention are applicable to various semiconductor devices. Referring to FIG. 51A, a Pi-FET is illustrated. As shown, the PiFET has four gate fingers. The four fingered Pi-FET is modeled in FIG. 51B. In particular, FIG. 51B illustrates an equivalent circuit model for Pi-FET illustrated in FIG. 51A as implemented by a known CAD program, for example, LIBRA 6.1 as manufactured by Agilent Technologies. As shown, the equivalent circuit models does not illustrate all of the equivalent circuit elements or network connections involved with implementing the parasitic embedding models, but rather demonstrates a finished product. FIG. 51B is displayed in symbol view in order demonstrate resemblance to FIG. 41. The actual technical information regarding the construction of the network and its equivalent circuit elements are normally provided in schematic view.

FIGS. 52–56 demonstrate the application of the parasitic model for use with the S-parameter microscopy. An important aspect of parasitic modeling of multi-gate fingered devices as single gate finger devices. As used herein, a single unit device cell refers to a device associated with a single gate finger. For example, a four fingered Pi-FET as illustrated in FIG. 51 is modeled as four unit device cells.

Figure 52:
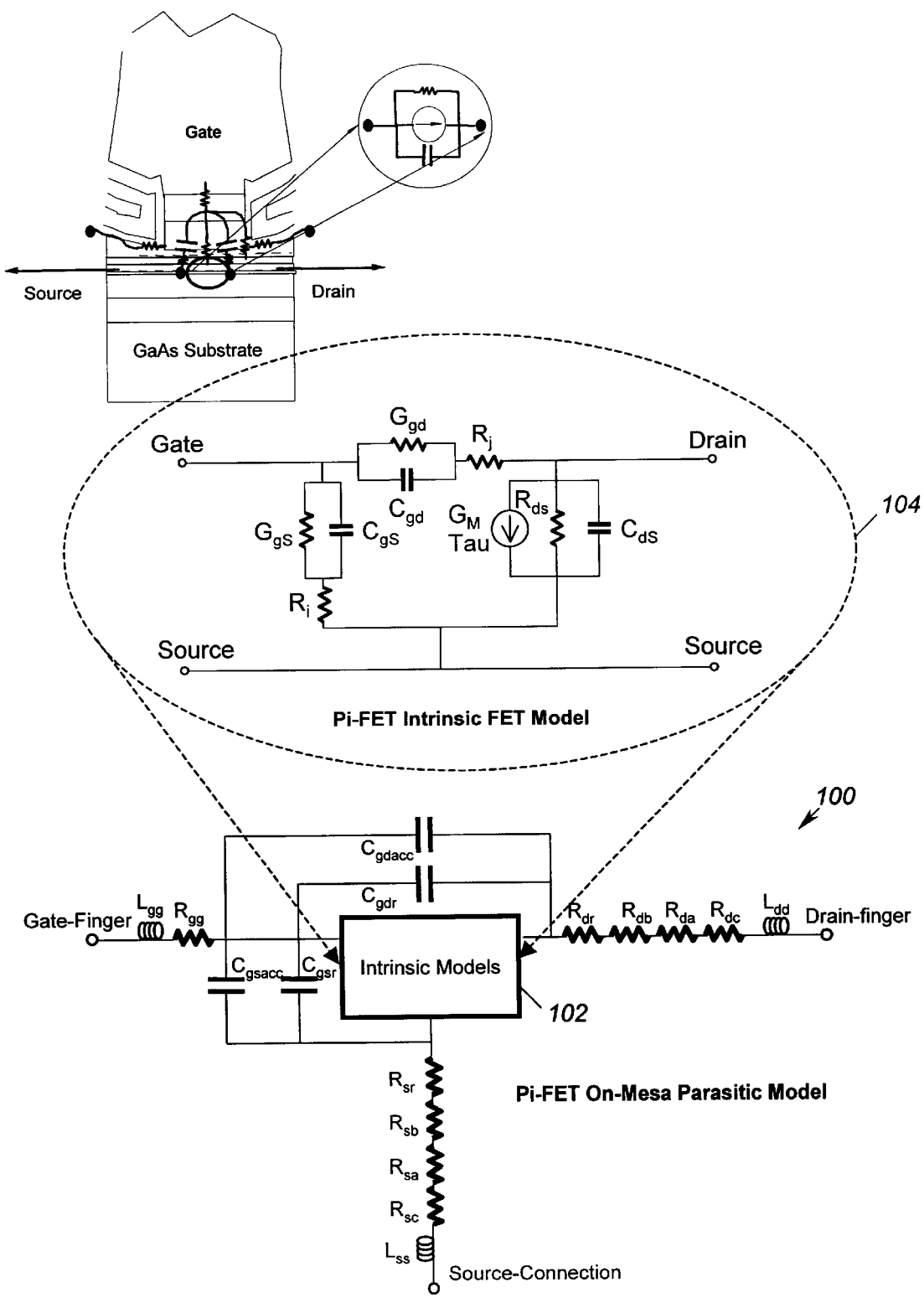
FIG. 52 is a single finger unit device cell intrinsic model in accordance with the present invention.
Figure 53:
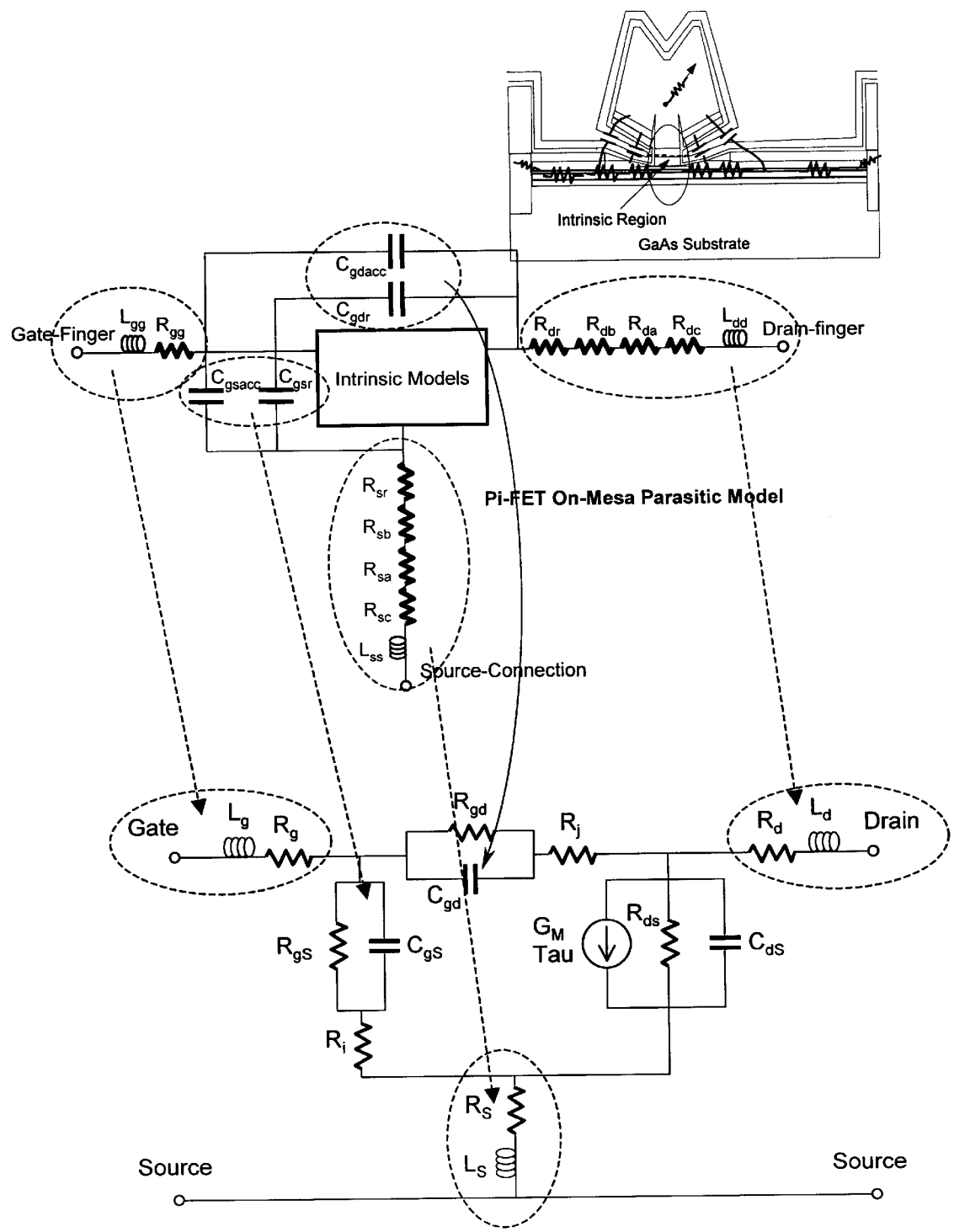
FIG. 53 is similar to FIG. 52 and illustrates the first level of embedding in accordance with the present invention.
Figure 54:
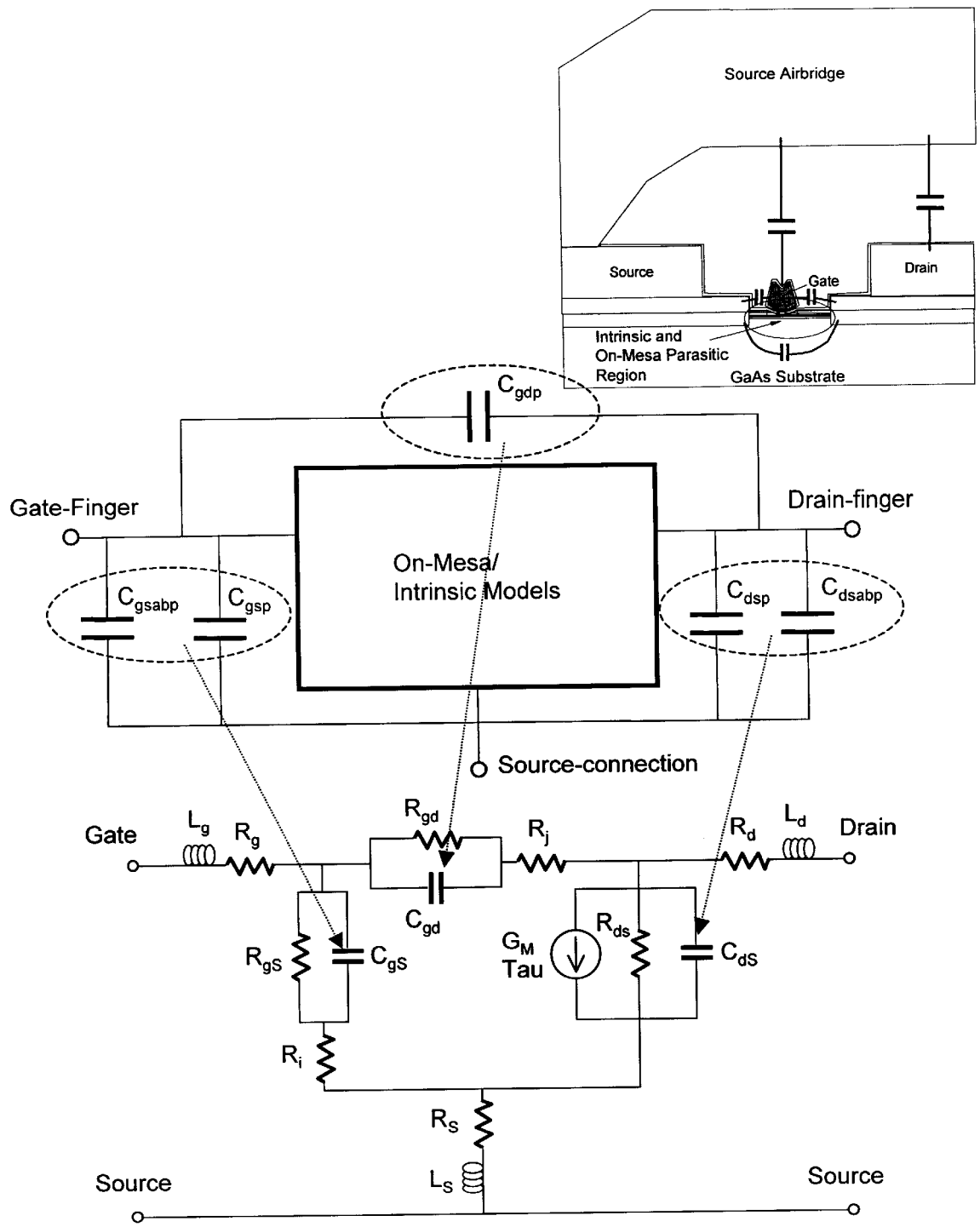
FIG. 54 is similar to FIG. 52 and illustrates the second level of embedding in accordance with the present invention.
Figure 55:
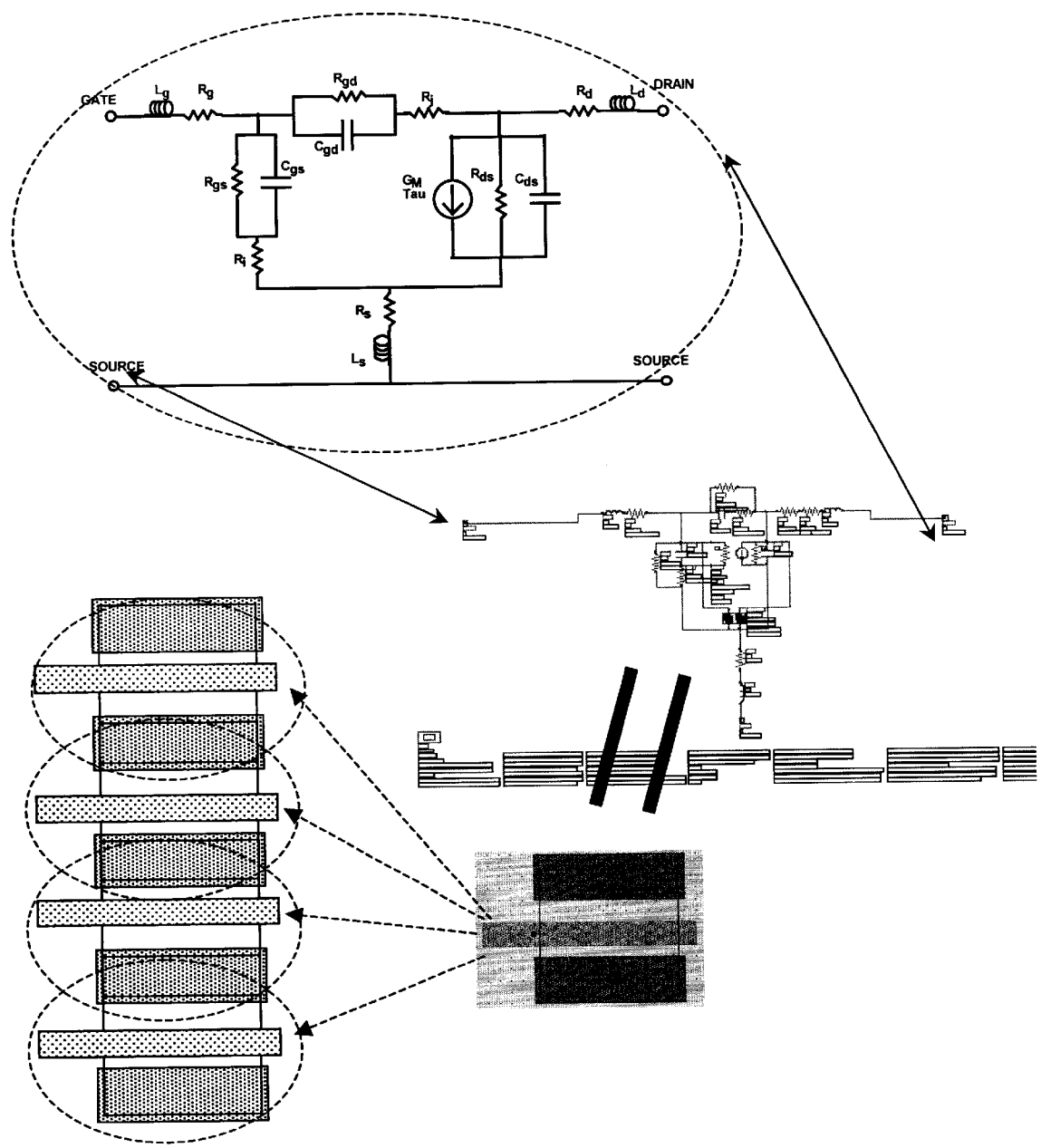
FIG. 55 is an equivalent circuit model of the π-FET illustrated in FIG. 51A in accordance with the present invention.
Figure 56:
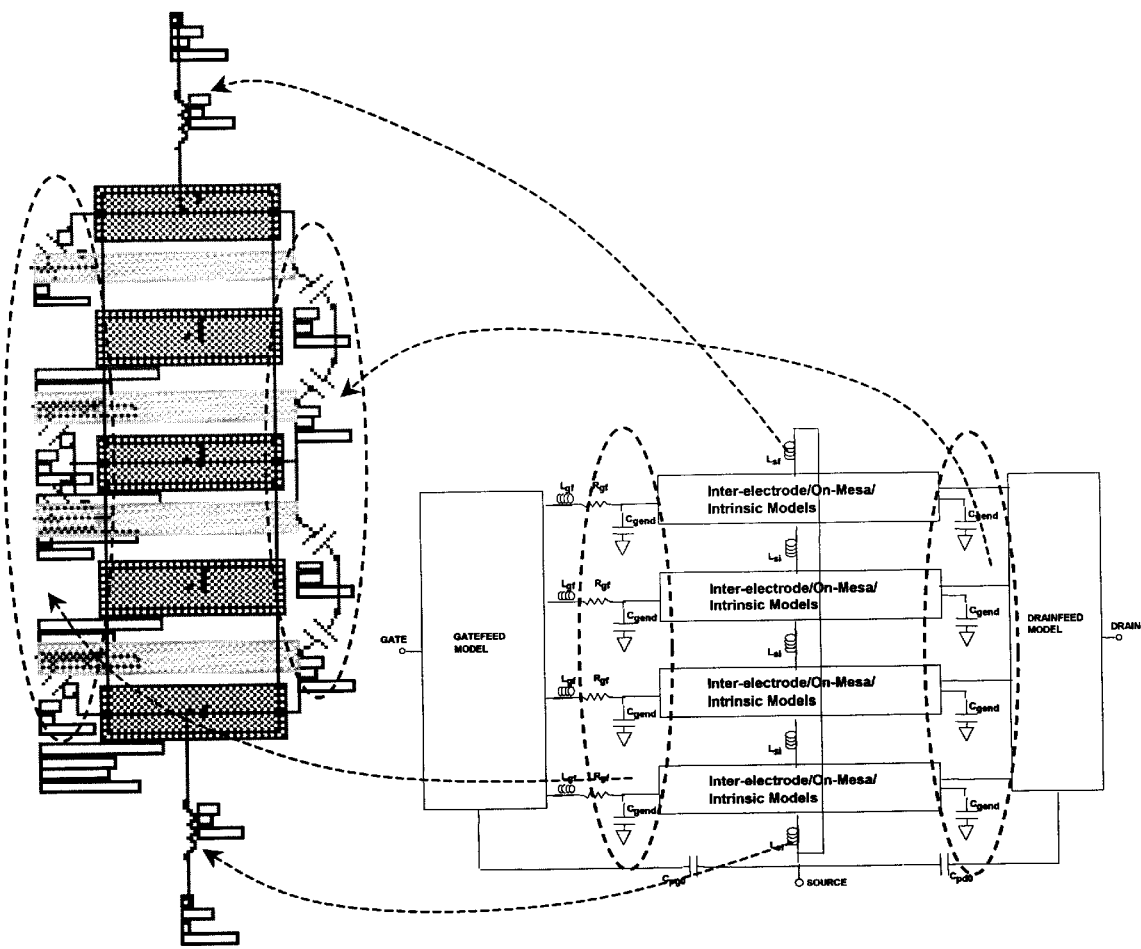
FIG. 56 is similar to FIG. 54 and illustrates the third level of embedding in accordance with the present invention.
Figure 57:
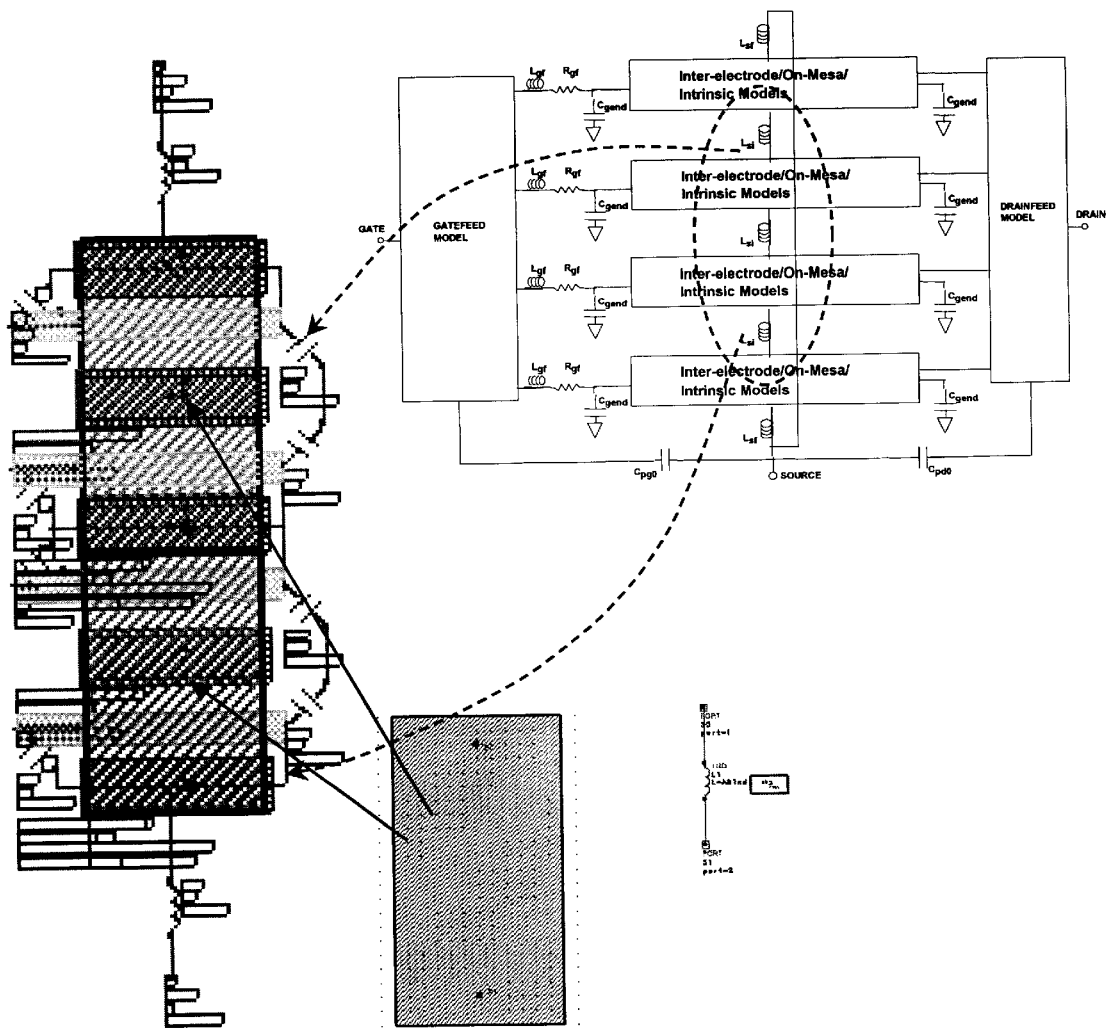
FIG. 57 is similar to FIG. 54 and illustrates the fourth level of embedding in accordance with the present invention.
Figure 58:
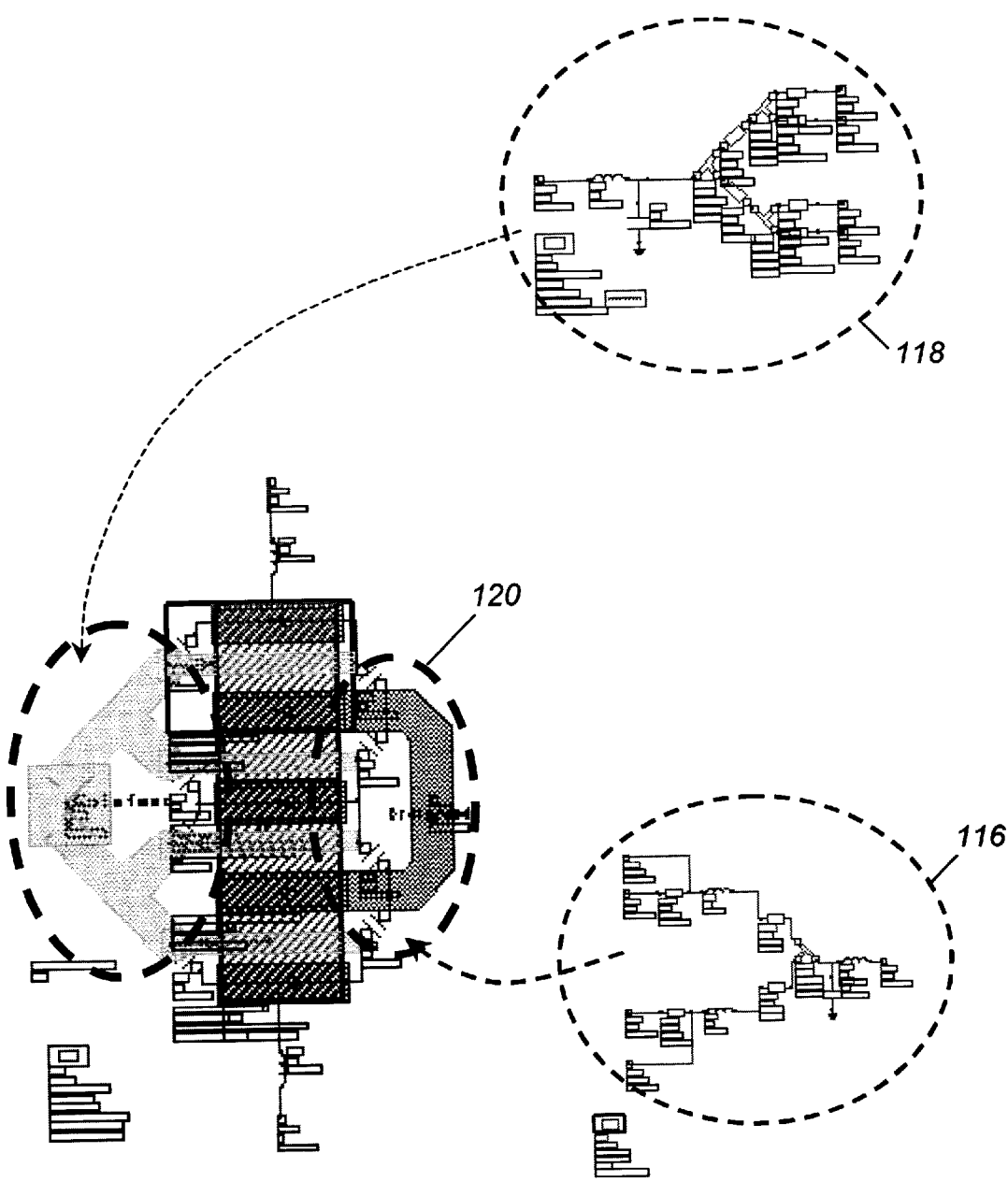
FIG. 58 is similar to FIG. 54 and illustrates the fifth level of embedding in accordance with the present invention.

Initially, the four finger Pi-FET illustrated in FIG. 51, is modeled as a single finger unit device cell 100 with an intrinsic model 102, as shown in FIGS. 52 and 53. In particular, the Pi-FET intrinsic FET model 104 is substituted for the block 102 defining a first level of embedding. As shown in FIG. 53, the parameter values for the Pi-FET intrinsic model are added together with the parameter values for the single fingered unit device cell intrinsic model. The intrinsic device model 104 may be developed by S-parameter microscopy as discussed above. Next, as illustrated in FIG. 54, the interconnect layout parasitic elements are added to the equivalent model by simply adding the model terms to the value of the appropriate circuit element to form a single unit device cell defining a second level of embedding. Once the single unit device cell is formulated, this device is used to construct models for multi-fingered devices. In this case, a Pi-FET with four gate fingers is modeled as four single finger device unit cells as shown in FIG. 55. Subsequently, the off-mesa layout parasitic elements are connected to the multi-fingered layout, defining a third level of embedding as illustrated in FIG. 56. These off-mesa layout parasitic elements, generally identified with the reference numerals 108 and 110, are implemented as new circuit elements connected at key outer nodes of the equivalent circuit structure. Subsequently, a fourth level of embedding is implemented as generally illustrated in FIG. 57. In particular, an inductor model is connected to the sources of each of the various unit device cells to represent the metallic bridge interconnection, as generally shown in FIG. 54. Lastly, as illustrated in FIG. 58, a fifth level of embedding is implemented in which the feed electrodes model 114 and 116 are modeled as lumped linear elements (i.e. capacitors inductors) as well as the distributive elements (i.e. microstrip lines and junctions) to form the gate feed and drain connections illustrated in FIG. 58. As shown, the distributive elements are distributed models for microstrip elements as implemented in LIBRA 6.1.

Extraction Method For Unique Determination Of Fet Equivalent Circuit Models

The method for determining FET equivalent circuit parameters as discussed above is illustrated in FIGS. 58–64. This method is based on an equivalent circuit model, such as the common source FET equivalent circuit model illustrated in FIG. 28. Referring to FIG. 58, a model is initially generated in step 122. The model illustrated in FIG. 28 is used as a small signal model for the FET. In accordance with an important aspect of the algorithm, the equivalent circuit parameters are based upon measured FET S-parameters. Measurement of S-parameters of semiconductor devices is well known in the art. FIG. 62A is a Smith chart illustrating exemplary measured S-parameters S11, S12 and S22 for frequencies between 0.05 to 40 GHz. FIG. 62B represents a magnitude angle chart for the measured S-parameter S21 from frequencies from 0.05 to 40 GHz. After the S-parameters are measured, as set forth in step 124 (FIG. 59), it is ascertained whether the measurements are suitable in step 126. This is either done by manually inspecting the test result for anomalies, or by algorithms to validate the test set. If the measurements are suitable, the S-parameter measurements are stored in step 128.

A space of trial starting feedback impedance point values, for example, as illustrated in Table 13 is chosen. Then, a direct model attraction algorithm, known as the Minasian algorithm, is used to generate preliminary values for the equivalent circuit model parameters, for each value of starting feedback impedance. Such extraction algorithms are well known in the art, for example, as disclosed "Broadband Determination of the FET Small Equivalent Small Signal Circuit" by M. Berroth, et al., *IEEE-MTT*, Vol. 38, No. 7, July 1990. Model parameter values are determined for each of the starting impedance point values illustrated in Table 14. In particular, referring to FIG. 59A, each impedance point in Table 12 is processed by the blocks 130, 132, etc. to develop model parameter values for each of the impedance point in order to develop an error metric, which, in turn, is used to develop a unique small signal device model, as will be discussed below. The processing in each of the blocks 130, 132 is similar. Thus, only a single block 130 will be discussed for an exemplary impedance point illustrated in Table 13. In this example, the impedance point 17 which correlates to a source resistance $R_s$ ohm of 1.7 Ω and a source inductance $L_s$ of 0.0045 pH is used.

TABLE 13

Trial Starting Feedback, Impedance Space Point Values

| Impedance Point | Resistance (Rs) | Inductance (Ls) |
|---|---|---|
| 1 | 0.1 Ω | 0.0045 pH |
| 2 | 0.2 Ω | 0.0045 pH |
| 3 | 0.3 Ω | 0.0045 pH |
| 4 | 0.4 Ω | 0.0045 pH |
| 5 | 0.5 Ω | 0.0045 pH |
| 6 | 0.6 Ω | 0.0045 pH |
| 7 | 0.7 Ω | 0.0045 pH |
| 8 | 0.8 Ω | 0.0045 pH |
| 9 | 0.9 Ω | 0.0045 pH |
| 10 | 1.0 Ω | 0.0045 pH |
| 11 | 1.1 Ω | 0.0045 pH |
| 12 | 1.2 Ω | 0.0045 pH |
| 13 | 1.3 Ω | 0.0045 pH |
| 14 | 1.4 Ω | 0.0045 pH |
| 15 | 1.5 Ω | 0.0045 pH |
| 16 | 1.6 Ω | 0.0045 pH |
| 17 | 1.7 Ω | 0.0045 pH |
| 18 | 1.8 Ω | 0.0045 pH |
| 19 | 1.9 Ω | 0.0045 pH |
| 20 | 2.0 Ω | 0.0045 pH |
| 21 | 2.1 Ω | 0.0045 pH |
| 22 | 2.2 Ω | 0.0045 pH |
| 23 | 2.3 Ω | 0.0045 pH |
| 24 | 2.4 Ω | 0.0045 pH |
| 25 | 2.5 Ω | 0.0045 pH |
| 26 | 2.6 Ω | 0.0045 pH |
| 27 | 2.7 Ω | 0.0045 pH |
| 28 | 2.8 Ω | 0.0045 pH |
| 29 | 2.9 Ω | 0.0045 pH |
| 30 | 3.0 Ω | 0.0045 pH |

For the selected value, $R_s$=1.7 ohms, initial intrinsic equivalent circuit parameters and initial parasitic equivalent circuit parameter are determined, for example, by the Minasian algorithm discussed above and illustrated in Tables 14 and 15 as set forth in steps 134 and 136. In step 138 the simulated circuit parameters are compared with the measured S-parameters, for example, as illustrated in FIGS. 62. Each of the processing blocks 130 and 132 etc. goes through a fixed number of complete cycles, in this case six complete cycles. As such, the system determines in step 140 whether the six cycles are complete.

TABLE 14

Initial "Intrinsic" Equivalent Circuit Parameters

| Intrinsic Equivalent Circuit Parameter | Initial Solution |
| --- | --- |
| Cgs | 0.23595 pF |
| Rgs | 91826 Ω |
| Cgd | 0.0177 pF |
| Rgd | 100000 Ω |
| Cds | 0.04045 pF |
| Rds | 142.66 Ω |
| Gm | 142.1025 mS |
| Tau | 0.1 pS |

TABLE 15

Initial "Parasitic" Equivalent Circuit Parameters

| Intrinsic Equivalent Circuit Parameter | Initial Solution |
| --- | --- |
| Rg | 3.0 Ω |
| Lg | 0.014 nH |
| Rs | 1.7 Ω |
| Ls | 0.0045 nH |
| Rd | 2.5 Ω |
| Ld | 0.024 nH |

Each cycle of the processing block 130 consists of a direct extraction followed by an optimization with a fixed number of optimization iterations, for example 60. By fixing the number of extraction-optimization cycles along with the number of optimization iterations, a fixed "distance" or calculation time which the model solution must be derived is defined. As such, the algorithm implements a convergence speed requirement of the global error metric by setting up an environment where each trial model solution competes against each other by achieving the lowest fitting error over a fixed calculation time thus causing a "race" criteria to be implemented, where "convergence speed" to be implicitly calculated for each processing block 130, 132 etc.

After the system determines whether the racing is done in step 140, the system proceeds to block 142 and optimizes model parameters. Various commercial software programs are available. For example, a commercially available, LIBRA 3.5 software as manufactured by HP-eesof may be used both for circuit simulation as well as optimizing functions. The optimization is performed in accordance with the restrictions set forth in Table 16 with the addition of fixing the feedback resistance $R_s$ to a fixed value.

TABLE 16

Environment Used for Competitive Solution Strategy, as Implemented in this Example

| Implementation Parameter | |
| --- | --- |
| Circuit Simulator and Optimizer | Libra 3.5 |
| Optimization Algorithm | Gradient |
| Optimization Error Metric | Mag and angle of S11, S21, S12, and S22 from 4 to 40 GHz |
| Number of Iterations | 60 |
| Number of Extraction/Optimization Cycles | 6 |

Figure 63A:
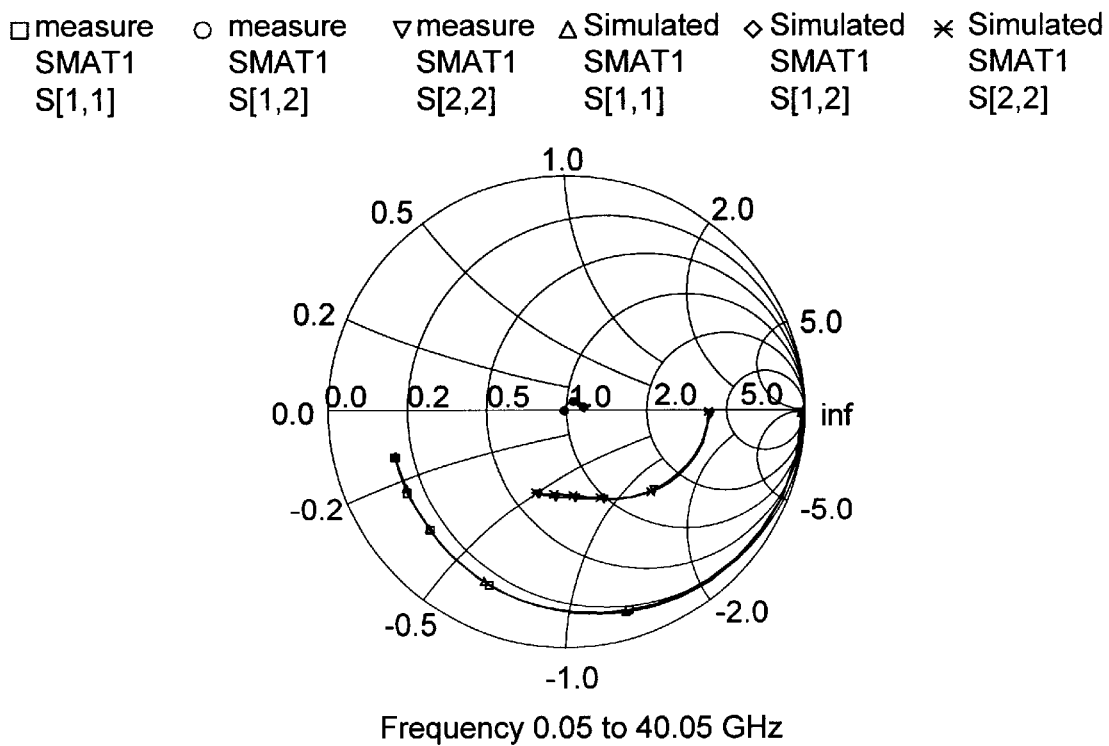
FIG. 63A is a Smith chart illustrating the measured versus simulated S-parameters S11, S12 and S22 for frequencies 0.05 to 40 GHz for the first extraction optimization cycle.
Figure 63B:
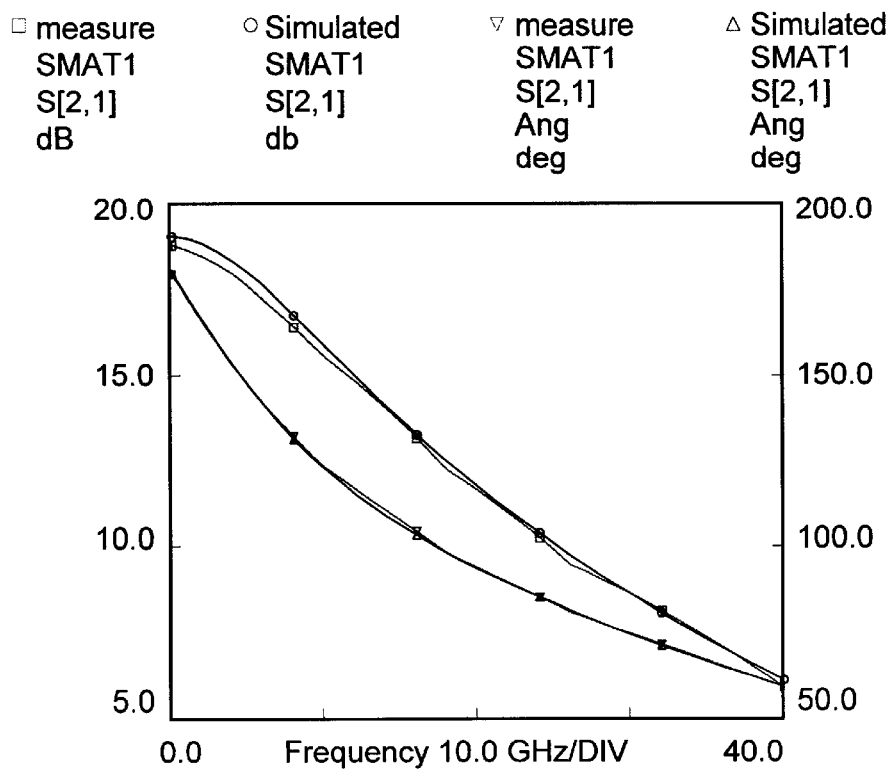
FIG. 63B is a graphical illustration of magnitude as a function of angle for the measure and first optimized model S-21 parameter for frequencies 0.05 to 40 GHz for the first optimization cycle.

By fixing the value for $R_s$ this segment of the algorithm confined to creating a trial model solution for only the trial feedback impendence point with which it started. Table 17 illustrates the optimized intrinsic equivalent parameter values using commercially available software, such as LIBRA 3.5. These values along with the optimized parasitic values, illustrated in Table 18, form the first optimized model solution for the first extraction-optimization cycle (i.e. one of six). The optimized model parameters are then fed back to the function block 134 and 136 (FIGS. 63A and 63B) used for a new initial model solution. These values are compared with the measured S-parameter value as illustrated in FIG. 63. The system repeats this cycle for six cycles in a similar fashion as discussed above. After the six extraction-optimization cycle, the final trial model solution for the trial impendence point 17 is complete along with its final fitting error to the measured data to form the new error metric 144. In accordance with an important aspect, the extraction-optimization algorithm makes the final optimization fitting error for each point implicitly carry information about both the measured to model fitting error and the speed of convergence. It does so by the fixed optimization time constraint which sets up a competitive race between the various trial model solutions.

TABLE 17

Optimized "Intrinsic" Equivalent Circuit Parameters

| Intrinsic Equivalent Circuit Parameter | Initial Solution |
| --- | --- |
| Cgs | 0.227785 pF |
| Rgs | 65247 Ω |
| Cgd | 0.017016 pF |
| Rgd | 130820 Ω |
| Cds | 0.047521 pF |
| Rds | 160.18 Ω |
| Gm | 135.74 mS |
| Tau | 0.446 pS |

TABLE 18

Optimized "Parasitic" Equivalent Circuit Parameters

| Intrinsic Equivalent Circuit Parameter | Initial Solution |
| --- | --- |
| Rg | 4.715 Ω |
| Lg | 0.02903 nH |
| Rs* | 1.7 Ω |
| Ls | 0.002102 nH |
| Rd | 3.2893 Ω |
| Ld | 0.0317 nH |

Figure 59A:
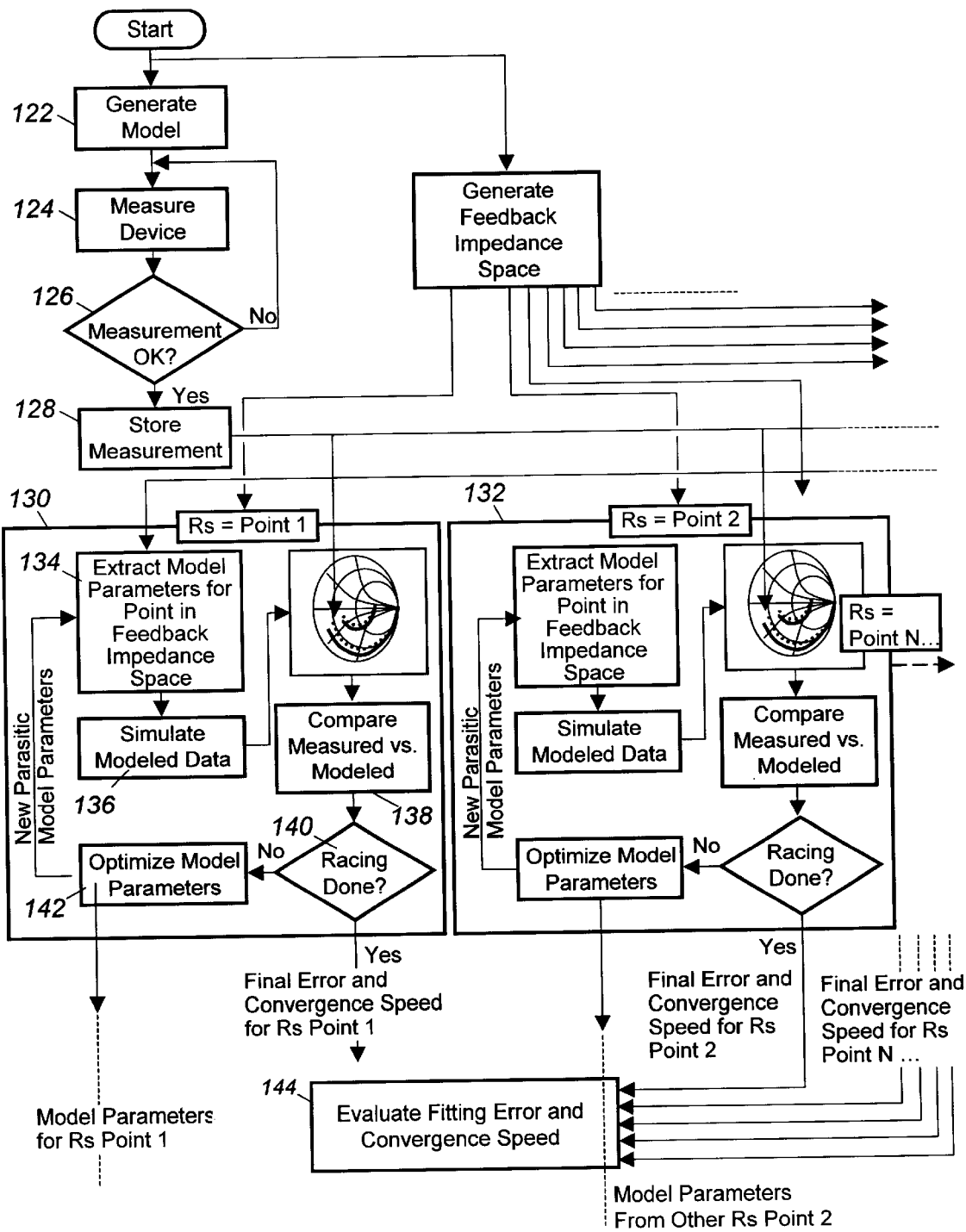
FIGS. 59A and 59B is a flow chart of a parameter extraction modeling algorithm that forms a part of the present invention.
Figure 59B:
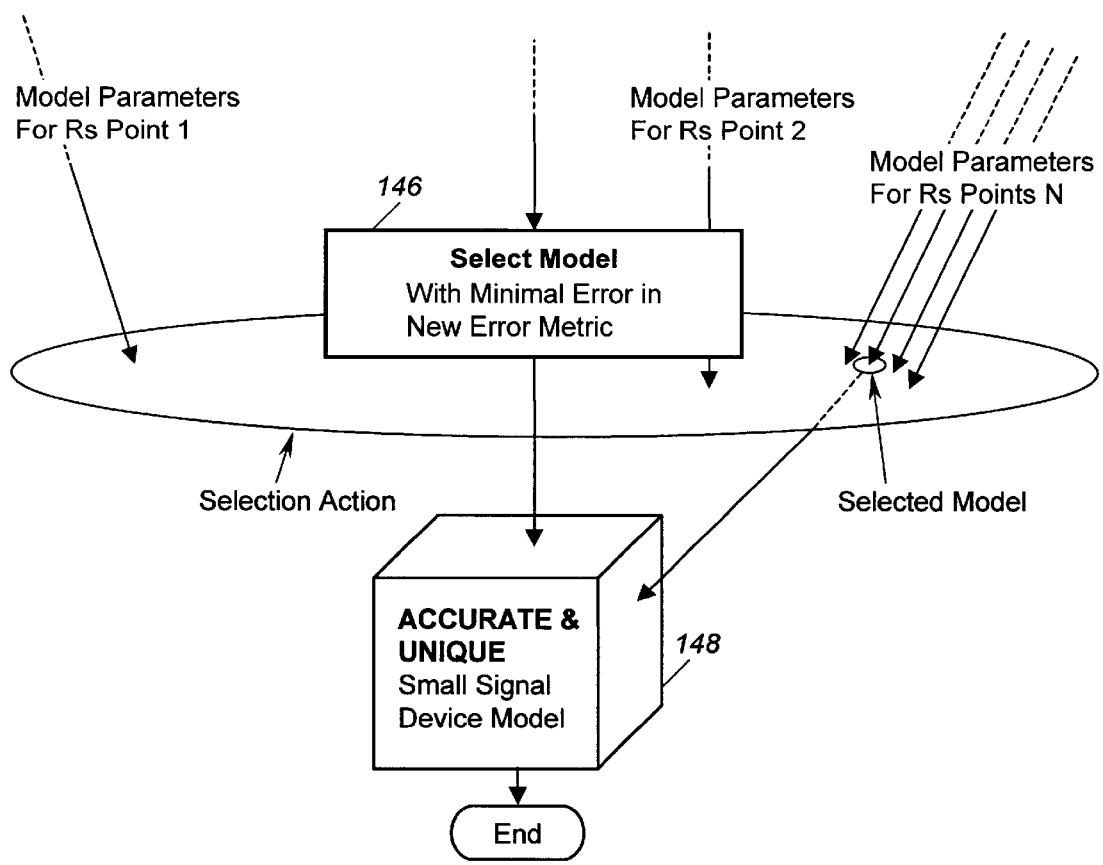
Figure 60:
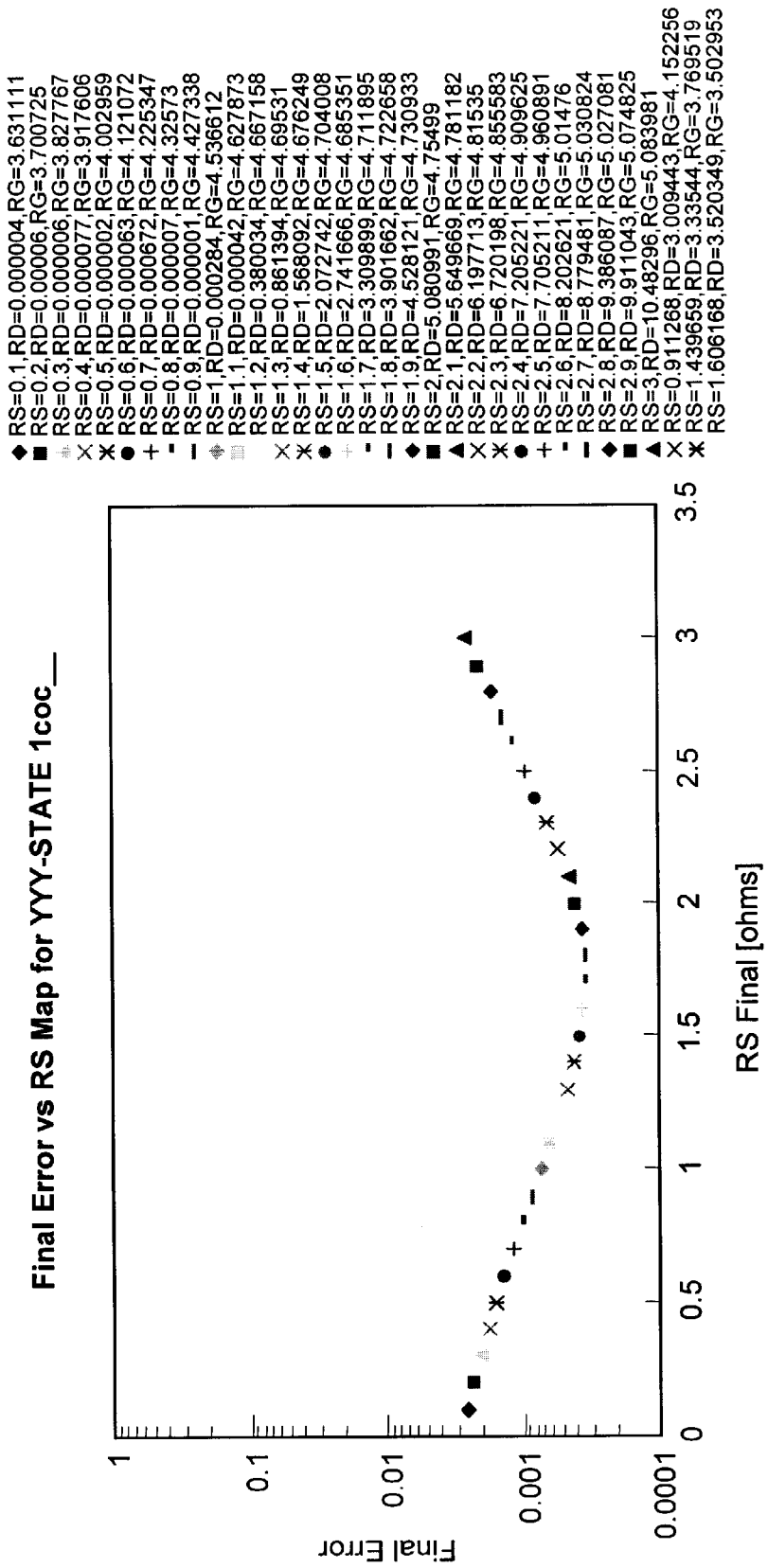
FIGS. 60 and 61 illustrate the evaluation of a global error metric involving filtering error and trial model solution convergence speed.
Figure 61:
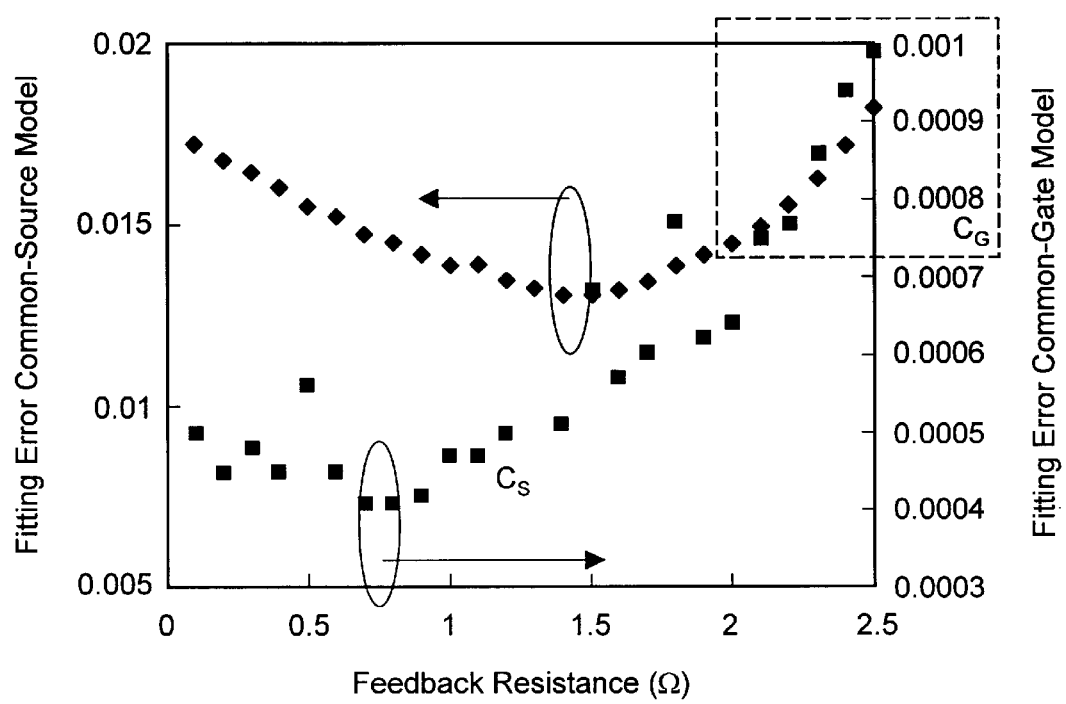
Figure 62A:
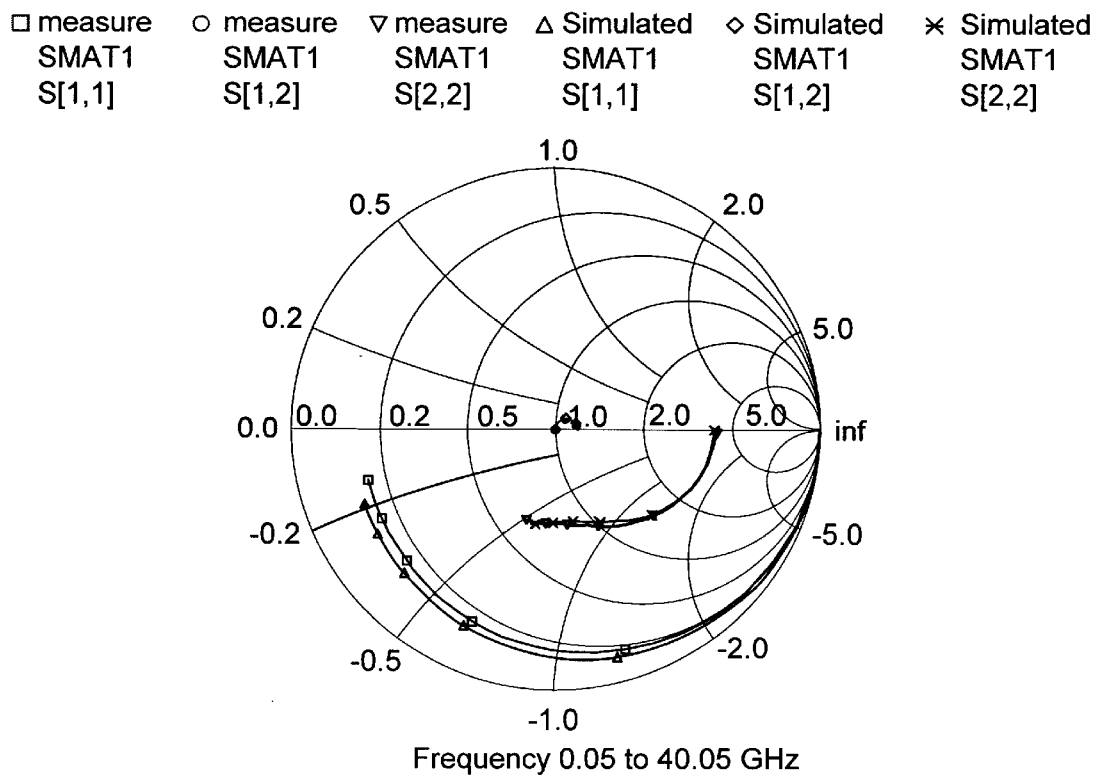
FIG. 62A is a Smith chart illustrating the measured versus the initial model solutions for the S11, S12 and S22 S-parameters from frequencies from 0.05 to 40.0 GHz.
Figure 62B:
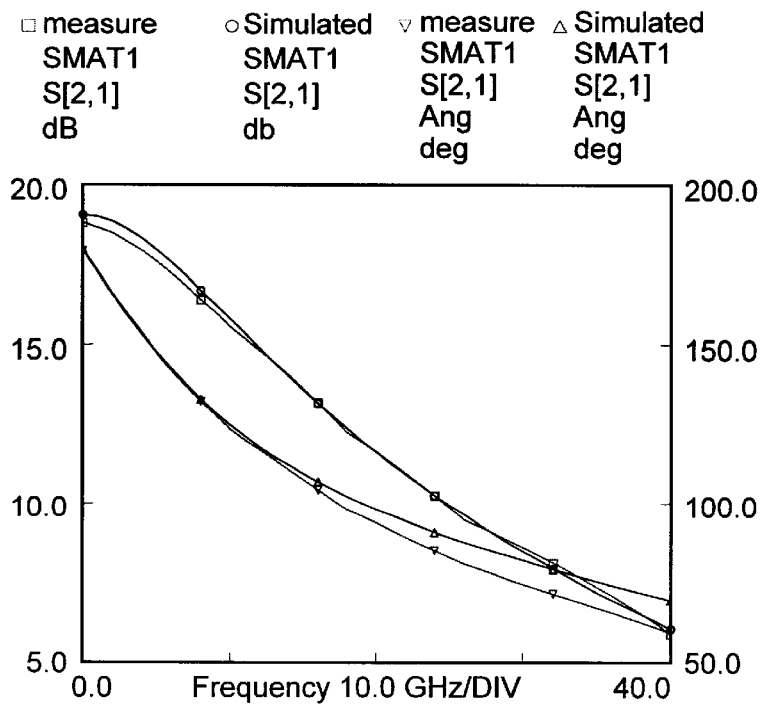
FIG. 62B is a graphical illustration of angle versus magnitude for the initially modeled S-parameter S21 from frequencies of 0.05 to 40 GHz.

The implementation of the extraction optimization cycles makes the best and fastest solving solution appear as a global minima for the final fitting error in step 146 of all of the trial impedance points as generally shown in FIGS. 60 and 61. More specifically, referring to FIG. 60 the global minima solution using the new error metric is found around $R_s$=1.7 ohms. Tables 19 and 20 list the final model equivalent circuit parameters for this global solution, including the intrinsic and parasitic parameter as set forth in step 148 (FIG. 59).

TABLE 19

Global Solution for "Instrinsic" Equivalent Circuit Parameters

| Intrinsic Equivalent Circuit Parameter | Initial Solution |
|---|---|
| Cgs | 0.227745 pF |
| Rgs | 64242 Ω |
| Cgd | 0.017019 pF |
| Rgd | 133450 Ω |
| Cds | 0.047544 pF |
| Rds | 160.1791 Ω |
| Gm | 135.7568 mS |
| Tau | 0.443867 pS |

TABLE 20

Global Solution "Parasitic" Equivalent Circuit Parameters

| Extrinsic Equivalent Circuit Parameter | Initial Solution |
|---|---|
| Rg | 4.711895 Ω |
| Lg | 0.029314 nH |
| Rs | 1.7 Ω |
| Ls | 0.002104 nH |
| Rd | 3.309899 Ω |
| Ld | 0.031671 nH |

Figure 64A:
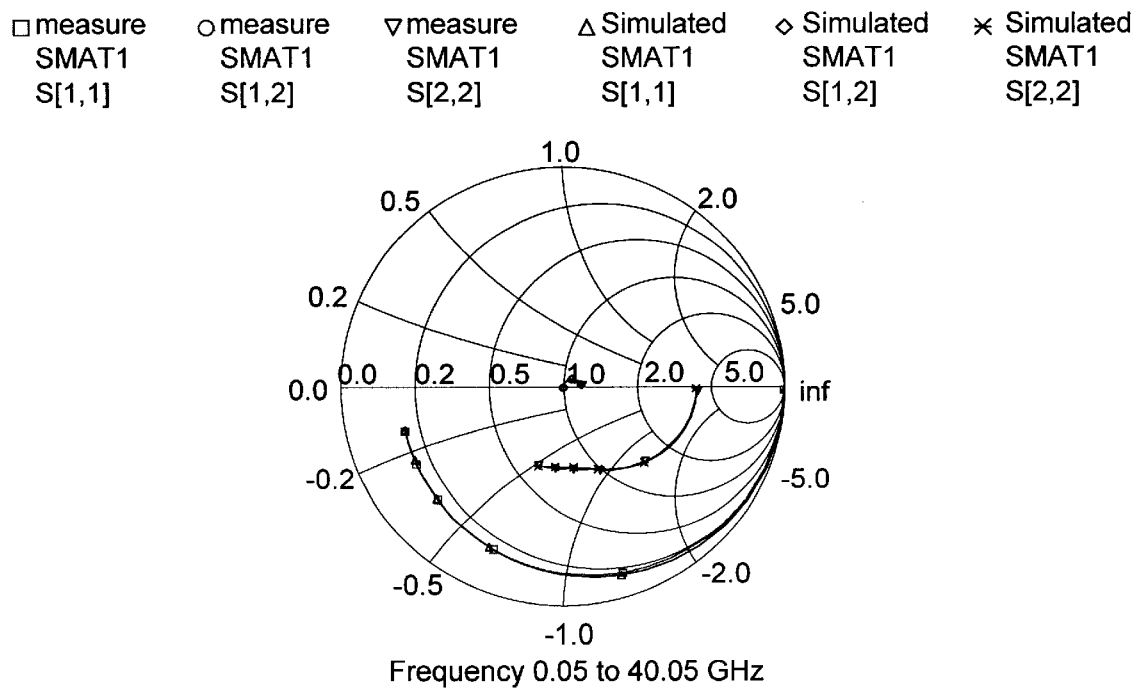
FIG. 64A is a Smith chart illustrating the measure as a function of the final model solution for S-parameters S11, S12 and S22 for frequencies 0.05 to 40 GHz for the final solution.
Figure 64B:
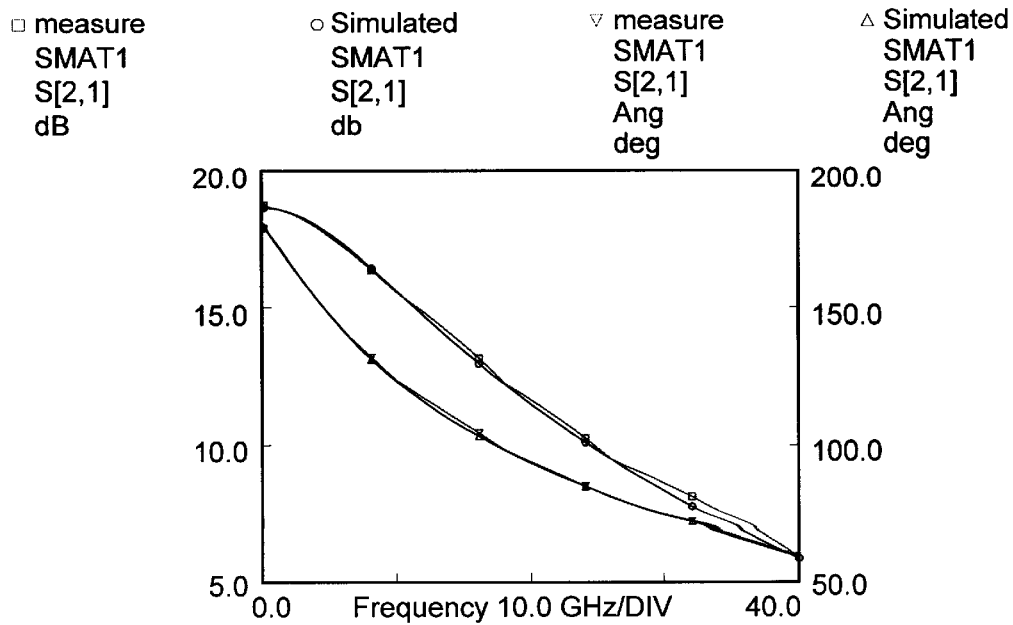
FIG. 64B is a graphical illustrations of the magnitude as a function of an angle for S-parameter S21 for the final model solution from frequency 0.05 to 40 Ghz.

In order to test the accuracy of the solution, the final model for solutions are compared with the measured S-parameter values as shown in FIG. 64. As shown, there is good correlation between the simulated model values and the measured S-parameters values thus verifying that the simulated model values represent a relatively accurate and unique small signal device model.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A method for modeling semiconductor comprising the steps of:
    (a) developing a semi-physical model;
    (b) developing a data-fitting model; and
    (c) combining said semi-physical model and data-fitting model in a manner to form a hybrid model that is used to predict the performance of physical characteristics of the semiconductor.

2. The method as recited in claim 1, wherein step (c) includes the following steps:
    (d) using the semi-physical model to generate current-voltage (I–V) and capacitance-voltage (C–V) data for the data-fitting model;
    (e) deriving model parameters for the data-fitting model such that the data-fitting model fits the semi-physically modeled characteristics.

3. The method as recited in claim 2, wherein step (c) further includes step (f): implementing the data-fitting model in a large signal microwave circuit computer aided design (CAD) tool.

4. The method as recited in claim 3, further including step (g): repeating steps (d)–(f) for arbitrary physical changes to the semi-physical model.

5. The method as recited in claim 1, wherein step (a) includes the step (h): determining relationships between conduction band offsets, electric permitivity and material composition of materials contained in an epi-stack.

6. The method as recited in claim 5, wherein step (h) is performed analytically.

7. The method as recited in claim 5, wherein step (h) is performed by fining simulated data from physical simulators.

8. The method as recited in claim 5, wherein step (a) also includes step (i): determining basic electron transport characteristics in the materials in the epi-stack.

9. The method as recited in claim 8, wherein step (a) also includes step (j): determining the undepleted linear channel mobility.

10. The method as recited in claim 9, wherein step (j) is determined through material characterization.

11. The method as recited in claim 9, wherein step (j) is determined by physical simulation.

12. The method as recited in claim 9, wherein step (a) also includes step (k): determining Schottky barrier expressions.

13. The method as recited in claim 1, wherein step (a) includes semi-physical modeling of one or more of the following characteristics: fundamental-charge control physics for sheet charge in an active channel as controlled by a gate terminal voltage; average centroid position of the sheet charge within an active channel width; position of charge partitioning boundaries as a function of gate, drain and source terminal voltages; bias dependence of linear channel mobility in surface depleted regions; bias dependence of a velocity saturating electric field; saturated electron velocity; electrical conductance of a linear conductance region of channel under gate; electrical conductance within source and drain access regions.

14. The method as recited in claim 13, wherein step (c) includes the step of adjusting empirical terms of the semi-physical model to fit I–V characteristics against measured values.

15. The method as recited in claim 14, wherein the empirical terms of the semi-physical model are interactively adjusted to simultaneously fit measured I–V and C–V characteristics.

16. The method as recited in claim 15, wherein the empirical terms are filed for future use.

* * * * *